(12) United States Patent
Holman et al.

(10) Patent No.: US 6,871,982 B2
(45) Date of Patent: Mar. 29, 2005

(54) HIGH-DENSITY ILLUMINATION SYSTEM

(75) Inventors: Robert L. Holman, Evanston, IL (US); Arthur Cox, Park Ridge, IL (US)

(73) Assignee: Digital Optics International Corporation, Park Ridge, IL (US)

( * ) Notice: Subject to any disclaimer, the term of this patent is extended or adjusted under 35 U.S.C. 154(b) by 0 days.

(21) Appl. No.: 10/763,816

(22) Filed: Jan. 22, 2004

(65) Prior Publication Data

US 2004/0218390 A1 Nov. 4, 2004

Related U.S. Application Data

(60) Provisional application No. 60/442,624, filed on Jan. 24, 2003.

(51) Int. Cl.[7] .................................................. F21V 5/00
(52) U.S. Cl. ........................ 362/331; 362/19; 362/245; 362/328; 362/800; 349/61
(58) Field of Search .................. 362/19, 242, 243–245, 362/328, 331, 343, 545, 800; 349/61

(56) References Cited

U.S. PATENT DOCUMENTS 4,947,291 A * 8/1990 McDermott .................. 362/19
5,361,190 A * 11/1994 Roberts et al. ............. 362/545

* cited by examiner

*Primary Examiner*—Stephen F Husar
(74) *Attorney, Agent, or Firm*—Foley & Lardner LLP

(57) ABSTRACT

A compact and efficient optical illumination system featuring planar multi-layered LED light source arrays concentrating their polarized or un-polarized output within a limited angular range. The optical system manipulates light emitted by a planar array of electrically-interconnected LED chips positioned within the input apertures of a corresponding array of shaped metallic reflecting bins using at least one of elevated prismatic films, polarization converting films, micro-lens arrays and external hemispherical or ellipsoidal reflecting elements. Practical applications of the LED array illumination systems include compact LCD or DMD video image projectors, as well as general lighting, automotive lighting, and LCD backlighting.

40 Claims, 45 Drawing Sheets

Front View

Side View

Perspective View

|  | A | B | C | D |
|---|---|---|---|---|
| +/−θ$_{OUT}$, MEDIA | 43.4 | N.A. | 30 | 20 |
| +/−θ$_{OUT}$, AIR | 90 | 90 | 48 | 30 |
| X$_{BIN}$ | 1.6 | 1.6 | 2.2 | 3.2 |
| LUMENS/BIN, +/−25° | 23 | 25 | 40 | 72.5 |
| N BINS | 42 | 42 | 22 | 10.5 |
| TOTAL LUMENS | 966 | 1050 | 880 | 761 |

Cross-Section

Perspective

9 Etendue-Preserving Bins; Center On, Neighbors Off

9 Etendue-Preserving Bins; All On

1 Non-Etendue-Preserving Bin On; 8 Non-Etendue-Preserving Bins Off

FIG. 41A.

| | | 1262 | 1254 | | |
|---|---|---|---|---|---|
| 38.4 | 38.4 | 38.4 | 38.4 | 38.4 | 38.4 |
| 38.4 | 38.2 | 37.6 | 38.2 | 38.4 | 38.4 |
| 38.4 | 37.6 | 23.2 | 37.6 | 38.4 | 38.4 |
| 38.4 | 38.2 | 37.6 | 38.2 | 38.4 | 38.4 |
| 38.4 | 38.4 | 38.4 | 38.4 | 38.4 | 38.4 |
| 38.4 | 38.4 | 38.4 | 38.4 | 38.4 | 38.4 |

| 0.4 | 1.6 | 0.4 | 0.4 | 1.6 | 0.4 | 0.4 | 1.6 | 0.4 |
|---|---|---|---|---|---|---|---|---|
| 1.6 | 30.4 | 1.6 | 1.6 | 30.4 | 1.6 | 1.6 | 30.4 | 1.6 |
| 0.4 | 1.6 | (0.2) | 0.4 | (0.8) | 0.4 | (0.2) | 1.6 | 0.4 |
| 0.4 | 1.6 | 0.4 | 0.4 | 1.6 | 0.4 | 0.4 | 1.6 | 0.4 |
| 1.6 | 30.4 | (0.8) | 1.6 | 15.2 | 1.6 | 0.8 | 30.4 | 1.6 |
| 0.4 | 1.6 | 0.4 | 0.4 | 1.6 | 0.4 | 0.4 | 1.6 | 0.4 |
| 0.4 | 1.6 | (0.2) | 0.4 | (0.8) | 0.4 | (0.2) | 1.6 | 0.4 |
| 1.6 | 30.4 | 1.6 | 1.6 | 30.4 | 1.6 | 1.6 | 30.4 | 1.6 |
| 0.4 | 1.6 | 0.4 | 0.4 | 1.6 | 0.4 | 0.4 | 1.6 | 0.4 |

1258
1262
1260

FIG. 42A.
FIG. 42B.
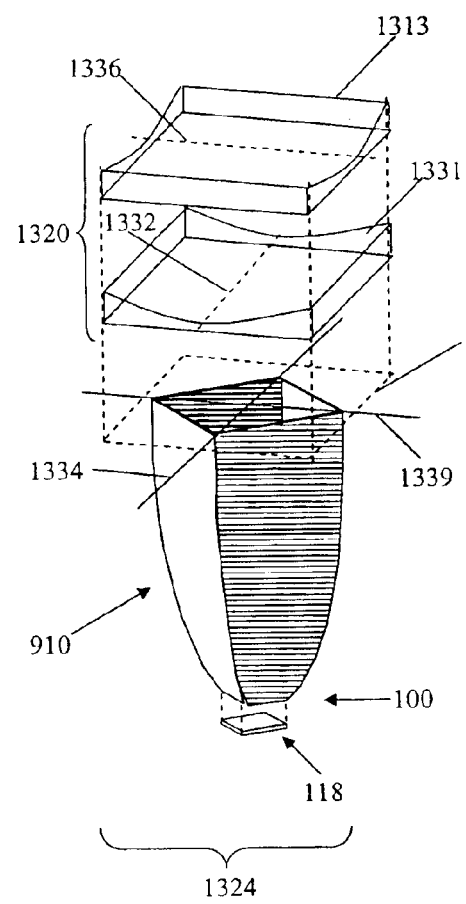
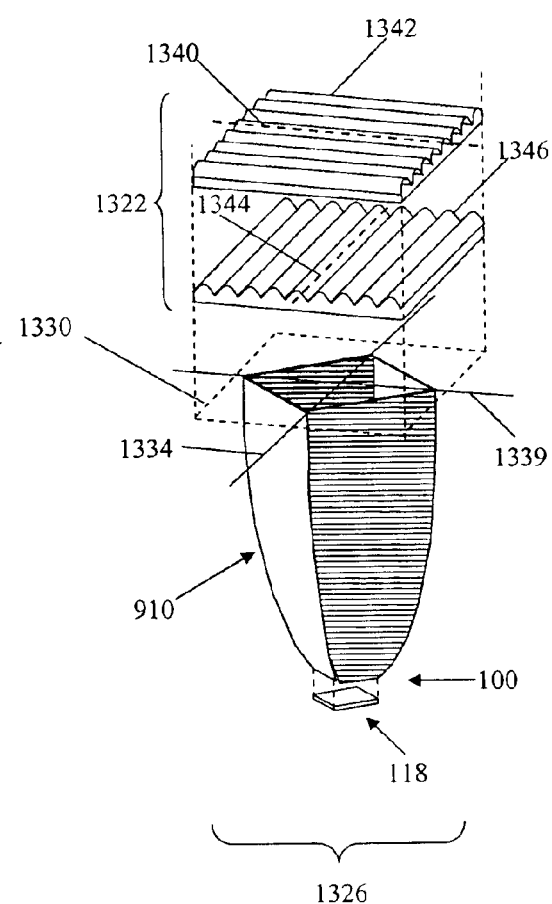

HIGH-DENSITY ILLUMINATION SYSTEM

CROSS-REFERENCE TO RELATED PATENT APPLICATIONS

This application is a Non-Provisional of U.S. Application No. 60/442,624 filed Jan. 24, 2003, incorporated herein by reference in its entirety.

BACKGROUND OF THE INVENTION

The present invention, which is an expansion on inventions described in a previously filed application, entitled Uniform Illumination System filed on Dec. 14, 2001, Ser. No. 10/31980C, and which is incorporated by reference herein, is concerned generally with a thin and compact multi-layered optical system and method for generating well-organized output illumination from a one or two-dimensional array of discrete light emitting diodes (LEDs), the output light spread uniformly over the system's aperture while emanating from a uniquely multi-layered system comprised of reflecting bins and elevated light directing films. The present invention focuses centrally on the beneficial interactions between the geometric parameters of a thin array of metallically-reflecting bins, each having four tapered sidewalls meeting at an input aperture containing an LED, and the geometric parameters of orthogonally oriented prism sheets (and/or polarization converting sheets) placed above them. The previous invention described the basic geometric configurations of such multi-layers, while the present invention explores their performance differences, and in doing so, sets forth two specific embodiments related to directed LED lighting and illumination, as well as adding means for additional efficiency gains by the external recycling of otherwise wasted light. The first LED light source array embodiment trades optical efficiency to achieve output beams having the highest practical density of lumens, making very high-power illumination applications such as occur in video projectors practical at the soonest opportunity. In this non-etendue-preserving embodiment, interactions between reflecting bins and elevated prism sheets, polarization-converting films and/or micro-lens arrays cause beneficial spatial overlap of bin outputs that increase the array's effective lumen density. The second LED light source array embodiment achieves highest possible optical efficiency, allowing high-brightness illumination applications using the fewest possible LEDs and/or the lowest amounts of electrical power. In this etendue-preserving embodiment, shaped reflecting bins are combined with elevated micro-lenses and polarization converting films to manipulate the illumination pattern especially for square or rectangular illumination targets. Accordingly, the field of illumination produced by the particular optical systems containing these multi-layered emitting arrays provide a suitable illuminating beam for projecting an electronic image (as from an LCD or DMD) onto a screen, or the illumination itself composed of separately-controlled image pixels, the sum of which at any instant forming a spatially modulated image to be viewed directly, as in LED image displays for signage and video. The field of directed illumination may also be used as a means of general illumination, as in lighting fixtures and luminaries. More particularly, the multi-layer optical system that achieves this favorable performance consists of a heat extraction layer, an electronic back plane containing a regular one or two-dimensional array of electronically interconnected LEDs (preferably flip-chip style), an micro-fabricated array of contiguous (or nearly contiguous) reflecting bins with shaped or plane tapered sidewalls, one bin surrounding each LED (or group of LEDs), and a sequence of at least one additional optical light directing layer positioned above or at a preferred spacing from the reflecting bin apertures, the layer construction designed in conjunction with the geometry of the underlying reflecting bins, so as to maximize the light source array's output power and field coverage within a particular angular range, or within a particular angular range and polarization state. An additional layer or layers, in configurations that needing some additional diffusive mixing, can be conventional light spreading materials such as holographic diffusers, lenticular diffusers, lens arrays, bulk or surface scattering diffusers, opal glass, or ground glass, added to improve spatial uniformity.

Currently available illumination systems capable of achieving equivalent brightness uniformity (and lumen density) using only conventional optical elements, do so with at least 2 times fewer lumens per square millimeter, less efficiently (in terms of brightness), and in considerably thicker and less well-integrated packaging structures. Currently available LED illumination systems use arrays of discretely packaged LED devices, or LED chips on interconnection planes disposed below conventional refractive optical elements (whose effective optical collection range is limited). By comparison, the uniqueness of the present invention relates to the fact that its compartmentalized packaging layer and its cooperatively designed optical overlayers are both made to be continuous elements for the entire array—and whose choice of materials and their geometry achieves significantly enhanced performance. Designing the reflecting bins and the optical layers above them interactively, and by means of a realistic and experimentally validated computer model, is found to maximize optical output compared with more conventional designs. The increase in the performance of such LED light source arrays is not an obvious step despite previous use of LEDs in arrays, in reflective packages, and in conjunction with many types of conventional secondary optical elements.

Such compact LED illumination systems are of primary interest for the projection of images onto screens from such spatial light modulators as reflective and transmissive LCDs and DMDs. LED illumination is considered superior to the commonly used discharge lamps with regard to operating lifetime, which increases nearly 100-fold, and also because the conductive heat generated in the LEDs is easier to extract than the radiative heat given off by a gas discharge. Using LEDs in place of short-arc discharge lamps, however, is not straightforward for several reasons. Discharge lamps generate 60 (white) lumens per watt at 130–150 watts, and today's projection systems have rather low end-to-end optical efficiencies in the range of 15% and less. Imagining the use of today's best high-power LEDs at light levels of 7000 to 9000 lumens seems quite difficult, given that best emission efficacies are only in the range of only 15–25 lumens per watt. What's more, manufacturing economies keep typical LCD and DMD image apertures less than 1.2" on the diagonal, and such devices cannot make effective use of light at angles above +/−12 degrees. This means that the total effective illumination area for the +/−90 degree emitting LEDs has to be less than 19.28 $mm^2$, or for the standard image 4:3 aspect ratio, less than a rectangular area 5.07 mm by 3.80 mm. While such jumbo chips might become available in the distant future, the largest chips known today are square and not yet larger than 1 mm or 2 mm on an edge (as manufactured by LumiLeds, San Jose, Calif.). Even were such jumbo chips available, the challenge would still be to convert all its generated lumens to the +/−12-degrees needed in practical image projectors with high enough efficiency and spatial illumination uniformity. At today's best LED lumen density of 50 lumens/mm$^2$, the total lumen yield from such a small illumination aperture would not be nearly enough after projection system transmission losses to reach competitive projection screen powers, which must be at least 1000 white-field lumens for many product applications of commercial interest.

The basic approach for overcoming this limitation has been described previously and involves using spatially separated high lumen density multi-layered arrays of separated red, green and blue LEDs, these arrays arranged and designed to concentrate their output emissions to a particular range of narrowed output angles (and polarization states) that can be handled efficiently by the conventional optics of a modern image projection system. Once so-created and integrated with the respective reflective or transmissive LCDs (or reflective digital micro-mirror devices, DMDs or DLPs as trade marked by Texas Instruments), the LED array output beams are mixed using the standard dichroic mixing cubes that allow the single-colored beam apertures to be superimposed on each other.

The present invention extends the basic approach to specific very high lumen density illuminator embodiments that enable with the best of the forthcoming high-power flip-chip LEDs, a wide range of compact and practical image projectors.

The present invention also extends to very low power, potentially hand held image projectors suitable for battery operation.

Such compact high lumen density LED illumination systems are also of interest for certain traffic signals and alerts, interior lighting, street lighting, stage and theatrical lighting, automotive head and tail lighting, safety warning lights, the backlighting of LCD screens and certain fiber optic medical illuminators.

These same compact high lumen density multi-layered illumination systems may be adapted for their intrinsic ability to display pixelized images directly, where in each reflecting bin within the light source array involved contains one each of a red, green and blue LED, and wherein every LED in the array is individually-addressed.

SUMMARY OF THE INVENTION

It is, therefore, an object of the invention to provide an improved high lumen density illumination system and method of use.

It is another object of the invention to provide a multi-layered packaging means for a high lumen density light source panel structure containing a sparse two dimensional array of light emitting diode chips on a layer that provides discrete, thin-film electrical interconnections to the diodes, and that isolates one or more diode chips within separate specularly reflecting compartments, the compartments themselves arranged in a corresponding two-dimensional array that is covered with a stack of optical layers, one of which is a mechanical spacer including the bins themselves that allows light transmission from each compartment to reach two light directing layers that include linear arrays of prism-like grooves made in a clear plastic material, the grooves in each layer aligned at 90-degrees to one another.

It is a further object of the invention to provide a sufficiently high lumen density light source panel system and method for providing an efficient and homogeneous beam of directional illumination to LCD and DMD spatial light modulators within compact video projection systems.

It is also an object of the invention to provide a multi-layered packaging means that combines a layer composed of an array of metallically reflecting bins having four tapered sidewalls, the bottom aperture of each bin containing one or more flip-chip LEDs protruding into the bin from an electrically interconnected back plane, the interior of each bin either filled with air or a clear dielectric encapsulant, the bin apertures covered with a thin film stack consisting of two prism sheet layers and optionally a quarter wave phase retardation layer and a reflective polarizing layer.

It is still another object of the invention to provide an improved system and a method for designing the geometry of the prism sheets operating in conjunction with the geometry of an underlying LED-containing bin structure, such that output light concentration within a selected angular range is increased maximized.

It is yet another object of the invention of provide an improved system and method for fabricating relatively thin arrays of metallically reflecting bins made with an open lattice of input and output apertures.

It is further an object of the invention of provide an improved system and method of designing thin arrays of metallically-reflecting bins whose geometry and sidewall shape is adjusted so as to maximize the angular and polarization state recycling brought about by reflective means external to the bins themselves.

It is still an additional object of the invention to provide an improved system and method for constructing a hemispherical reflector within a planar LED array based projector system such that the hemispherical reflector is formed on the inside wall of a cylindrical element whose axis lies along the optical axis of the projection system.

It is yet one other object of the invention to provide an improved system and method for collecting and reusing light emitted by a planar LED light source whose output angles miss the input aperture of an angle transforming condensing lens such that the higher angle light is instead intercepted by two sets of orthogonal and metallically reflecting sidewalls having ellipsoidal curvature, one focal line of each sidewall lying in the plane of the LED light source aperture, the other focal line of each sidewall lying on an input edge of a substantially transparent light pipe positioned between the LED light source array and the condensing lens, the light pipe fitted with a distribution of light re-directing means that allow a portion of the collected light to be directed out from the light pipe and into the input aperture of the condensing lens.

It is additionally an object of the invention to provide an improved system and method for coupling planar multi-layered LED bin arrays to LCD or DMD micro-displays by means of a secondary angle transforming or condensing element whose front and rear focal lengths are matched to the approximate locations of the array's output aperture and the display's input aperture.

It is yet an additional object of the invention to provide an improved system and method for coupling a planar LED array light source to LCD or DMD micro-displays by means of a secondary angle transforming element and an external hemispherical reflector positioned to collect and recycle all emitted light not collected by the transforming element's aperture.

It is one further object of the invention to provide a compact means for efficiently recovering, re-circulating and reusing wide-angle output light from a multi-layered LED light source array by means of an externally positioned reflector having either continuous or faceted spherical radius.

It is yet one further object of the invention to provide a compact means for efficiently recovering, re-circulating and reusing wide-angle output light from a multi-layered LED light source array by means of an externally positioned four-sided ellipsoidal reflector in conjunction with an elevated transparent light pipe having a partially structured surface plane It is yet a further object of the invention to provide an improved system and method for forming the sloping sidewalls of metallically reflecting bin arrays such that the sidewall reflections while non-scattering in nature, serve to randomize angular direction of the resulting light rays.

It is one other object of the invention to provide an improved system and method for forming the LED and encapsulant surfaces within and a part of metallically reflecting bin arrays such that the associated reflections, while non-scattering in nature, serve to randomize angular direction of the reflected light rays.

It is a further object of the invention to provide an improved system and method for efficiently transmitting light of one polarization from an LED light source system through the input aperture of an LCD micro-display device, while recycling and reusing light of the orthogonal polarization state by means of reflective polarizer and quarter-wave phase retardation planes, one associated with the input aperture of an angle transforming element, the other the output aperture of a metallically reflecting LED light source array, combined with a hemispherical reflecting element, the focus of whose metallically reflecting interior is at or near the center-point of the LCD aperture.

It is one more object the invention to provide an improved system and method for making a high efficiency multi-layered LED light source array wherein one layer is a contiguous array of metallically reflecting four-sided bins whose sidewall curvatures maximize the LED flux that is conveyed from input to output aperture in each X and Y meridian, while parallel layers above this one are secondary light directing layers including two orthogonal cylindrical lenses or lens arrays whose cylinder axes are aligned in parallel with the bin array's orthogonal aperture diagonals, a quarter-wave phase retardation layer and a wide-band reflective polarizer layer.

It is one more object the invention to provide an improved system and method for making a silicon substrate containing a pattern of electrically conductive circuitry enabling the electrical bonding and interconnection of one or two-dimensional arrays of physically separated flip chip LEDs, arranged in rows and columns.

It is an additional object the invention to provide an improved system and method for making one or two-dimensional arrays of metallically reflecting bins having sloped or tapered sidewalls whose arrangement allows physical through-holes in the array defining both input and output apertures, the associated input aperture array spatially arranged so that each input aperture matches the size and shape of each LED chip in a corresponding array so that when brought together each LED chip fits simultaneously through each corresponding input aperture without mechanical interference blocking such a fit so that each chip thereby protrudes into each bin.

It is also an additional object of the invention to provide a compact means for efficiently converting un-polarized output light from a multi-layered LED light source array into substantially polarized output light using the metallically-reflecting nature of the reflecting bins involved and the metallically-reflecting nature of the LED's electrodes, in conjunction with elevated polarization converting films.

BRIEF DESCRIPTION OF THE DRAWINGS

FIG. 41A is a schematic representation of the top view of the central 6×6 bin portion of the 8×8 bin LED light source array of FIG. 40, showing the total lumens contributed by each 1.6 mm square bin region when one binned LED in the array emits half as many lumens as all others.

FIG. 41B is a schematic representation of the top view of an illustrative 3×3 bin array portion of the 6×6 bin array depicted in FIG. 41B, showing the detailed lumen contributions from neighboring bins in the array.

FIG. 42A is a schematic representation of the etendue-preserving bins of FIGS. 29A–B supplemented by two elevated cylindrical lenses whose cylinder axes are aligned with bin-aperture diagonals to improve diagonal-meridian field coverage.

FIG. 42B is a schematic representation of the etendue-preserving bins of FIGS. 29A–B supplemented by two elevated lenticular lens arrays whose cylinder axes are aligned with bin-aperture diagonals to improve diagonal-meridian field coverage.

DETAILED DESCRIPTION OF THE PREFERRED EMBODIMENTS

The present inventions relate to multi-layered packaging structures whose structural details maximize optical output from arrays of interconnected light emitting diodes (LEDs) over earlier multi-layered packaging structures. Specifically, the present inventions allow for the highest possible concentrations of output lumens per square millimeter of output aperture. This improvement leads to designs that allow earliest possible use of LED arrays as practical replacements for light bulbs in demanding applications such as video projection. This improvement also leads to related designs that use the minimum number of LEDs for the intended purpose.

Figure 1A:
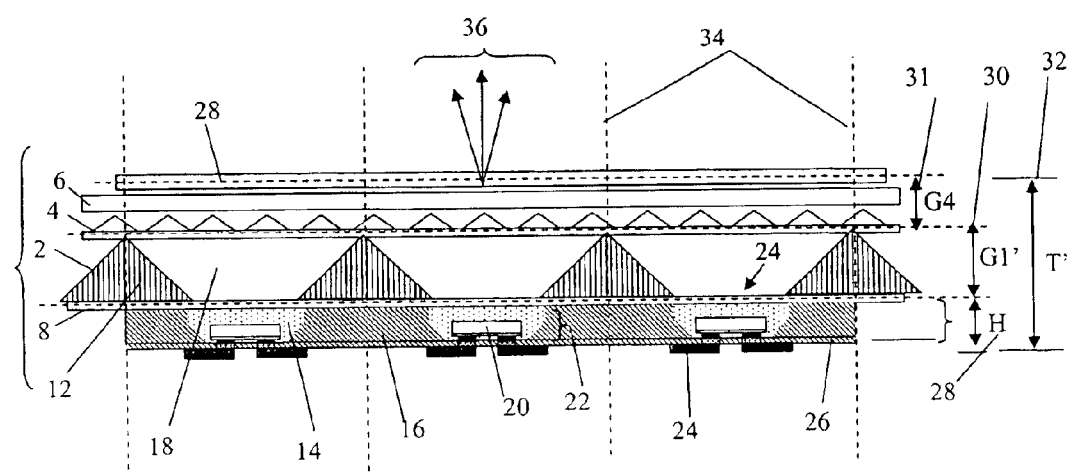
FIG. 1A illustrates in schematic cross-section a multi-layered planar LED light source array in which LED chips are contained in an array of containers located beneath contiguous bins having plane tapered reflecting sidewalls whose bin apertures are beneath an upper and lower prism sheet.
Figure 1B:
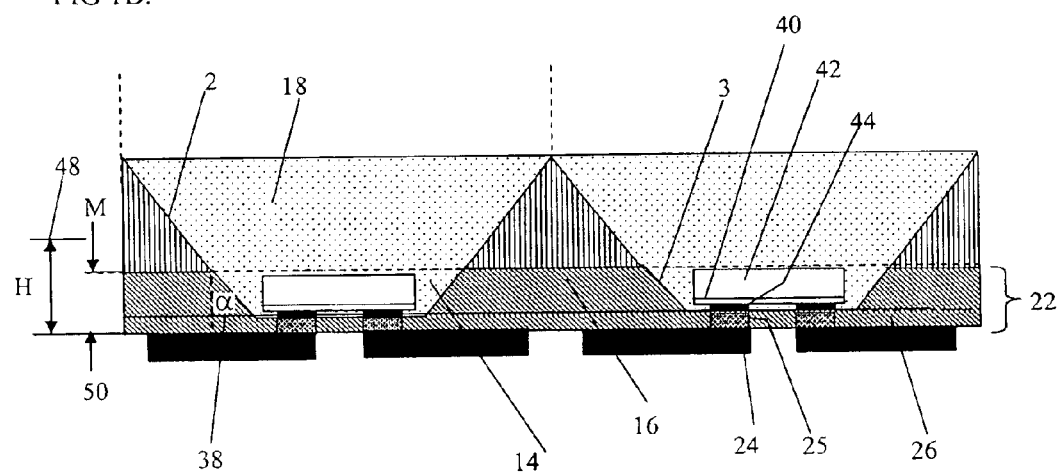
FIG. 1B illustrates in schematic cross-section a multi-layered planar LED light source array in which LED chips placed within contiguous bins having plane tapered reflecting sidewalls whose bin apertures are beneath an upper and lower prism sheet.
Figure 2A:
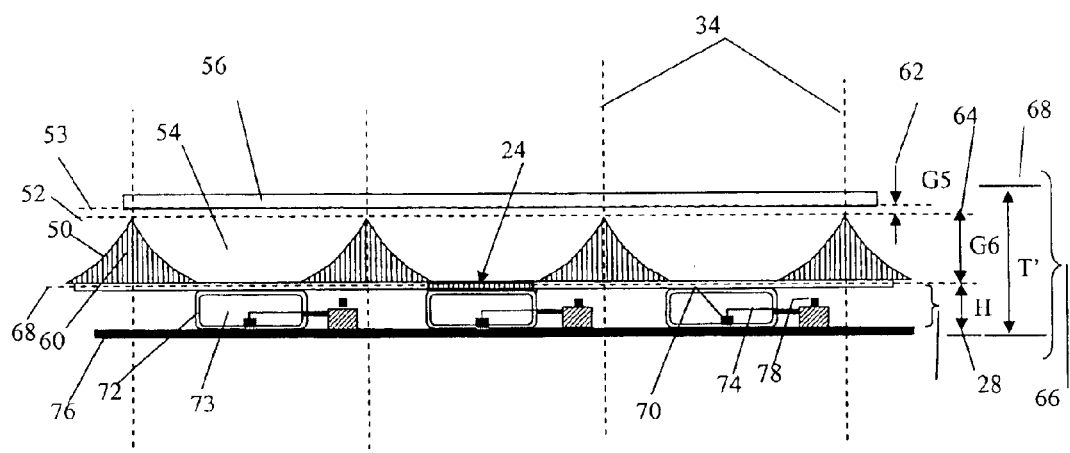
FIG. 2A illustrates in schematic cross-section a multi-layered planar LED light source array in which LEDs are placed in the apertures of contiguous bins having curved reflecting sidewalls whose bin apertures are beneath a polarization selective reflecting plane.

Previous inventions, such as 10 in FIGS. 1A–B and 66 in FIG. 2A, have described the use of specially-shaped and sized reflecting bins surrounding each LED (or groups of LEDs) in the array with the bins arranged to work in conjunction with the design of certain reflective multi-layers placed just above them, such as for example prism sheets 4 and 6 in FIGS. 1A–B and reflective polarizer 56 in FIG. 2A. The shape of the reflecting sidewalls 2 (and in 22) in FIGS. 1A–B and 50 in FIG. 2A is adjusted to redirect output light towards the reflective multi-layers from LED 20 in FIGS. 1A–B (or the enclosed LED emitter 70 in FIG. 2A). Multiple reflections between reflective elements are then employed to transform the output angular distribution of light passing through the systems 10 and 66 in a favorable way for a variety of lighting applications. While this multi-layered approach provides a basis for achieving high-density output light from arrays of LEDs, no working relationship has yet been established for maximizing the array's output density.

The form introduced in FIGS. 1A–B and shown with flip-chip LEDs 20 uses shallow reflecting bins 12 with plane, tapered sidewalls 2. LED light enters bins 12 through aperture 24 from sub-bins 22 that contain the flip-chip LED (or LEDs) 20 and encapsulant 14, located just beneath the main bins. Flip-chip LEDs consist of transparent substrate layer 42 and epitaxial device layers 40 within which a diode is formed and light is generated. Electrical contacts (combined with highly-reflective under-surface mirror) 44 allow attachment to sub-mounts 24 and heat extraction layers. The sub-bins 22 surrounding the LED chips, also with shaped reflecting sidewalls 16, collect and convey LED light emitted through its substrate 42 and then through bin aperture 24 (and optional diffusing layer 8). One particular configuration is shown in FIGS. 1A–B in which the sub-bins 22 and main bins 12 are formed as a continuous entity, sharing common dielectric medium 18, and having the same sidewall slope 38 (angle α measured from the vertical).

The form of FIGS. 1A–B operates with its two prism sheets 4 and 6 elevated above the LEDs preferred heights G1' and G1'+G4 so that light reflected from the bins is controlled in both angle and spatial distribution. Additional reflective polarizer layers 28 are added when necessary to control output polarization as well. When the prisms are made to have 90-degree apex angles, output preference 36 is given to angles within +/−22.5 degrees. Beam uniformity depends on the factors of prism sheet spacing.

Figure 2B:
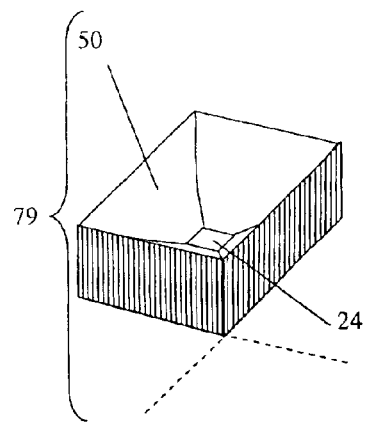
FIG. 2B illustrates a perspective view of a contiguous bin having four orthogonal mathematically shaped sidewalls.
Figure 2C:
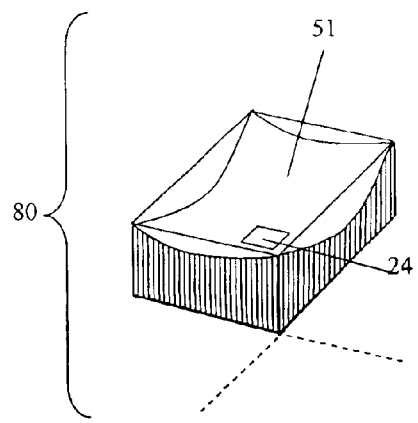
FIG. 2C illustrates a perspective view of a contiguous bin having a single mathematically shaped sidewall with optional vertical boundary walls.

The analogous form of FIGS. 2A–C is one that replaces the role of the reflective angle-controlling prism sheets by the curved shape of the bin sidewalls 50. By doing so, output light from the bins is even more tightly controlled in angle, and polarization, by reflective interactions with polarizer layer 56 elevated above the bins.

While both structural forms of FIGS. 1A–B and FIGS. 2A–C yield angularly-directed output beams from seamlessly arranged output apertures, neither system's optical efficiency (expressed in output lumens falling within a specified angular range divided total LED lumens emitted) and output density (output lumens falling within a specified angular range divided by the aperture area) has been maximized.

The importance of maximizing LED array output can be illustrated by the difficult performance requirements presented by a modern LCD or DMD (DLP) video projector needing to deliver over 1000 white-field lumens to the (front or rear) projection screen. One common RGB white-field distribution is 60% green, 30% red and 10% blue, requires 600 green screen lumens, 300 red screen lumens, and 100 blue screen lumens. Suppose the projector uses three reflective LCDs at f/2.4, one for each color, each of whose aspect ratios are 4:3 and each of whose diagonal size is 1.2". Taking the green channel as the critical example, with a 90% efficient projection lens and an 81% transmissive dichroic color-splitting cube, one finds that there must be 823.7 polarized green lumens at the reflective LCD within an angular range of +/−12-degrees (i.e. f/2.4). Then using the pseudo-Kohler polarizing beam-splitter type angle-transformer (25-degree to 12-degree) we've described previously, and that is explained later in more detail, one finds that the associated LED array illuminator must be capable of supplying 1170 polarized green lumens within +/−25-degrees. Any light generated in angles greater than +/−25-degrees cannot be viewed. Moreover, the 1170 lumen beam must be produced within a specific rectangular aperture area defined by fundamental geometric expressions related to the LCD's spatial and angular aperture. (Note: Square apertures may also be used, and this variation will be discussed further below.) Specifically, and from the well-known Sine Relation, the illumination aperture edges, $X_{ILL}$ and $Y_{ILL}$, are as in equations 1 and 2.

$$X_{ILL} = X_{LCD} \sin(12)/\sin(25) \qquad (1)$$

$$Y_{ILL} = Y_{LCD} \sin(12)/\sin(25) \qquad (2)$$

Accordingly, with $X_{LCD}$ and $Y_{LCD}$ being 24.384 mm and 18.288 mm respectively, the LED illuminator aperture becomes approximately 12 mm by 9 mm (there is a more detailed discussion further below). Any light created outside this aperture area cannot fall usefully within the LCD aperture. So, for a sufficient number of green lumens to reach the screen, it must be practical to produce 1170 polarized green lumens within this particular 108-$mm^2$ illumination-aperture area; those lumens confined to +/−25-degrees.

Doing so represents a significant challenge without deploying an array of LED chips within a suitably efficient high-density angle-controlling package.

As one indication of this difficulty, consider that the latest 5-watt high-power LED package manufactured by LumiLeds (as Luxeon™) emits 120 un-polarized green lumens over a +/−90-degree Lambertian angular distribution from a domed circular lens (shown later) that is approximately 4 mm in diameter. Assuming for the moment that such 4 mm domes can be closed-packed (and they can't because of their external package and electrode design), it can be shown from geometry that the luminous effect of only a total of 7.5 lens domes can be accommodated within the illustrative 9 mm×12 mm illumination rectangle. These 7.5 domes produce 900 un-polarized lumens within +/−90-degree rather than the +/−25-degrees needed. LumiLeds reports in published data sheets that half this luminous power (450 lumens) exists within +/−60-degrees, which implies that only 107 un-polarized lumens exist within +/−25-degrees. Even allowing for 100% polarization conversion efficiency (about 50% is practical), such an array falls short of the projector need by more than a factor of ten.

The LED chips used by LumiLeds within this Luxeon™ package are 2 mm by 2 mm squares. Assuming the package is nearly 100% efficient in routing lumens generated by this chip into usable output, the 5-watt chip would be emitting at a density of 30 lumens/$mm^2$. If electrical efficiency were no object (and it is), as many as 27 such super-chips could fit into the required 12 mm by 9 mm illumination aperture, yielding 3,240 un-polarized lumens over +/−90-degrees, or 1,620 un-polarized lumens over +/−60-degrees. The yield within +/−25-degrees would therefore be 385.8 un-polarized lumens, and with 50% conversion efficiency, 289.3 polarized lumens. Even such a monster array running at 135 watts falls short of the projector's green lumen need by a factor of four.

It has been established that the emitting density of these same high-power flip-chip LEDs is currently as high as 50 lumens/$mm^2$, and that by 2004, with twice the power density (or less) able to be tolerated, will rise to the 100 lumens/$mm^2$ level. Despite such advances, the monster array just described would generate 6,480 un-polarized green lumens over +/−90-degrees at 270-watts. This would produce 1157 polarized green lumens, which is just about the number needed. Yet, the wattage necessary for this is impractical, as total projector power for R-G-B would rise above 550 watts.

What is needed, even with the highest-performing LEDs, is a more angularly efficient LED illumination array than would exist by such conventional means.

The present inventions, shown in three basic forms, addressing this and related needs, are based on the two original forms shown in FIGS. 1A–B and in FIGS. 2B–C. Each better facilitates such practical high-lumen density applications, particularly video projection, where as it has been seen, very high numbers of lumens are required within a narrow angular range and a confined spatial area. The improved forms also facilitate practical applications in other areas, such as traffic signaling, where commercial priorities seek the costs reductions possible when using the fewest number of LEDs possible.

A. First Form: Shallow-Profile Multi-Layer LED Arrays Using Straight-Walled Bins and Modified Prism Sheets (as in FIGS. 3A–B and 5A–C)

Figure 3A:
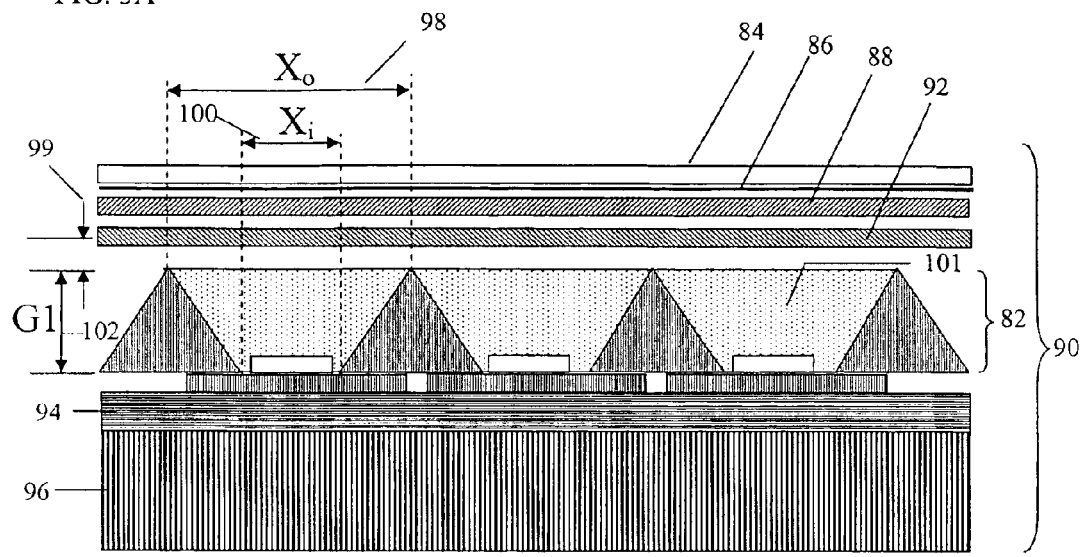
FIG. 3A illustrates in schematic cross-section a multi-layered planar LED light source array in which flip-chip LEDs are arranged in a regular array on a planar circuit plane, each LED protruding through the input aperture of an array of contiguous bins having plane tapered reflecting sidewalls whose bin apertures are beneath a stack of films containing a lower and upper prism sheet.
Figure 3B:
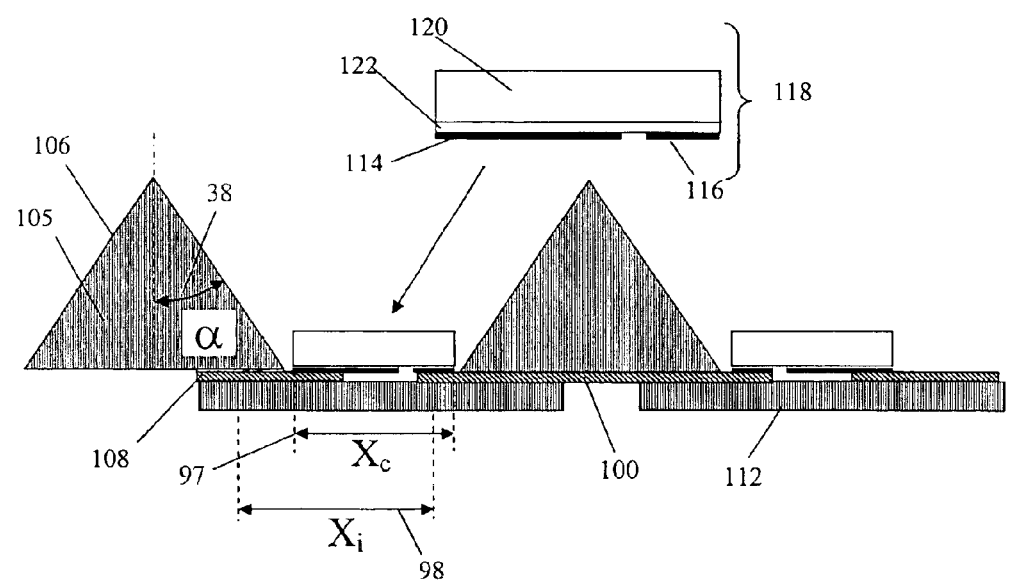
FIG. 3B provides greater detail of the schematic cross-section of FIG. 3A specifically with regard to the insertion of a sub-mounted flip-chip LED into the secondary layer of contiguous micro-reflecting bins.

The first form of the present invention is shown in FIGS. 3A–B, and involves the use of a continuous and regular array structure composed of shallow reflecting bins 82 with plane sidewalls 106 located just beneath a vertical stack of reflecting films covering the bin apertures that includes two orthogonally-oriented prism sheets 88 and 92 with modifications, and optionally, a quarter-wave phase retardation film 86 and a reflective polarizer 84. This compact form, an extension of the previous form shown in FIGS. 1A–B, achieves highest possible lumen density by permitting the densest allowable array of LED chips 118 on the systems 90 back plane 94. Rather than placing LED chips in arrays having empty spaces 105 between the LEDs that equal the size of the LEDs themselves, this structure allows a tighter packing of LEDs, limited by the bin's sidewall angle α, 38, which depends on its constructive relationship with the design of the prism sheet layers 88 and 92.

Moreover, the spacing between the LED array and the modified prism sheets is set by the depth of the shallow reflecting bins 82, and not by a gap between the lowest prism sheet and the bin layer itself. As such, optimum performance depends on the geometric relationship existing between the bin and prism structures.

The LEDs used in this structure may be of any form or number, but are best made in the so-called flip-chip style 118, wherein a transparent substrate material 120 (currently sapphire) is combined with epitaxial layers 122 (currently gallium nitride based) whose structure and adjacent electrodes 114 and 116 act to form the p-n junctions that generate emitted light. Electrodes 114 and 116 have been made reflecting, so that any emitted light directed towards these elements reflects towards the transparent substrate layer, and thereby, outwards from the LED.

One particular advantage of orienting the LED chip with its electrodes facing downwards is that it reduces the difficulty of making electrical interconnection. In this case, a process known as solder-bumping is best used to re-flow solder material deposited between the LED electrodes and counter-positioned bars (or stripes) 100 and 108 placed on the mounting surface (either a back plane 94, or as shown in the example of FIGS. 3A–B, a sub-mount 112. Another advantage of the flip-chip orientation is that it provides lowest possible thermal resistance from the source of heat-generation (the electrodes and p-n junction) and the heat extraction layer 96 attached to LED-mounting back plane 94. It is crucial to minimize all thermal resistance paths, as the system's net thermal resistance determines its steady-state temperature during operation, which must be limited to values less than about 150 C or risk significant performance degradations from material failures.

The cross-sections shown in FIGS. 3A–B represent only a single LED chip within each bin unit. While modern LEDs can be operated directly in air, best performance is achieved when encapsulated in as high a refractive index medium as feasible (typically around 1.49) 101. The reason for this dielectric encapsulation 101 is to minimize the amount of light emission in the light generation layer 122 that can be retained within this layer and within the attached device substrate 120 by total internal reflection. It is well known that the critical angle for total internal reflection depends on the difference of refractive index between the light containing medium and its surroundings. The bigger this difference, the more luminous energy is trapped by total internal reflection, and thereby lost to application.

Figure 4A:
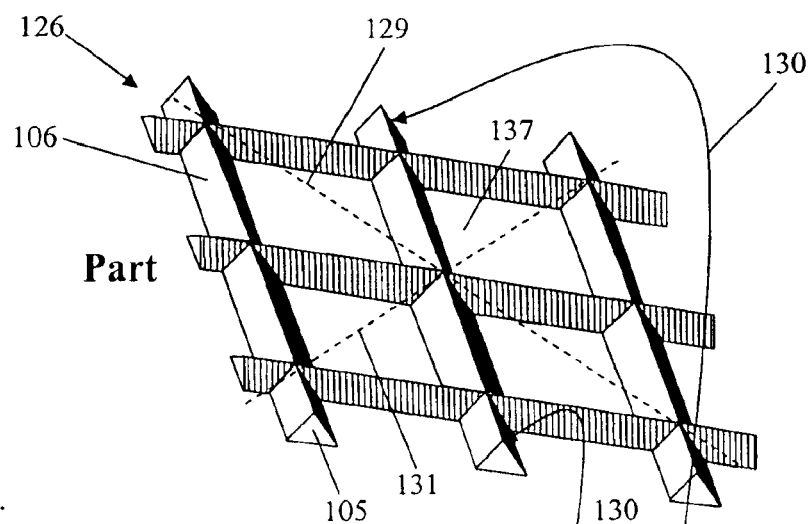
FIG. 4A contains a perspective view of an array of contiguous plane-walled reflecting bins, such as that represented in the schematic cross-section of FIGS. 3A–B.

The geometric form of the bin structure of FIGS. 3A–B is a special case of the bin structure described in our previous inventions with sub-bin layer 22 and main bin layer 12 made so as to have the same sidewall angle α, 38, and the same internal dielectric medium 18, as in the lower part of FIGS. 1A–B. This bin structure 126 is fabricated, as shown schematically in FIGS. 4A–B, using tooling 128, formed to the negative (or reverse) shape of the array structure 126 to be formed. For the symmetrical (square) bins shown, the form tool 128 can be made as in FIG. 4B from a base metal substrate, for example, by plunge cutting repetitively ruled lines using a specially shaped diamond tool, shaped so that the final total included groove angle is 2α, α being the sidewall angle 38 as shown in FIGS. 3A–B. Other equally well established cutting methods such as single-point or fly cutting may be used as well. Once a properly shaped form tool is created, it is used as the master for any one of a number of well-established forming processes such as electroforming, molding, embossing, and cast-and cure that result in the formed part 126 as shown in FIG. 4A. Form tool mesas 135 may be slightly extended so as to be able to punch through casting, molding or embossing products to assure clean and clear through holes are made in resulting part 126.

Figure 4B:
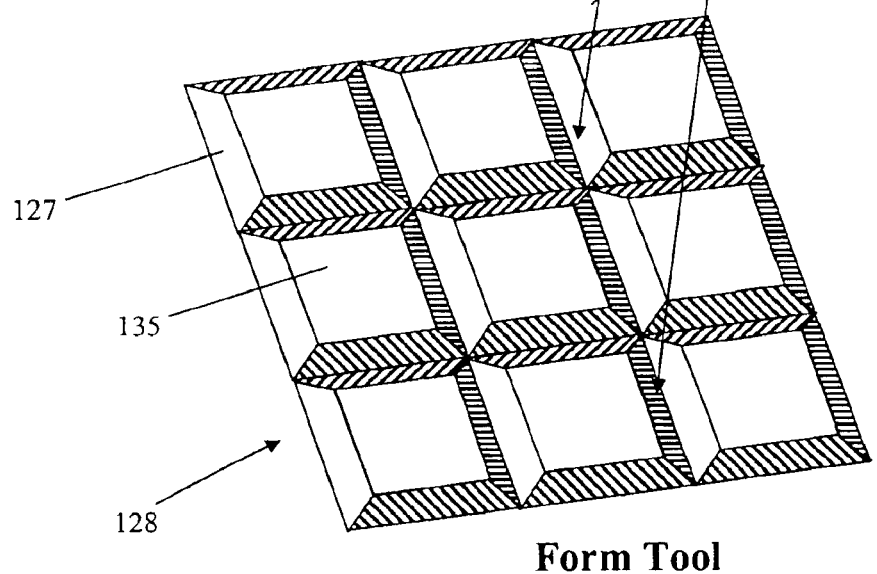
FIG. 4B contains a perspective view of the tool structure used to form the array of reflecting bins illustrated in the perspective of FIG. 4A.

Guidelines 130 in FIG. 4 show how a portion of formed part 126 in FIG. 4A removes from a portion of the grooved pattern in form tool 128 in FIG. 4B. It is equally feasible to form bin part 126 by any appropriate direct forming methods such as for example, chemical etching, electro-discharge machining, and depending on the actual bin size, wire electro-discharge machining. Of these, an advantage of forming the bins of a conductive material such as metal, is that the metal adds to the heat extraction capacity of the system, diffusing heat throughout the structure and away towards its underlying heat extraction layer 96 (FIGS. 3A–B). Whether bin part 126 is formed in metal or plastic, its sidewall surfaces are subsequently (or contemporaneously) coated with a high reflectivity, specularly reflecting film such as protected silver or enhanced aluminum.

In cases where the flip-chip LEDs 118 are pre-mounted by their manufacturer on individual sub-mounts, 112 in FIGS. 3A–B, the underside of the bin part is used conveniently, as described later on, as the substrate for associated electrical interconnection stripes 100 and 108.

The bin part 126 may also be an artifice for mechanically supporting a dielectric encapsulating bin structure 101 that ordinarily fills in within the internal cavities of a physical structure such as 126. In this case, the reflecting sidewall becomes the internal sidewalls of the dielectric structure bounded not by metal, but by the thin layer of air between uncoupled dielectric and metal surfaces. The physical shape of this dielectric structure directly mimics the physical shape of form tool 128, with the principal difference being that it is made instead of an uncoated optically clear and transparent dielectric material. A traditional advantage for reflecting light from such a dielectric air boundary, rather than a dielectric metal boundary is that the reflectivity achieved in making a total internal reflection (TIR) can be considerably higher than that of a purely metallic reflection. Counterbalancing gains made by the improved reflectivity of a dielectric reflecting structure, however, are the losses of light rays that fail TIR and escape the dielectric into air. These losses, if not averted, could create a preference for using metallic reflecting walls 106 that handle all rays. One way to avert such losses is to combine use of a reflecting bin structure (shaped as 126 in FIG. 4A) with a dielectric insert (shaped as 128 in FIG. 4B). When this is done, all light coupled into the dielectric from the LED chip makes it through the bin's output aperture $X_i$, 98, through the dielectric 101, either directly, or by external reflection across the air-gap from the decoupled metal reflecting surface. The only drawback to taking this approach is that the LED chip must be immersed within dielectric medium 101. This is straightforward when filling physical bins 126 (FIG. 4A) with a compliant dielectric material such as a silicone, but less so when invading the LED-chip into a preformed dielectric material. One method for accommodating this approach would be to pre-form a small chip-sized-boss in the forming tool, so that it would create a chip-sized well in the formed dielectric. An optical adhesive would then be used to make optical contact between chip and dielectric.

Figure 5A:
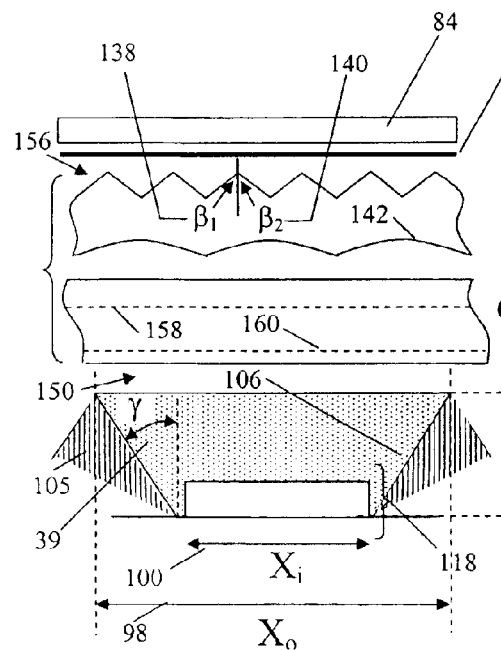
FIG. 5A is a schematic cross-section of the front view of a one-bin region of the multi-layered LED light source array of FIGS. 3A–B.
Figure 5B:
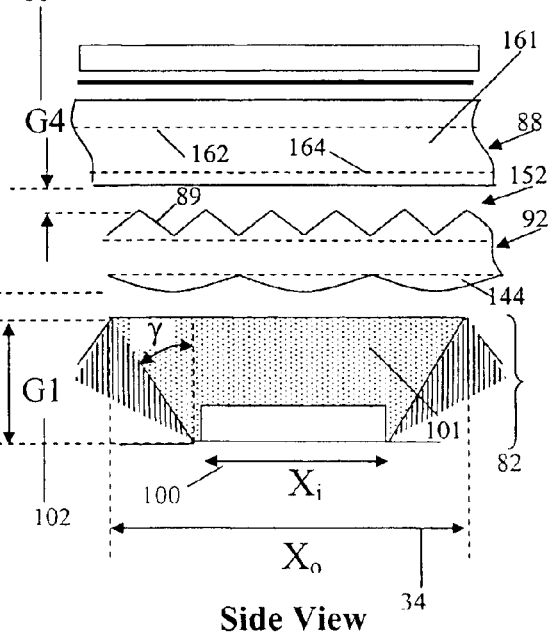
FIG. 5B is a schematic cross-section of the side view of a one-bin region of the multi-layered LED light source array of FIGS. 3A–B.
Figure 5C:
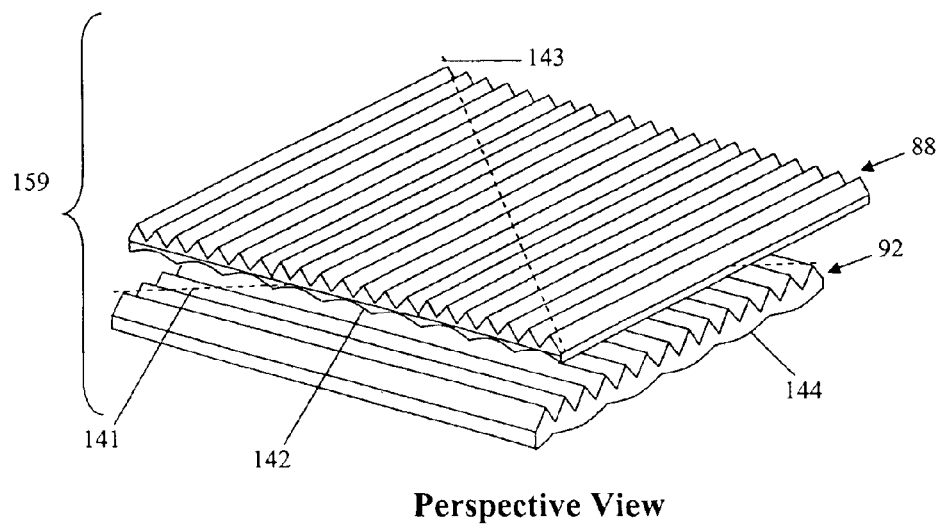
FIG. 5C is a perspective view of the two prism sheets as located above the bin arrays illustrated for example in FIGS. 1A, 3A–B and 5A–C.

The primary improvement in the present invention, aside from its more realistic flip-chip LED mounting structure, and its shallow bin structure, is in the construction and location of the two elevated prism sheets 88 and 92, shown in more detail in FIGS. 5A–C.

B. Bin Depth and Modified Prism Sheets

In the new invention, bin depth G1, 102, as in FIGS. 5A–B is used to set the best gap between prism sheets 88 and 92 (also shown separately in FIG. 5C), and the emitting plane of the LED array. In the previous invention, the gap between the lower prism sheet and the LED array was set not only by bin depth, but also by a physical spacing between the prism sheet substrate and the top of the bin layer.

It will be shown that arbitrary bin depth may significantly restrict the array's effective output lumens.

The prism sheets themselves may also be modified as in FIGS. 5A–C, not only so that their apex angle $\beta_1+\beta_2$ (138 and 140) optimize reflective interaction with underlying shallow bin layer 82, but so that, in certain cases, substrate layers 161 may be altered, for example, with a positive or negative cylindrical lenticular lens structure. The inclusion of such optional diffusing structures is warranted when their beneficial effect on overall beam uniformity is desired.

In the original invention, the two orthogonally oriented prism sheets (see 4 and 6 in FIGS. 1A–B) use parallel 90-degree prismatic grooves on otherwise planar substrates, similar to 3M's commercially brightness enhancement film (BEF™). 3M's 90-degree BEF prism sheets are used to increase viewable brightness in flat panel LCD screens (such as those used in laptop computers and desktop monitors). Unlike BEF, which is typically placed directly against a passive flat panel backlight and just behind the LCD screen to be illuminated, the present prism sheets are each elevated specific distances with respect to the source of light (i.e. the binned LED array) and to each other, as in FIGS. 1A–B. Sheet elevation is used to achieve a best position for the four virtual images of each LED's emitting region created by the sheets, with the goal of improving overall spatial uniformity of the illuminating beam generated by the LED array across the output aperture.

When the goal is also to maximize the total number of output lumens in a beam of light coupled from the reflectively-binned LED array within a given angular range (say the +/−25-degrees needed by the video projector example above), the conventional prism sheet (using plane substrates and prism grooves whose apex angle is 90-degrees), arbitrarily positioned above the source of light, does not produce the best possible performance.

The preferred structure is shown in FIGS. 5A–C in terms of its front (FIG. 5A) and side view (FIG. 5B) cross-sections, and a perspective view (FIG. 5C) of the two modified prism sheets. In the preferred configuration, bin layer 82 has depth G1, 102, and a sidewall angle measured from the vertical, γ, 39, the relationship between them, as in equation 3, governed by the size $X_c$ 97, of LED chip 118, the relative size of the bin bottom, $X_i$ 100 and the bin's output aperture $X_o$, 98, in each meridian (front and side views). While optimum values depend on the specific nature of reflective interactions between the bin geometry and the geometry of the modified prism sheet superstructure it is the size of the bin's output aperture, $X_o$, which first establishes the density (and number) of LEDs within the array. The larger ratio of output to input aperture ($X_o/X_i$), the sparser the array; and the smaller the ratio of output to input aperture, the denser the array.

Meridian (X or Y): $G1=(X_o-X_i)/2 \tan \gamma$ (3)

There are practical limits to the density with which today's LEDs can be arranged in 1D and 2D arrays, primary driven by cost and total supportable wattage. The higher the LED wattage required per square millimeter, the more difficult is the task of heat extraction, as will be discussed in more detail later.

The modified prism sheets consist of prism apex angles that are the sum of the angles $β_1$, 138 and $β_2$, 140, and a substrate layer optionally containing positive or negative cylindrical lenticular lens structures, radius of curvature, R. In each sheet where they are contained, the cylindrical lens axes run substantially parallel to the axes of the corresponding prism grooves. Prism sheet diagonals (141 in lower sheet 92 and 143 in upper sheet 88 as in FIG. 5C) are preferably aligned orthogonally to one another, but may be aligned in any angular orientation to bin aperture diagonals 129 and 131 as in FIG. 4A.

C. Method of Optimization

A fully parameterized and predictive computer model is constructed to explore the underlying effect on performance between bin array and prism sheet geometries. The advantages of using a predictive model for this purpose rather than more traditional laboratory experiments are flexibility, time-efficiency, and cost. Fabricating a diverse enough combination of bin array and micro-prism sheet geometries would be a sizable and costly challenge. Even if cost were no object, there would be practical limits on the degrees of fineness over which the geometric variables could be explored.

Aside from the geometric relations of equation 3, no equivalently simple mathematical relationships can be derived between the parameters of equation 3 and the prism sheet parameters, $β_1$ and $β_2$ for the lower sheet, R for the lower sheet, $β_1$ and $β_2$ for the upper sheet, R for the upper sheet, G2 and G4. While the mechanisms of reflection and transmission at each interface are well understood, and based only on the laws of reflection and refraction at metallic and dielectric interfaces, mathematical complexity arises from the need to quantify the collective behavior of a large number of geometric light rays, traveling both in and out of the plane of FIGS. 5A–C (i.e., paraxial and skew rays). This need is traditionally addressed by means of a ray-tracing program that follows the paths of a large number of randomly generated rays from their point of origin to their point of destination.

Such approach was taken for the system 90 of FIGS. 3A–B, subject to cross-sectional details provided in FIGS. 5A–B. The operative laws of ray trajectories in complex optical systems, especially those with only reflective, refractive and absorptive processes, are confidently and reliably represented by almost any of the commercial ray-tracing software products made for this purpose. Present work was performed using ASAP™ 7.0, a product of Breault Research Organization, Tucson, Ariz. in a straightforward manner.

Computing accuracy depends chiefly on the realism with which the source of rays is represented, the source in this case needing to be a modern flip-chip LED. That said, the system 90 of FIGS. 3A–B is actually a non-imaging optical system, and because of this, does not benefit from more detailed representations of the exact device physics within the LEDs themselves than is necessary. All that is needed is a reasonable geometric approximation of the flip-chip type LED used to give sufficient optical representation of the LEDs most critical structural mechanisms.

Figure 6A:
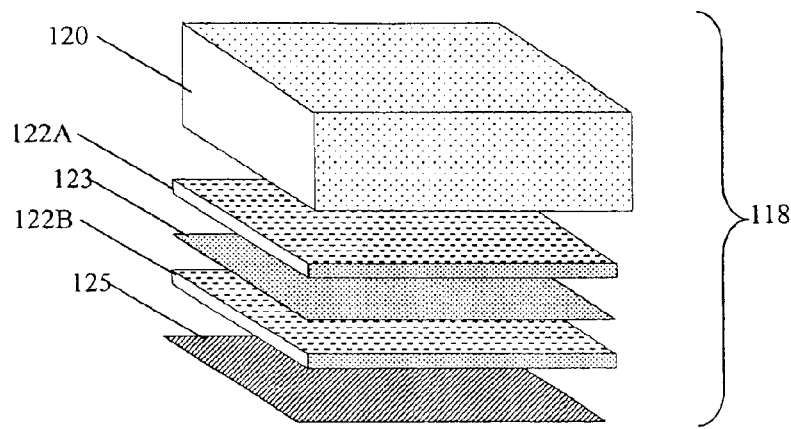
FIG. 6A is an illustrative exploded view of the basic flip chip LED structure as modeled herein, showing a substrate layer, an epitaxial coating, the plane of rays immersed within the epitaxial material, and the reflecting electrode structure.
Figure 6B:
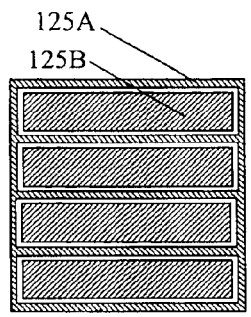
FIG. 6B illustrates a top view of the reflecting electrode's striped structure.
Figure 6C:
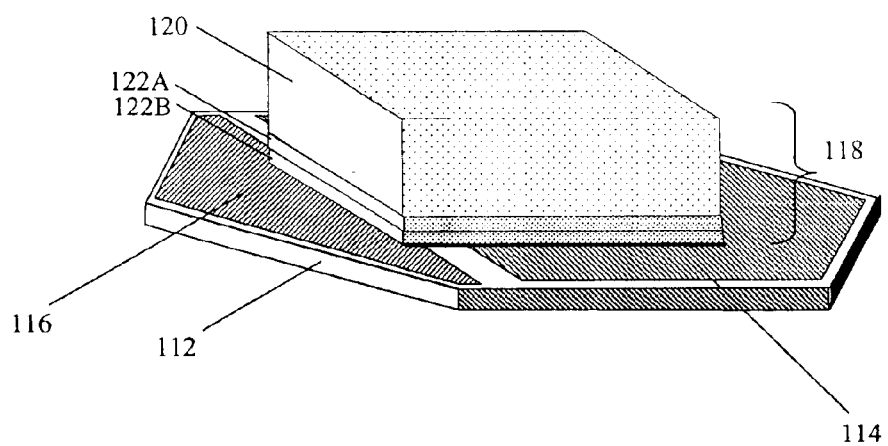
FIG. 6C is an illustrative perspective view of the basic flip chip LED structure as modeled herein, showing, including in particular, its location and attachment to a mounting circuit.

A detailed description of the flip-chip LED source model we used is provided in FIGS. 6A–C, after the generalized flip-chip cross-section symbolized in FIGS. 3A–B. This model is meant to be a reasonable representation of the high power green and blue gallium nitride-on-sapphire LEDs currently manufactured by LumiLeds. The LumiLeds LEDs feature a novel (and highly-reflective) inter-digitated electrode structure 125 (125A and 125B), represented in FIG. 6B that serves as a mirror. No attempt was made to faithfully approximate the structure of this mirror, as it covers practically the entire device aperture. The gallium nitride epi-taxial layers 122 (refractive index about 2.4) are split as 122A and 122B to indicate the approximate location of the emitting plane 123 where rays are generated randomly spatially within the plane and over every possible angular direction. The sapphire substrate (refractive index about 1.8) is about 100 microns in thickness. Many rays generated within epitaxial layers 122 remain trapped within this high refractive index wave-guide. Rays that escape the epitaxial layers do either through their bounding edges or through the interface with sapphire substrate 120. Similarly, rays that escape total internal reflection within the sapphire substrate, escape as output through the 5 exposed sapphire faces.

As in FIGS. 3A–B and 5A–C, the refractive index surrounding (encapsulating) flip-chip LED 118 is typically about 1.49. The source model is pre-calibrated against reported (or expected) experimental results for the bare device. Calibration variables include the thickness in microns of the epitaxial layer 122 (taken as being about 2 microns), the reflectivity of electrode mirror 125 (taken as being about 0.89) and the average lumens/mm$^2$ that are actually created within the device's simulated p-n junction plane 123. Calibration consists of collecting and analyzing all output rays in total lumens, and comparing this result with the experimentally observed result. Until the model value and the experimental value agree, judicious changes are made to any of the performance controlling variables. In this particular case, it is less important that the variables actually represent their physical reality than that they combine to allow correct simulation of the LEDs total output lumens.

Once the LED source is reliably calibrated, it is incorporated within the complete illumination system 90 of FIGS. 3A–B with confidence that the system's output predictions are found to be just as accurate and realistic.

D. Geometrical Relationships and Their Effect on LED Illuminator Performance

The total number of output lumens contained within a required angular range specifies LED illuminator performance.

As one example of illumination system 90 of FIGS. 3A–B we use the LED source model described above, and the case of an array of 1 mm square LumiLeds type flip-chip LEDs, 118, capable of generating 100 lumens/mm$^2$ (the performance expected of the best quality LumiLeds production units by the first half of 2005).

The array's aperture, consistent with the projector example given above, is limited approximately to 12 mm×9 mm rectangular (or 12 mm×12 mm square) cross-sections, and effective illumination angles of nominally +/−25-degrees. The number of LEDs used in this array is limited to about 40–50 chips, to control cost and wattage. This means for the case of square bin apertures, that $X_o$ is 1.6 mm (i.e., $(12)(9)/(1.6^2)=42$ or $(122)/(1.62)=56$). Allowing a small margin at the bottom of the bin around the LED chip, $X_i$ becomes 1.1 mm, and the bin's sidewall angle, $\alpha$, a geometric function of bin depth G1, 102 (in FIGS. 3A–B) governed by equation 3.

Other configuration variables are shown more clearly in FIGS. 5A–B, and include lower prism sheet gap spacing G2, 132, lower prism sheet lens radius $R_L$, 144, lower prism sheet apex angle $\beta_1+\beta_2$, upper prism sheet gap spacing (relative to the top of the lower sheet) G4, 31, upper prism sheet lens radius $R_H$, 142, and lower prism sheet apex angle $\beta_1+\beta_2$. For simplicity the quarter-wave layer 86 and the reflective polarizer layer 84 are not included in the analysis.

There are some cases where including a lens structure 142 or 144 on the prism sheets substrate layers 161 improves the number of effective output lumens, spatial beam uniformity, or both.

All output rays are collected on a large absorbing plane placed directly above the apex points of upper prism sheet 88. The total flux over all angles (+/−90-degrees) reflects the overall collection and transmission efficiency of system 90. The flux fraction found within an angular range of +/−25-degrees is a critical measure of merit for the video projector application example, and the performance indicator to be maximized, as will be developed in greater detail below.

Best results for the 1 mm LED chips in the 1.6 mm bins described are achieved with 174-micron bin depth and symmetric 52-degree prism apex angles, $\alpha$.

The development of this unique design combination results from the following analysis.

E. Effect of Bin Depth and Prism Angle

The best performing LED array illuminator produces the highest number of output lumens within the angular range required to achieve full (LCD or DMD) field coverage (in this case +/−25-degrees), and does so uniformly over the LED array aperture. This behavior depends on a cooperative relationship between reflective bin depth 102, G1, and the full apex angle, $\beta_1+\beta_2$, of the prisms in prism sheets 88 and 92, as in FIGS. 5A–B.

Figure 7:
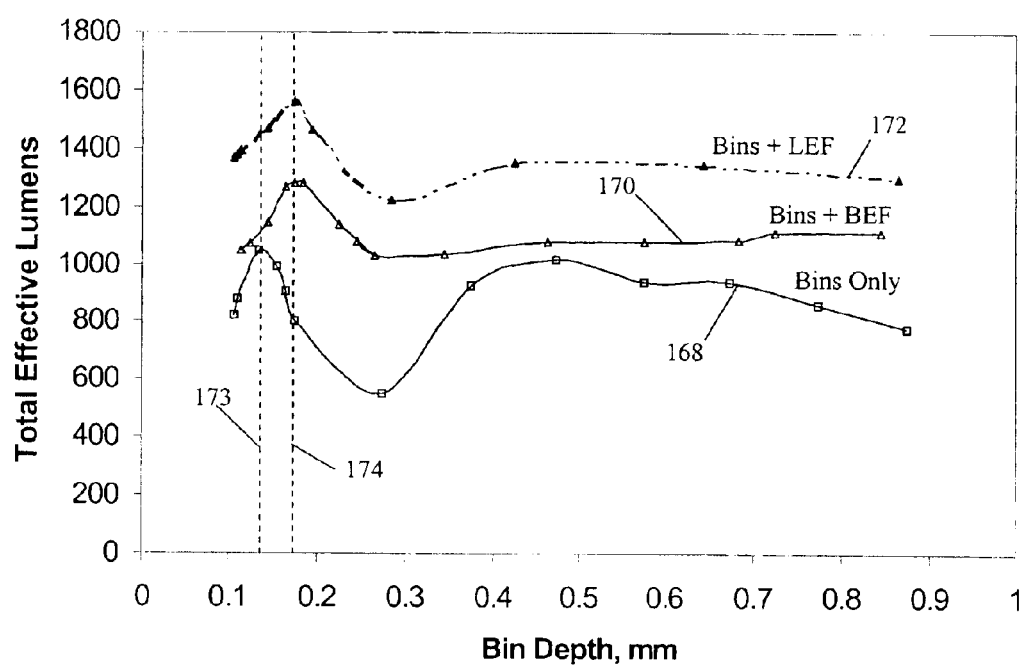
FIG. 7 represents the graphical results in total effective output lumens of a 40-bin LED light source array structured as in FIGS. 3 and 5 as a function of bin depth and the type of films elevated above the bins.

The importance of bin depth 102 in effecting maximum possible output performance is traced for three particular straight- or flat-walled cases in FIG. 7: bins only (curve 141), bins and sheets of commercial brightness enhancement film BEF (curve 143), and bins and crossed sheets of specially-optimized prismatic lumen enhancement film LEF (curve 145).

For the case of binned flip-chip LEDs by themselves, there is a slight output peak of about 1000 lumens for the array at a bin depth of 135 microns, which is just slightly deeper than the chip thickness itself (see curve 141 in FIG. 7). As will be discussed later, the bin depth corresponding to this peak performance closely approximates the behavior of ideally shaped curved-wall non-imaging optical concentrator bins.

When two commercial prism sheets are added directly above the binned LEDs, each with 90-degree apex angles and prism grooves running perpendicularly with each other, the output peak rises 28% to about 1280 lumens, with the associated bin depth increasing to about 174 microns (see curve 143 in FIG. 7). This result emphasizes the importance of bin depth as a critical design factor. There is little or no performance gain seen when the prism sheets are used above 135-micron deep bins; yet, when the same prism sheets are used above 174-micron bins, the apparent gain is 60%. So, for a meaningful effective lumen gain with prism sheets positioned directly above binned LED chips, the bin depth must not be chosen arbitrarily.

The 90-degree prism sheet, usually called BEF (and sometimes Vikuiti™ BEF 90/50) is a plastic film product manufactured and sold by 3M for brightness enhancement use in the fluorescent backlights common to all directly-viewed LCD display screens. While 90-degree prisms may be best for increasing a direct-view display's apparent brightness, 90-degrees is not found to be the best apex angle for enhancing the number of effective lumens within an LED array illuminator's output beam (see curve 145 in FIG. 7). In this case, the apex angles are increased to 104 degrees full angle for both the lower and the upper prism sheets. When this is done, total effective lumens rise by an additional 23% to 1580 at just about the same bin depth of 174 microns (see curve 145 in FIG. 7).

BEF is normally used in conjunction with highly scattering white cavities. The optimum 104-degree prism sheets developed herein are done so for use with bin arrays whose reflecting surfaces are highly specular.

The detailed physical relationship existing between bin depth 102 and prism sheet apex angles 138 and 140 is a very complex one involving multiple 3-dimensional reflections between bin sidewalls 106, the LED's flip-chip's internal structure 118 and the prism facets themselves.

Figure 8:
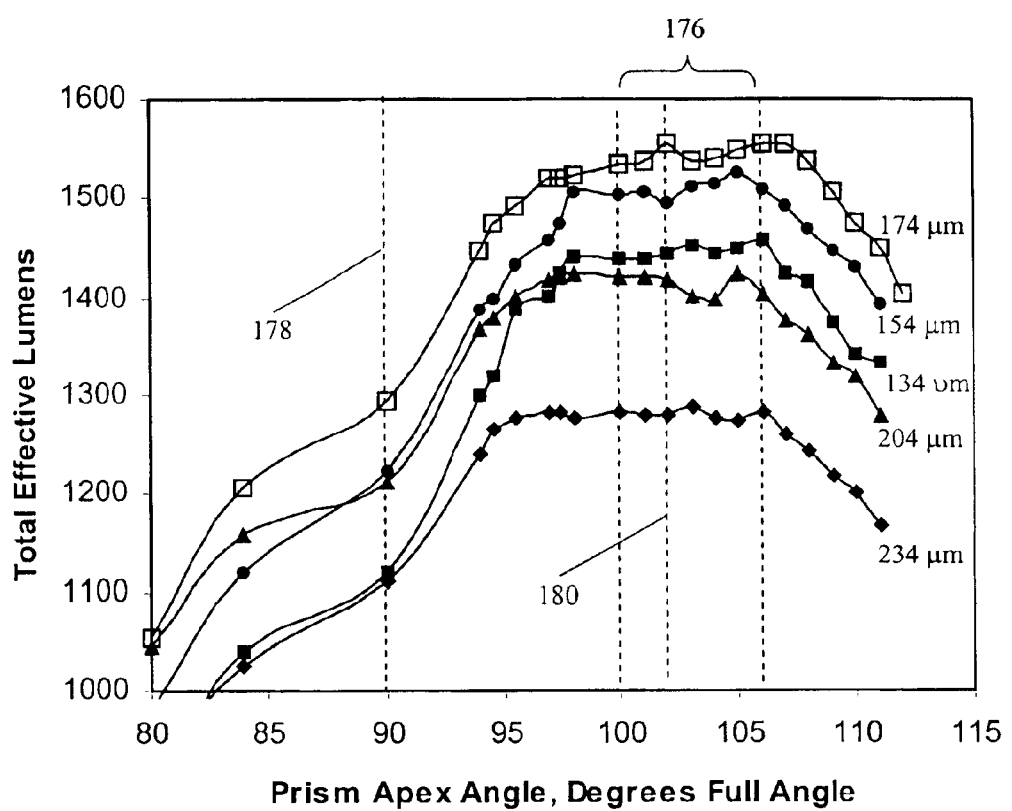
FIG. 8 represents the graphical results in total effective output lumens of a 40-bin LED light source array structured as in FIGS. 3 and 5 as a function of the apex angle of prism sheets used and the bin depth.

One way of summarizing the net effect of this relationship for bin depths of 134 um, 154 um, 174 um, 204 um and 234 um is shown in FIG. 8, with total effective lumens plotted as a function of the full prism apex angle, made equal for the lower and upper sheets. In this case, peak performance is found to occur in the vicinity of 100-degrees through 106 degrees, 176, rather than the more conventional 90-degrees, 178, and strong preference is found for bin depths in the vicinity of 174 um, 180. As bin depth increases, bin aperture held constant at 1.6 mm, sidewall angle 150, $\gamma$, decreases, as do the number of total effective lumens. As bin depth decreases, sidewall angle increases, and the number of effective lumens also decrease.

Figure 9:
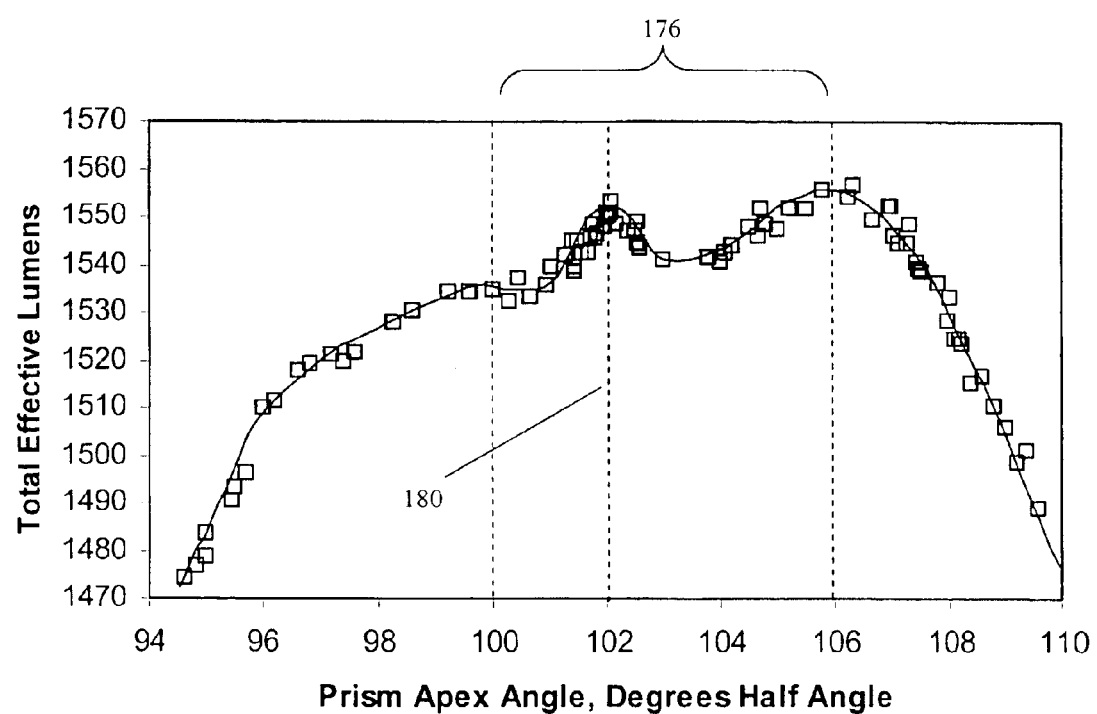
FIG. 9 represents the graphical results in total effective lumens of an optimized 40-bin LED light source array structured as in FIGS. 3 and 5 as a function of the apex angle of prism sheets used
Figure 10:
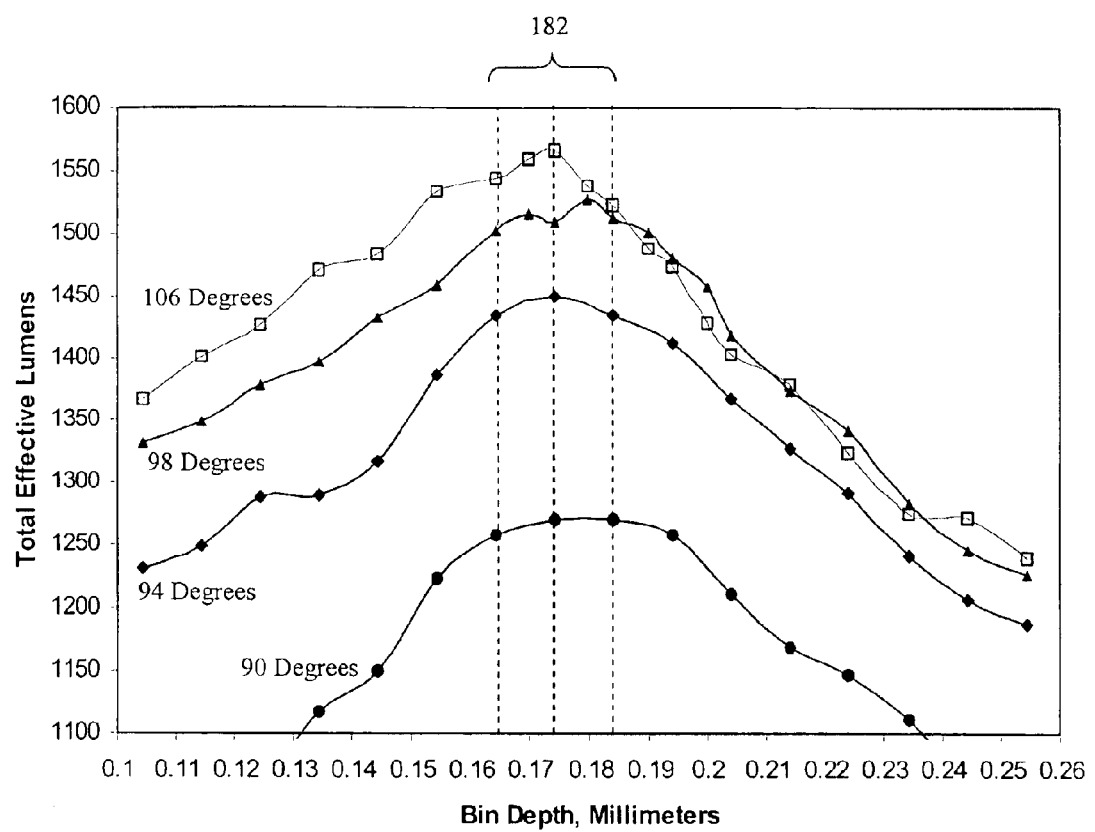
FIG. 10 represents the graphical results in total effective lumens of a 40-bin LED light source array structured as in FIGS. 3A–B and 5A–C as a function of both the apex angle of prism sheets used and bin depth.

The peak in total effective lumens that arises in FIG. 8 for 174 um bin depth is examined more closely over a range of prism apex angles between 94 and 109 degrees in FIG. 9. Each data point (open square) shown in FIG. 9 represents a computer ray trace run of at least 500,000 rays. Despite some small fluctuations, this behavior suggests a region of relative performance stability for the structure of FIG. 5 with upper and lower prism angles falling between 100 and 106 degrees full angle, 176. Performance peaks are found at about 102 degrees (180) and 106 degrees (181).

Yet another way of illustrating this important physical relationship is shown in FIGS. 1A–B, also for the illustrative 1.6 mm bin aperture. Total effective lumens is plotted as a function of bin depth for a variety of prism apex angles, from conventional 90-degrees full angle prisms at the low end, to 106-degree prisms, at the high end. In all cases of prism sheet apex angle, preferred bin depths are found in the range of 160 to 180 microns, 182.

F. Uniqueness of Multi-Layered Bin-Prism Sheet Configurations

The uniqueness of the instant LED illuminator inventions of FIGS. 3A–B and 5A–C over conventional lens-based collecting optics can be estimated in the context of the projector example described above. Suppose, just as one example, that light from the 12 mm×9 mm 40-LED array is to be collected and then relayed by conventional lenses so that output light satisfies the projector's need for +/−12-degrees. In this case, it can be shown that the lens used would collect effective light from the array only over about +/−25-degrees. Although the 40 LEDs would be generating 4,000 lumens spread evenly over all angles, only 714 lumens [(4000)$Sin^2$ (25)] would be contained within +/−25-degrees. Hence, gains due to the present invention's use of uniquely sized bins (134 and 174 microns, FIG. 7) would be more than 40% over this performance. Gains due to the present invention's use of uniquely sized bins with conventional 90-degree prism sheets would be over 70%. And, gains due to the present invention's use of uniquely sized bins with correspondingly optimized 102–106-degree lumen enhancement prism sheets would be over 100% (or 2×).

The unique performance of the bin array—prism sheet combination will be explored even more thoroughly below in section 2.2.6.2.

G. The Effects of Prism Sheet Structure and Other Modifications

Several structural variations may be made to basic prism sheets 88 and 92 (FIGS. 3A–B and 5A–C). One variation involves adding spherical or aspheric curvature to the prism facets (89 in FIGS. 5A–C) themselves on lower prism sheet 92, upper prism sheet 88, or both. A second variation involves adding optical surface structure 142 and 144 to the upper and lower prism sheet substrates 161, this structure being either prismatic facets or lenticular cylinder lenses of structural depth 160 (lower sheet 92) or 164 (upper sheet 88). None of these additions, however, included alone or in combination are found to have a positive effect on total effective lumens. There is one exception. The addition of spherical cylinder lenses 142 and 144 to the prism sheet substrates is found improve the beam's overall spatial uniformity, as will be illustrated later in a treatment of beam uniformity.

H. Beneficial Effects of Polarization Recycling

Figure 11:
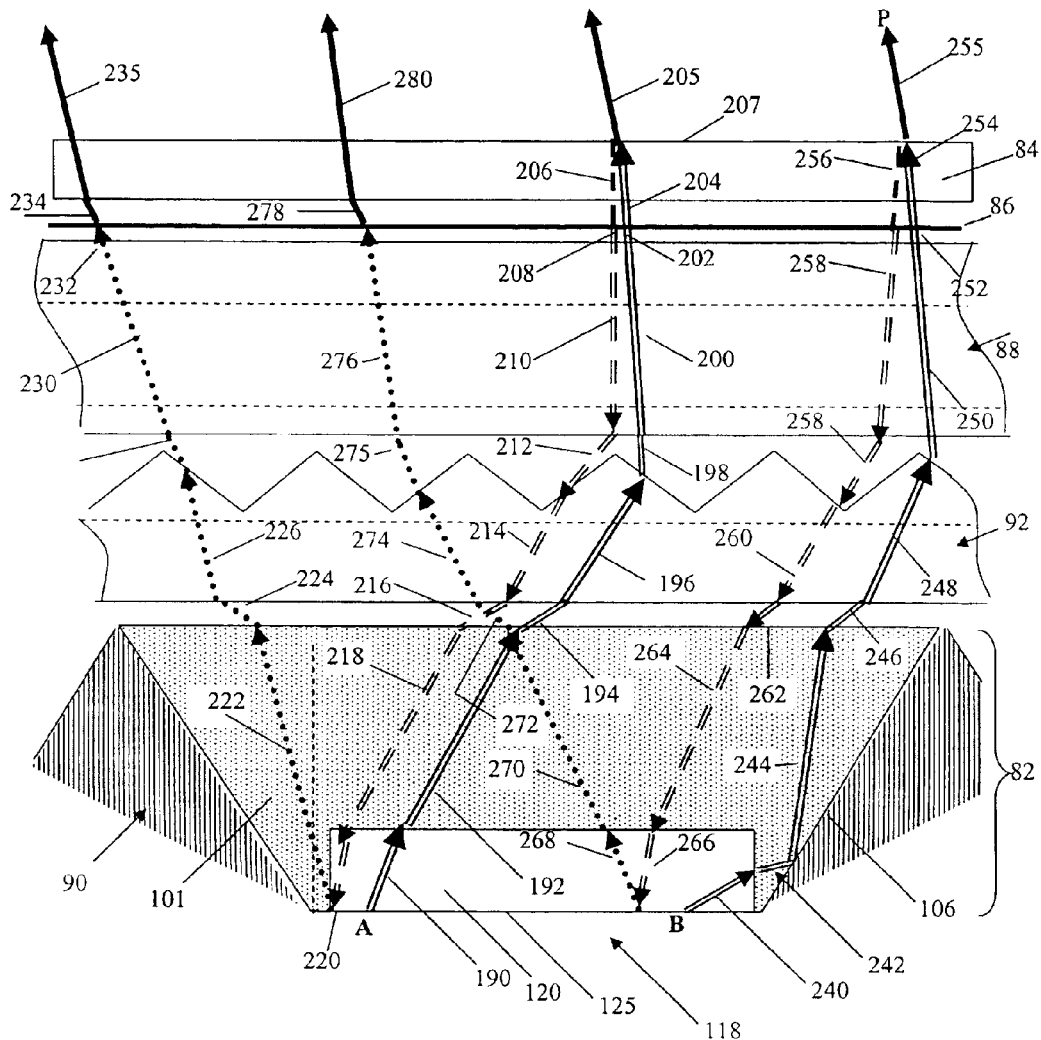
FIG. 11 is a schematic cross-section illustrating the mechanism of polarization recovery and reuse in an LED light source array structured as in FIGS. 3A–B and 5A–C showing the trajectories of illustrative optical rays as a function of their polarization.

One of the several possible polarization recycling and conversion mechanisms included within the present invention is illustrated in FIG. 11. Only a single LED array element in the larger array is shown for purposes of clarity. In this case, we depict a shallow, tapered-sidewall 106 reflecting bin 82, containing a flip-chip LED 118, below a film stack that includes a set of prism sheets 159 as in FIGS. 5A–C (first prism sheet 92 and second prism sheet 88), quarter-wave phase retardation layer 86, and reflective polarizing layer 84. In this example, reflective polarizing layer 84 and phase retardation layer 86 may be disposed below prism sheets 159, or above them, as shown in FIG. 11. The best arrangement depends on the physical properties of the materials used.

Generally, most efficient polarization conversion is predicted when polarizing layers 84 and 86 are disposed immediately above the metallic reflecting bin and just below prism sheets 159. With this arrangement, prism sheets 159 must be made of a non-birefringent material free of non-uniform stresses, so as not to cause subsequent depolarization. Disposing the polarizing layers above the prisms sheets minimizes chances for depolarization, but potentially increases the number of re-cycles necessary before gain is increased. The more collective re-cycles required for successful angular and polarization, the more power lost from the rays from collective absorption and scattering.

The polarization recovery mechanism is explained by following two of many possible illustrative ray paths for the latter case where the polarization converting layers are above the prism sheets. The polarization of any ray segment is summarized in the polarization key at the bottom of FIG. 11 with three parallel lines signifying an un-polarized ray, a single dotted line signifying linear s-polarization, a double dotted line signifying left hand circular polarization, a series of circular dots signifying right hand circular polarization, and a single solid black line signifying p-polarization.

As a first example, consider one random ray 190 generated within the LED's epitaxial layers at spatial point A that passes through sapphire substrate 120. Un-polarized ray 190 then refracts out of the sapphire substrate into the bin's dielectric encapsulant 101 as un-polarized ray 192. Ray 192 proceeds sequentially through air-gap 150 prism sheet 92, prism sheet 88, quarter-wave retardation layer 86 and reflective polarizer 84, as un-polarized rays 194, 196, 198, 200, 202, and 204 roughly as shown. Separation of s and p linear polarization states takes place at reflective polarizer 84, with p-polarized ray 205 transmitted as output, and s-polarized ray 206 reflected back generally towards LED 118 from whence it came. As ray 206 passes through quarter-wave phase retardation layer 86, its polarization state changes from linear to circular (i.e. from s-polarization to left hand circular polarization), as ray 208. Circularly polarized ray 208 then propagates sequentially back through upper prism sheet 88, lower prism sheet 92, air-gap 150, encapsulant 101, and sapphire substrate 120 as rays 210, 212, 214, 216, 218, and 220 respectively. When circularly polarized ray 220 strikes the LED's metallic electrode mirror 125, however, its undergoes the traditional orthogonal change in circular polarization state, becoming right hand circular polarized reflected ray 222. Ray 222 then returns through bin encapsulant 101, air-gap 150, lower prism sheet 92, and upper prism sheet 88, as rays 224, 226, 230, and 232, following deterministic physical trajectories set forth by the laws of reflection and refraction in substantially homogeneous media. As right hand circularly polarized ray 232 passes through quarter-wave phase retardation layer 86, it converts from circular to linear polarization, becoming p-polarized ray 234 (exactly orthogonal to re-cycled s-polarized ray 206. As such p-polarized ray 234 passes through reflective polarizer 84 with minimum loss as p-polarized output ray 235, as it has been oriented for maximum transmission of p-polarized light and maximum reflection of s-polarized light.

In this context, un-polarized ray 204 was split about equally into linearly polarized rays 205 and 206, but only p-polarized ray 205 is useful in polarization sensitive LCD projection systems. Ordinarily, half the delivered lumens in ray 204 are blocked from output use in such systems. Yet, in this case, blocked rays like ray 206 are recycled back into the bin array so as to emerge converted in their polarization as incremental p-polarized output.

Another illustrative ray trajectory is given in FIG. 11 starting at spatial point B as un-polarized ray 240. Ray 240, unlike the previous illustration, strikes the bin's metallic sidewall 106 as ray 242 before leaving the bin. Reflected ray 244 remains un-polarized, and proceeds outwards as before, as rays 246, 248, 250, 252, and 254. On reaching reflective polarizer 84, polarization separation occurs once again, outputting p-polarized ray 255, and re-cycling s-polarized ray 256. The re-cycled ray 256 propagates back through the system, as before, as rays 258, 260, 262, 264, 266, 268, 270, 272, 274, 275, 276, 278, and finally re-cycled p-polarized output ray 280. As with the ray starting from point A, the key to efficient recovery of the re-cycled s-polarized ray is linear to circular polarization conversion at quarter-wave retardation layer 86 and left hand circular to right hand circular polarization conversion at metallic reflector 125.

Efficient polarization recovery of re-cycled rays such as s-polarized rays 206 and 256 depend on their return paths through the bin array system 82 involving an odd number of metallic reflections along the re-cycling path. There is no such restriction on the number of metallic reflections made on the initial path outwards from LED 118. Any re-cycled rays that involve an even number of metallic reflections, always return to reflective polarizer 84 as s-polarized light, and are thereby remain trapped into making multiple return cycles, until their trajectories have been disturbed to the point that they effect a return cycle having an odd number of metallic reflections.

The system depicted in FIG. 11 is enhanced by even a small degree of spatial randomness, such as the random surface-slope variations that exist on all real material surfaces. A forthcoming section is devoted to the issue of surface randomness and its beneficial effect on the efficiency of re-cycling in general.

Reflective polarizer films, such as DBEF™ as manufactured by 3M, have been used primarily in conjunction with "white" recycling cavities where polarization conversion develops randomly by complete depolarization of recycled light by random diffusive scattering. In the present invention, the recycling mechanism is provided almost entirely by the specular metallic (and dielectric) surfaces of and within bin layer 82 (FIGS. 5A–B) and flip-chip LED (FIGS. 6A–C). Phase retardation layer 86 disposed below reflective polarizer 84 and above metallic bin array 82 assures successful polarization conversion when an odd number of metallic reflections are made during the recycling process.

The wide and shallow bin structure of FIGS. 5A–B is particularly well suited to efficient polarization conversion in that very few sidewall reflections are required before re-cycled polarization is converted to transmissive output.

In general, a reflective polarizer increases the percentage of one linear polarization state with respect to the other by transmitting as output the preferred state and reflectively re-cycling the orthogonal state. Once recycled, light of the orthogonal state may be converted to the preferred state, and thereby made eligible for transmission as extra output light.

Without reflective polarizing layer 84 and polarization converting layer 86, output light is essentially un-polarized, which is ideal for many general polarization-independent lighting applications. Other lighting applications, such as LCD-based video projection, need as much pure output polarization as possible.

I. Second Form: Shallow-Profile Multi-Layer LED Arrays Using Curved-Wall Reflecting Bins and Modified Prism Sheets The second form of the present invention is very similar to the first, but uses contiguous bins having curved rather than flat sidewalls. The sidewall shape of reflecting bins 82 shown as being flat in FIGS. 5A–B may have any mathematically specified curved profile, as for example that shown in FIGS. 2A–B. Just as with the straight-walled reflecting bins illustrated in FIGS. 5A–B, mathematically shaped sidewall curves are another closely related way of introducing a means of control on reflective interactions with over-lying prism sheets. One benefit from choosing mathematically shaped sidewalls is that the angular distribution of the bin's output light can be more tightly controlled within the angular range of interest than with most straight-walled bin configurations.

There is one important class of mathematically shaped sidewalls that have the ability to alter angular distribution while minimizing the number of sidewall reflections any light ray experiences within each bin, input and output apertures. Bins of this type are generally known in prior art as non-imaging concentrators (and sometimes as compound parabolic concentrators or CPCs). Bin arrays made with bins having these ideally shaped sidewalls behave as $\theta_i/\theta_o$ transformers, in that each bin within the array transforms LED input light of maximum angle $\theta_i$ to output light of maximum angle $\theta_o$ by virtue of the well established Sine Law: $A_i \sin^2\theta_i = A_o \sin^2\theta_o$, where $A_i$ is the area of each individual emitting region, $A_o$ is the area of each individual output aperture, and $\theta_i$ and $\theta_o$ the respective input and output half angles. Optical systems designed to preserve across each aperture, the product of aperture area and extreme angle, are known do so with the highest possible lumen transfer efficiency. When this principle is applied to bins such as those of layer 82 in FIGS. 5A–B that are made of or filled with dielectric media 101, the extreme output angle $\theta_o$ predicted by the Sine Law exists at within the output aperture of every bin, but just inside the bin's media. It is this calculated extreme angle just inside the bin medium that determines, by Snell's Law at the dielectric-air interface, the full angular range of output light emitted (or extracted) from each bin.

One way such curved-wall bins can be used advantageously is to transform the LED's ordinary +/−90-degree input emission into output angles confined to or about +/−$\theta_c$ within the bin's dielectric media 101 (FIGS. 5A–B), $\theta_c$ being the critical angle for the bin's dielectric—air interface. When this bin design is used, it becomes possible to extract all light emitted by the LED substrate into surrounding dielectric media 101. Ordinarily any light arriving at the bin aperture at angles having trajectories higher (or greater) than +/−$\theta_c$ remains trapped in the bin's dielectric media by total internal reflections.

As an example of this, consider the following scenario. A dielectric fill medium 101 (FIGS. 5A–B) nominally of illustrative refractive index, n=1.49, has a critical angle of $\theta_c$, $\theta_c$ being $\sin^{-1}(1/n)=42.16$ degrees. In the X-meridian, and using an illustrative input aperture size of 1.1 mm, the Sine Law specifies that the correspondingly ideal output aperture size is $1.1/\sin(42.16)=1.64$ mm. This aperture value is close to the preferred output aperture size as used above for straight walled bins. Bin depth, in this curved sidewall case, however, must be made considerably deeper, as prescribed by the mathematically derived length of an ideal non-imaging concentrator, $L=0.5(X_o-X_i)/\tan\theta_o$, or 1.5 mm (which is 8.5 times deeper than the required depth of the tilted flat side-walled bins of FIGS. 5A–B.

Despite the higher output coupling efficiencies possible with curved rather than straight walled reflecting bins, performance benefits are limited to applications where the illumination aperture is not otherwise restricted in area, as it is in the case of an image projector. When the overall bin array is limited to the rectangular area of the projector example, the number of bins fitting within this aperture is limited mathematically, as in equation 4.

$$N_{BINS}=(X_{ILL})(Y_{ILL})/(X_{BIN})(Y_{BIN}) \quad (4)$$

For example, when $X_{ILL}$ is 12 mm and $Y_{ILL}$ is 9 mm, and the bin's output aperture is square and 1.6 mm on a side, there can be 42 bins in the array. When the bins are shaped so as specifically to narrow the range output angles, for example from +/−43.4 degrees to +/−38 degrees (within the dielectric), aperture size increases from 1.6 mm to 1.97 mm and maximum number of bins fitting in the 12 mm by 9 mm array aperture falls from 42 to 34. The fewer the number of bins, the fewer the number of LED chips its possible to use, and thereby the lower is the total effective lumens that are developed.

Figure 12:
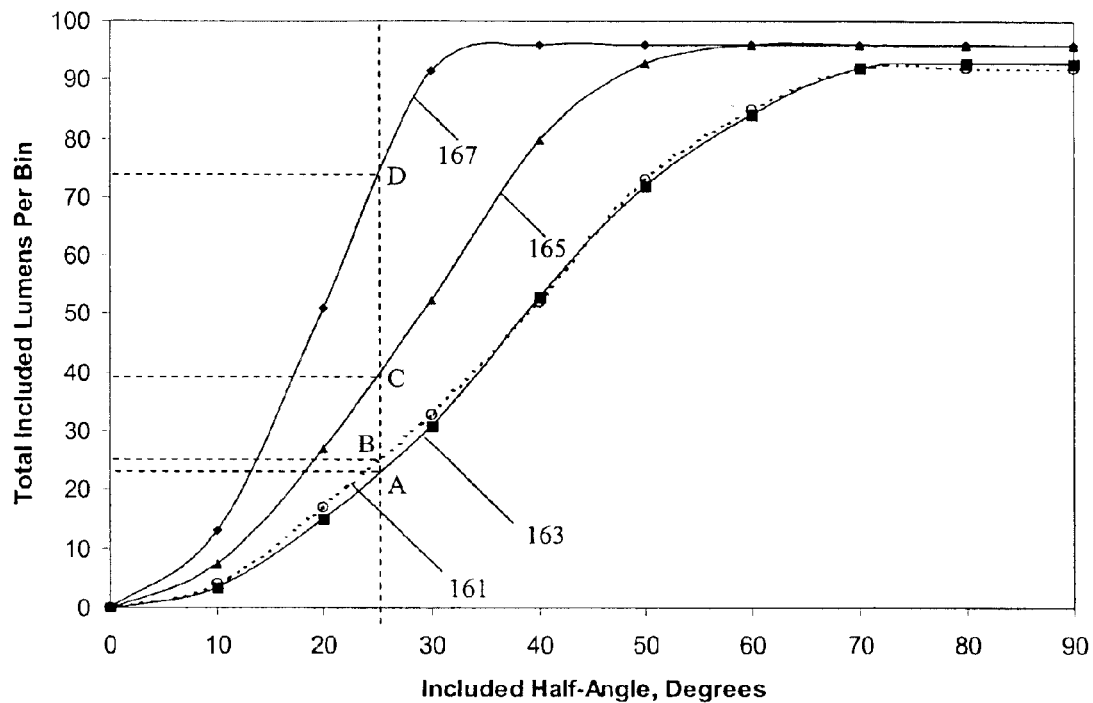
FIG. 12 represents graphical results in total included lumens per bin for an LED light source array structured as in FIGS. 3A–B and 5A–C (curves A and B) contrasted with an array of bins, each of which designed to preserve etendue (curves C and D).

This behavior can be seen in FIG. 12, which plots total output lumens contributed by individual bins versus half-angle of the bin's output light in air. The validated computer model described above is used for this purpose. Curves 163, 165 and 167 are for the curved-walled bins by themselves, without any prismatic over-layers such as layers 88 and 92 in FIGS. 5A–C and 11. These curves related performance for output angles within bin's internal dielectric medium 101 of +/−43.2, +/−30 and +/−20 degrees respectively (corresponding to angles in air of +/−90, +/−48 and +/−30 degrees). Notice in the case of curve 167 that maximum lumen output in air is reached close to an included half-angle of 30 degrees, as expected. Reference curve 161 in FIG. 12 is for the case of 1.6 mm square straight-walled bins described in the above sections; included for purposes of easy comparison.

The legend for the plots of FIG. 12 summarizes salient characteristics of each curve. Designation A refers to the point on curve 161 at an output angle of +/−25 degrees in air; designations B, C and D refer to corresponding points on curves 163, 165 and 167. Notice that curves 161 and 163 are quite similar. This is quite expected as the 174-micron deep straight-walled bin of curve 161 has been optimized (in FIG. 7) to behave in reasonably close approximation to the nearly ideal 1.5 mm deep etendue-preserving curved-wall angle-transforming design 163. In both cases, each bin type outputs into the air above the bin apertures, about 23–25 lumens of the 100 lumens per bin possible (within +/−25 degrees); and about 93 lumens of the 100 possible (within the full +/−90 degrees). This equivalency exists only for equally sized bin apertures. As the curved-wall bins are shaped to concentrate output light more tightly, their bin efficiency rises to 40 lumens for +/−30 degrees in air (point C) and to 73 lumens for +/−20 degrees in air (point D), but so does the corresponding size of their bin aperture (2.2 mm and 3.2 mm square, respectively). As bin size increases, the number of bins able to fit in the fixed 12 mm by 9 mm array decreases significantly; 22 bins for 40% efficiency, and 10.5 bins for 73% efficiency.

All data in FIG. 12 is for the bins by themselves. The comparative effects of adding prism sheets 88 and 92 above the bins are considered in the next section.

J. Performance Comparison Between Straight and Curved-Walled Bin Arrays Using Modified Prism Sheets Total output lumens between +/−25-degrees for straight-walled bin arrays is shown in FIG. 8 as a function of bin depth and prism apex angle. For curved-walled bins, bin depth depends on aperture size, so there is only one performance curve for the comparable aperture'size of 1.6 mm.

Performance comparisons must be made using identical angular ranges and identical illumination apertures. Choosing such conditions for comparison depend on the particular application. For video projectors, the etendue relations of equations 1 and 2 are not the only boundary conditions involved. When an additional stage of angle transformation is used, such as the pseudo-Kohler transformer described in our previous invention, additional conditions come into play. The basic geometry of the planar LED array source 300 as integrated with a pseudo-Kohler second-stage angle-transformer 308 is summarized in FIG. 13.

It is this second stage of angle transformation, or its functional equivalent, that provides efficient interface (or coupling) between LED array 300, its physical aperture 302, and aperture of use 304, in this example, an LCD 306. The angle transformation means is an optical focusing or condensing system (that can be either a lens or mirror) 308, whose effective focal length 310, FL, is ideally matched to the positions of LED light source panel array 300 and LCD 306. When light source array 300 and LCD 306 are positioned coaxially (so as providing telecentric illumination for any imaging system used to view or project the LCD image) and each are at the respective equivalent focal planes 312 and 314 of condensing system 308, spatial uniformity of the angle-transformed light conveyed across LCD aperture 304 is maximized, as has been described previously.

Field coverage on the targeted LCD (or DMD) in the projection example is forced solely by illumination angle, $\theta_{ILL}$, 322, and specifically by the center point ray 324 along with its resulting ray 326 after focusing action of condensing element 308. Ray 326 strikes the edge of the output target (LCD or DMD) 306 in each meridian. All higher angle rays 328 emitted by LED array source 300 do not reach target 306 in a useful manner (either by missing condensing element 308 altogether, or by causing a larger than useful output angle 320 at the target), and are potentially wasted. (Novel mechanisms for re-cycling and re-using unused rays 328 will be discussed below.)

One advantage of the light source arrays 300 of FIGS. 3A–B, 5A–C and 11 in this regard is that while increasing the lumens produced at lower angles at the expense of those produced at higher angles, the illuminator's overall output extends smoothly over the entire angular range. This means that field coverage on LCD (or DMD) 306, regardless of its particular aspect ratio, is automatic.

Figure 13:
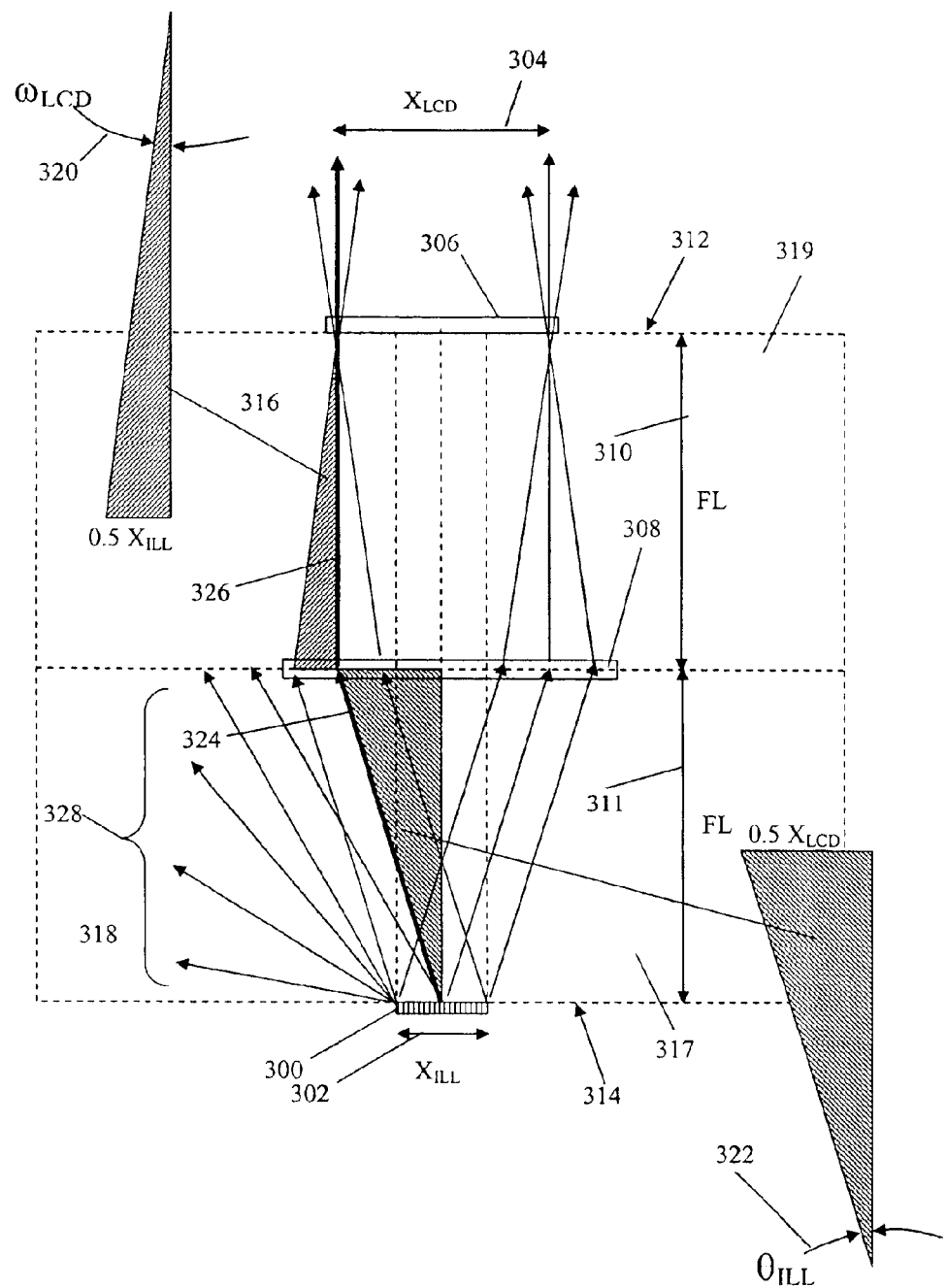
FIG. 13 is a schematic cross-section illustrating the geometrical relations in a projection system combining the LED light source array of FIGS. 3A–B and 5A–C with a secondary angle transforming element and an imaging device (either an LCD or DMD).

Geometric relationships imposed by the angle transformation system of FIG. 13 are controlled by triangles 316 and 318, also shown shaded (and enlarged) for greater clarity. Upper triangle 316 is controlled by maximum angle 320, $\omega_{LCD}$, allowed for light processed by LCD (or DMD) 306. As in the ongoing projector example, this angle is routinely fixed at the +/−12-degrees in air (+/−8-degrees in transparent dielectric media of refractive index 1.49) associated with f/2.4 projection systems. [NOTE: The use of f/2.4 as a working example has been predicated by limitations imposed by existing mirror travel allowed with digital micro-mirrors in DMDs and by the steep fall-off in contrast ratios prevalent in current micro-sized LCDs when their illumination angles exceed +/−12 degrees. While mirror swing in DMDs may be a fundamental limitation, the image contrast sensitivity to illumination angle in LCDs may be improved by a variety of means now well known in the larger format LCDs used in laptop computers and desktop monitors. Should any equivalent angle-widening means be developed for micro-sized LCDs and/or the optical systems within which they are used, similar examples of the current inventions could be made for f/2.0 (+/−14.5 degree) and even f/1.7 (+/−17 degree) projection systems without serious reduction in image contrast.]

Lower triangle 318 is controlled by the size of LCD aperture 304 in each respective meridian (X and Y). Combination of these two geometric conditions results in the expression given in equation 5, which is a variant in each meridian of equations 1 and 2. This expression can be generalized to any other LED array lighting application using the same angle transformation method of FIG. 13.

$$X_{ILL} \tan \theta_{ILL} = X_{LCD} \tan \omega_{LCD} \quad (5)$$

While using such a pseudo-Kohler (focal-plane-to-focal-plane) optical coupling method is quite well established in general practices, its specific embodiments with the unique close-packed LED light source arrays of FIGS. 1A–B, 2A–B, 3A–B, 5A–C, and 11 are not. Moreover, it will be shown later that such an arrangement is in fact preferable for coupling light efficiently from planar light source arrays (such as LED array 300) to planar illumination targets (such as LCD 306).

In projector system usage, $X_{LCD}$ and $\omega_{LCD}$ are fixed by design intent, so the product of illumination size and the maximum illumination angle allowed are defined by equation 5. When $X_{LCD}$ is 24.384 mm (as in a 4:3 aspect ratio aperture with 1.2 inch diagonal), and $\omega_{LCD}$ is 12 degrees (as in the f/2.4 example), the product of illuminator size and angle has to be about 5.183 as opposed to 5.07 given by the Sine Law. At +/−25-degrees, the Sine Law limited illuminator size is slightly larger than that governed by the Tangent dictated geometry of FIG. 13. In real system examples, these relations also depend on the refractive index of any dielectric media placed between light source panel array 300, focusing system 308 and LCD panel 306. In many of the designs described in the earlier invention, these spaces may be advantageously occupied with dielectric beam-splitting cubes having refractive index about 1.49. When this is assumed to be the case, it affects the values of the effective focal length 310 (and 311) as well as illumination angle, $\theta_{ILL}$, 322. The optical direction cosines maintain preservation of etendue across every dielectric-air boundary, but the physical path length (and angle) of light in refractive media differs by that in air by means of Snell's Law.

When the output apertures of curved-wall and straight-walled bins are made the same and set, for example, at 1.6 mm, performance comparisons are made fairly. In each case, the same number of LED chips and bins fit within the allowed illumination aperture 302 in FIG. 13. Using equation 5 and the effective illumination angle (+/−25-degrees) for full field coverage, the illumination aperture is 11.62 mm by 8.71 mm, and there are about 40 bins per aperture. Total effective lumens are then plotted in FIG. 14 as a function of apex half-angle ($\beta_1=\beta_2$) for the prisms used in sheets 88 and 92, for both 174-micron deep straight-walled bins and for 1.5 mm deep curved-wall bins.

Figure 14:
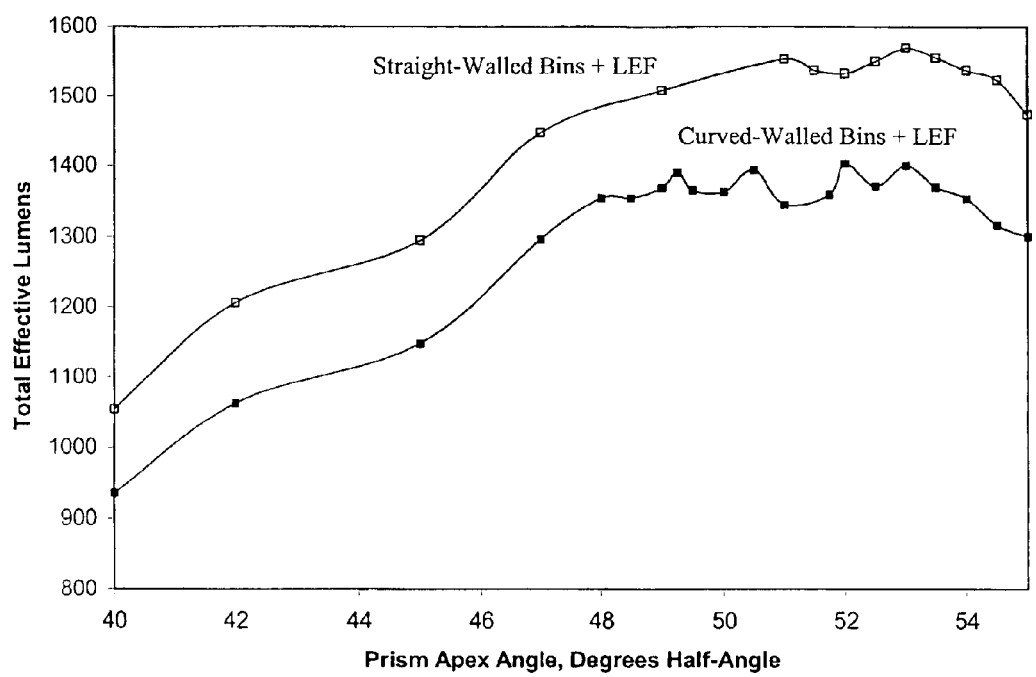
FIG. 14 represents graphical results in total effective lumens of two types of LED light source array structures, one having straight-walled bins and one having curved wall bins, both as a function of prism sheet apex angle.

FIG. 14 shows, under these conditions, that the performance of the straight-walled bins exceeds that of the deeper curved-wall bins by about 12%, throughout the range of prism angles considered. While there may be more advantageous combinations of curved-wall bins and prism sheets for other applications, the use of straight-walled bins is preferred for the system of FIG. 13. This is convenient, as fabrication of shallower straight-walled bin arrays is easier than deeper, curved-wall bin arrays.

K. Re-Cycling and Re-Use of Optical Flux from LED-Filled Bin Arrays

Re-use of re-cycled LED output light from each bin in the array is fundamental to increasing efficiency in the instant inventions of FIGS. 1A–B, 2A–B, 3A–B, 5A–C and 11. Prism sheets 88 and 92 transmit output light from bins 82 only at certain allowed angles where ray trajectories though the two prism layers suffer no total internal reflections that return potential output light to the bins from whence they came. Generally speaking, total internal reflection returns affected rays backwards towards bin array 82 just as s-polarized light rays were made to return from reflections at reflective polarizer 84 in FIG. 11. While the polarization recycling mechanism of FIG. 11 successfully converts the blocked polarization state to the transmitted polarization state in a single round trip because of the actions of dielectric polarization conversion layer 86 and metallic polarization conversion layers 106 and 125, successful conversion of total internally reflected light rays, whether polarized or un-polarized, depends on there also being a means of angular randomization, such as the surface slope microstructure mentioned earlier.

Prior to examining the means of optical path randomization that facilitate most efficient re-use of re-cycled light rays, we introduce some additional re-cycling mechanisms and configurations.

L. Hemispherical Re-Cycling Mirrors in Pseudo-Kohler Angle Transforming Illumination Systems (as in FIGS. 15A–E and FIGS. 16A–D)

Hemispherical mirror 332 is added to the instant invention of FIG. 13 as in FIGS. 15A–E to collect and redirect high-angle light output such as 334 from LED light source array 300 that would otherwise have been wasted.

Figure 15A:
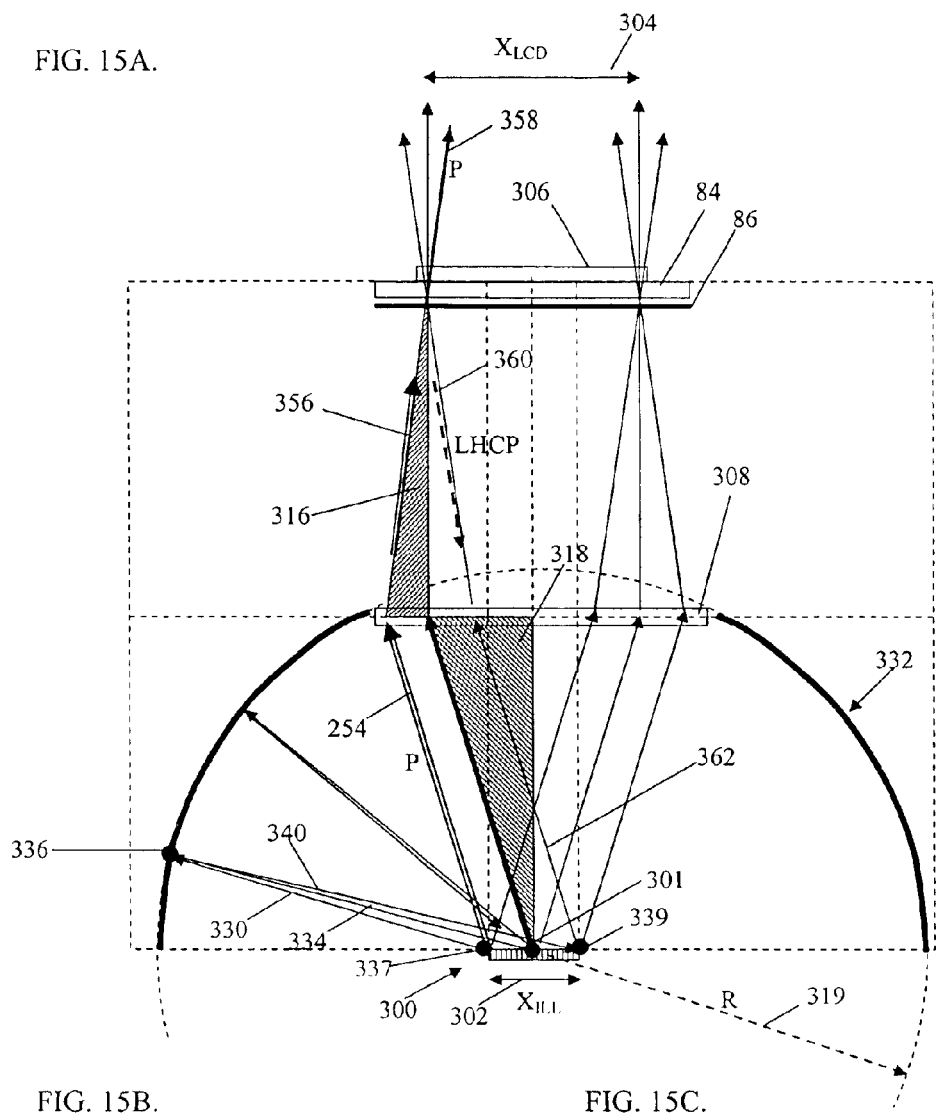
FIG. 15A is a schematic cross-section illustrating geometry and ray paths for the optical system of FIG. 13 combined with a hemispherical light-recycling reflector.
Figure 15B:
FIG. 15B shows in a magnified cross-sectional view the type of LED bin array as illustrated in FIGS. 3A–B that can be used in the system of FIG. 15A without optical over layers.
Figure 15C:
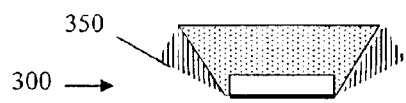
FIG. 15C shows a single LED bin that can be used in the system of FIG. 15A without optical over layers.
Figure 15D:
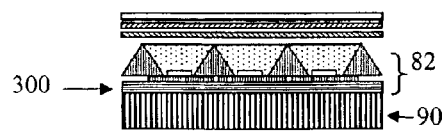
FIG. 15D shows the type of LED bin array illustrated in FIGS. 3A–B that can be used in the system of FIG. 15A with the addition of optical over layers.
Figure 15E:
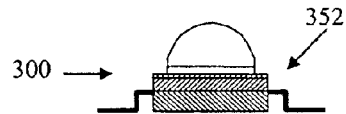
FIG. 15E shows a graphic illustration one type of commercially available LED package structure that can be used singly or in a tight array within the system represented in FIG. 15A.

The focal point of sphere 332 lies at its center of curvature, point 301 in FIG. 15A. Any light emanating from (or near) this point 301 that strikes the sphere's inside reflective surface, returns to (or near) the center point 301 from whence it came. Hence, the reflecting sphere (or in this case, reflecting hemisphere) functions as a recycler of light emanating from the vicinity of its center.

The pseudo-Kohler angle transformation system of FIG. 13 only processes light rays passing through the physical aperture of condensing element 308 like illustrative ray 354. Higher angle rays like 334, 338 and 355 which travel beyond this aperture, are lost from use. Hemisphere 332 provides a means for recovering them reflectively. Consider illustrative high-angle ray 334 originating approximately from the geometric center of LED array 300's output aperture 302. Since focal point 301 of hemispherical mirror 332 is positioned at this point 302, wide-angle rays like 338 are reflectively returned back along their original out-going path. As another example of this return mechanism, consider LED output ray 338 leaving left hand edge-point 337 of LED light source array 300. Ray 338 reaches hemispherical mirror 332 at its inside point 336, and returns after reflection along a geometrically predictable if not exactly identical optical path, to light source 300 at its corresponding right hand edge point 339. Only slope errors on mirror surface 332 interfere with precise optical return within array source 300.

The symmetrical geometry described by rays 334, 338 and 340 dictate that out-going ray 338 from a left edge bin in array source 300 a specific distance, $X_{ILL}/2$ from light source center point 301, returns as ray 340 to an edge bin on the opposite edge of the array, an equal distance from the array's center point. This geometry is true for paraxial rays such as those illustrated in FIG. 15A, as well as the more complicated out-of-plane skew rays.

Figure 16A:
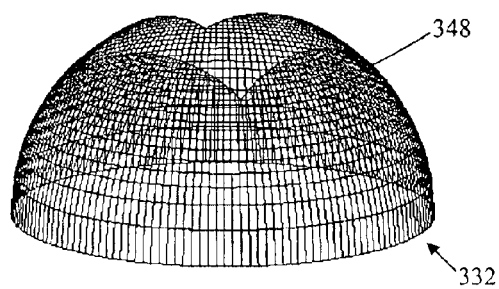
FIG. 16A shows a perspective view of the hemispherical reflector sidewall as represented in FIG. 15A.
Figure 16B:
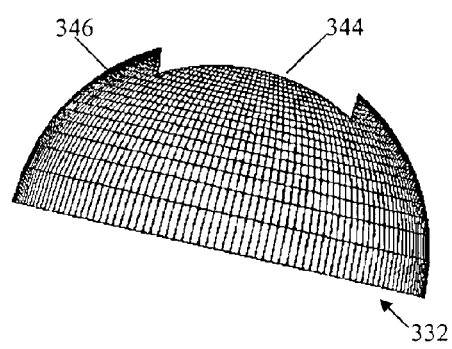
FIG. 16B shows a side view of the hemispherical reflector sidewall as represented in FIG. 15A.
Figure 16C:
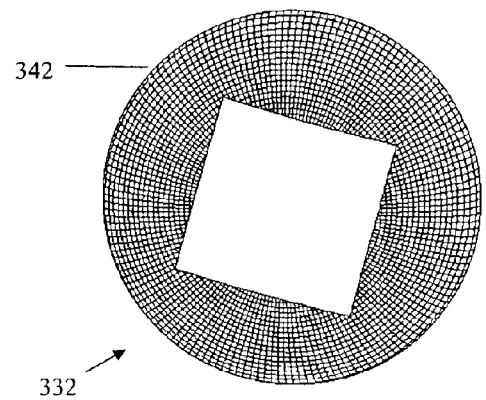
FIG. 16C shows a top view of the hemispherical reflector sidewall as represented in FIG. 15A.
Figure 16D:
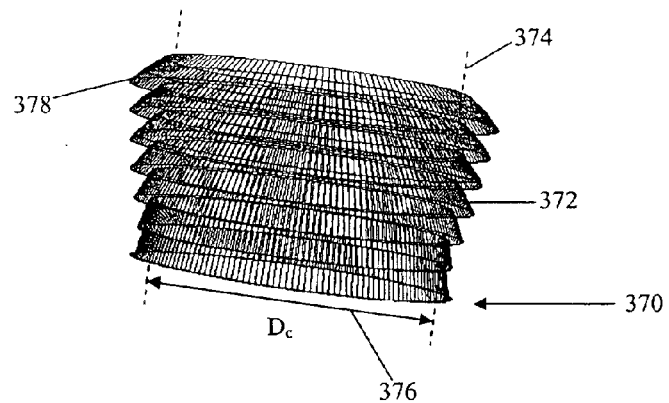
FIG. 16D shows a perspective side view of an alternative cylindrically segmented hemispherical reflector that can be used in the system represented in FIG. 15A.

FIGS. 16A–D show four different perspective views 340 of hemispherical mirror 332 in wire-frame style. Top-view 342 (FIG. 16C) shows the square aperture cutout required for condensing lens 308 and the passage of all effective output rays. Side view 346 (FIG. 16B) shows the effect that square cutout 344 has on the mirror's surface area. Perspective views in FIGS. 16A and 16D show the effective mirror surface more clearly. Nominal mirror radius, R, 319, is chosen by the geometry of triangle 318 in FIGS. 13 and 15A as being $R=FL/\cos\theta_{ILL}$.

Light source 300 as depicted most generally by symbolic cross-sections in FIGS. 15B–E, can be any one of a number of square, rectangular or circular light source emitting apertures. Some, but not all, practical examples include the flat-walled (or curved-wall) bin arrays of FIGS. 3A–B and 5A–C combined with lower and upper prism sheets as 90 in the present invention, the flat-walled (or curved-wall) bin array 82 used alone in the present invention, an individual flat-walled (or curved-wall) bin 350 (including the case, not illustrated, of lower and upper prism sheets) of the present invention, and/or one or more of the commercially-available discretely packaged LEDs 352, such as manufactured by LumiLeds under the trade name Luxeon. For highest output applications, light sources that are structured as 82, 90 and 350 are preferred as structures maximizing lumens per mm$^2$.

M. Fresnel-Type Hemispherical Re-Cycling Mirrors in Pseudo-Kohler Angle Transforming Illumination Systems (as in FIGS. 17–18)

Figure 17:
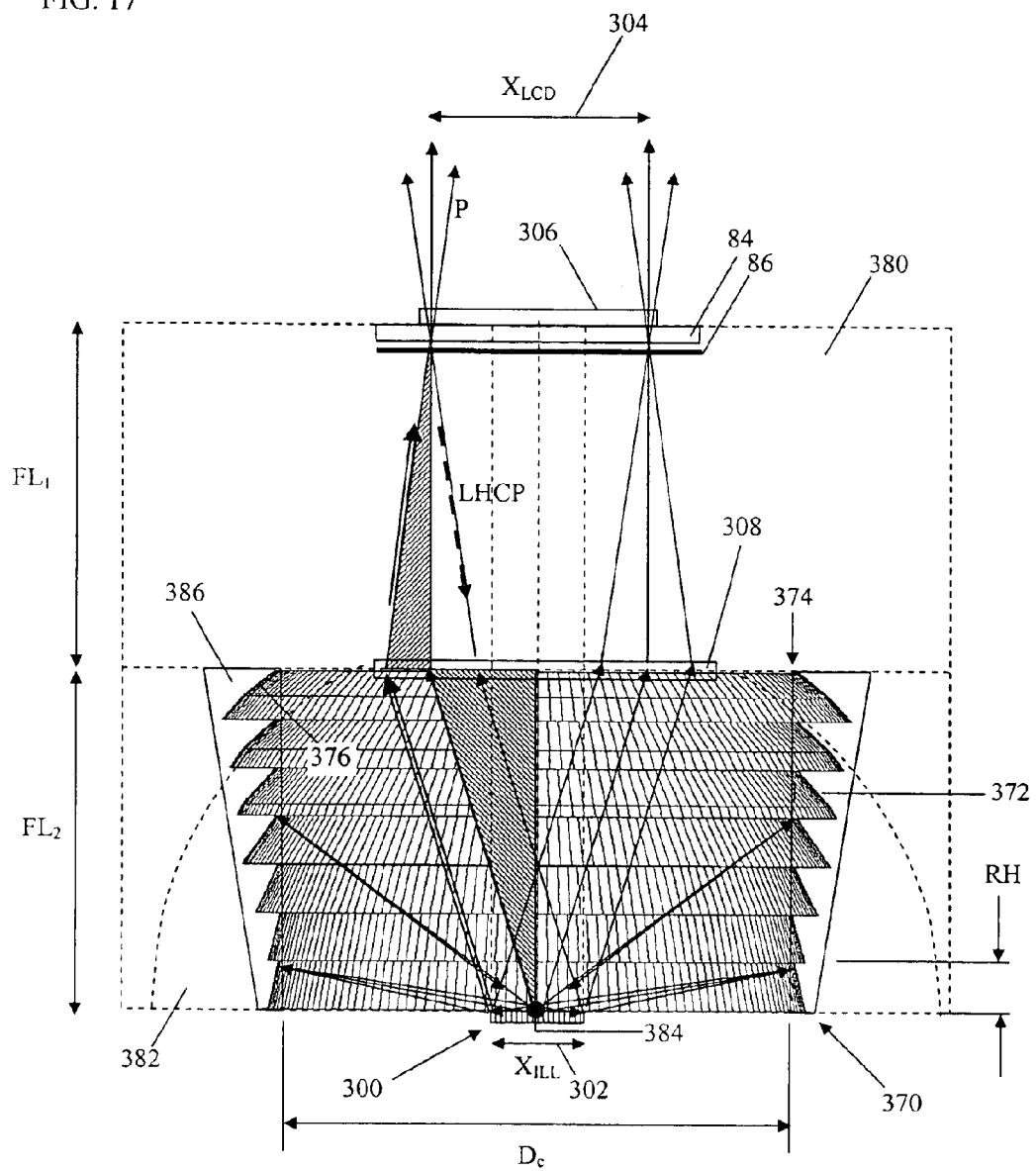
FIG. 17 shows a schematic cross-section of the cylindrically segmented hemispherical reflector shown in FIG. 16D as used in the system represented in FIG. 15A.

A more compact and spatially efficient form of hemispherical re-cycling mirror 332 as used in FIGS. 15A and 16A–C is shown in wire-frame perspective 370 in FIG. 16D and in system cross-section in FIG. 17. In this form of the invention, hemispherical re-cycling mirror 332 of FIGS. 16A–C is cut into n hemispherical slices such as for example, 4$^{th}$ slice 372 in FIGS. 16D and 17. Cutting these slices is akin to making a pseudo-cylindrical Fresnel-type mirror. One of many possible design methods used to construct the form of ringed reflective element 374 is to constrain the imaginary inside diameter $D_c$, 376, of a cylindrical tube as being that of the bounding circle surrounding condenser element 308's spatial outline 344 (as in FIG. 16D and FIG. 17). In this case, the inside facets 376 of what is to be a cylindrically faceted reflecting tube, contain thin highly reflecting front-surface metallic coatings (such as enhanced aluminum or protected silver).

One possible example of the instant invention is the 7-ring mirror design with pseudo Fresnel facet angles as shown in the cross-section of FIG. 17. Rather than using a single hemispherical radius value for each ring, as would more normally be the case with a standard Fresnel design, the facet radius is set at a different value for each succeeding ring. Either way, an appropriate Fresnel-type hemispherical reflective re-cycling tube results, as in FIG. 17.

The 7-ring configuration of FIG. 17 is developed along the following geometric arguments. Meridian edge lengths for condenser lens 308 are taken as CLX and CLY, with diagonal length CLD determined by geometry. For simplicity, each ring 372 is given an equal ring height, RH. LED illuminator array 300 is considered with equal X and Y meridian edge lengths, XILL. The upper and lower focal lengths FL1 and FL2 of condenser lens 308 have values in the instant invention that depend on the media in regions 380 and 382 (equal media, equal values), the aperture size of imaging device 306, and the physical space needed between imaging device 306 and condenser lens 308. As a starting point, the center of curvature for each ring section is located at center-point 384 of light source aperture 300. Other focal points, or a different focal point for each section may be considered as well as a means of fine-tuning the re-cycling distribution. Inside tube diameter 374 is made no smaller than the condenser lens's diagonal length CLD. The radius, $R_N$, for each n$^{th}$ ring section in this illustrative construct, N being equal 1 to 7, is given in equation 6.

$$R_n = \sqrt{((N)(RH))^2 + (CLD)^2} \qquad (6)$$

One low profile supporting tube shape for the 7 ring sections is shown in trapezoidal cross-section 386. Such a supporting shape or substrate for the reflecting rings becomes slimmer as the number of ring sections increase. The entire structure 370 can be molded in plastic sections (halves or thirds), and then snapped together, or molded completely using a dynamic injection mold to permit extraction of the otherwise captured molded part. If, as one numerical example, $X_{LCD}$ is 24.384 mm, $FL_1$ is 39.54 mm and filled with a medium of refractive index 1.49, $FL_2$ is 26.21 mm in air, $X_{ILL}$ is 12 mm, then $CL_X$ is 35.54 mm, $CL_Y$ is 29.46 mm, $CL_D$ is 46.16 mm, and for 6 mm ring section height RH, the successive ring radii are 46.54, 47.69, 49.55, 52.03, 55.05, 58.54, and 62.41 respectively.

Figure 18:
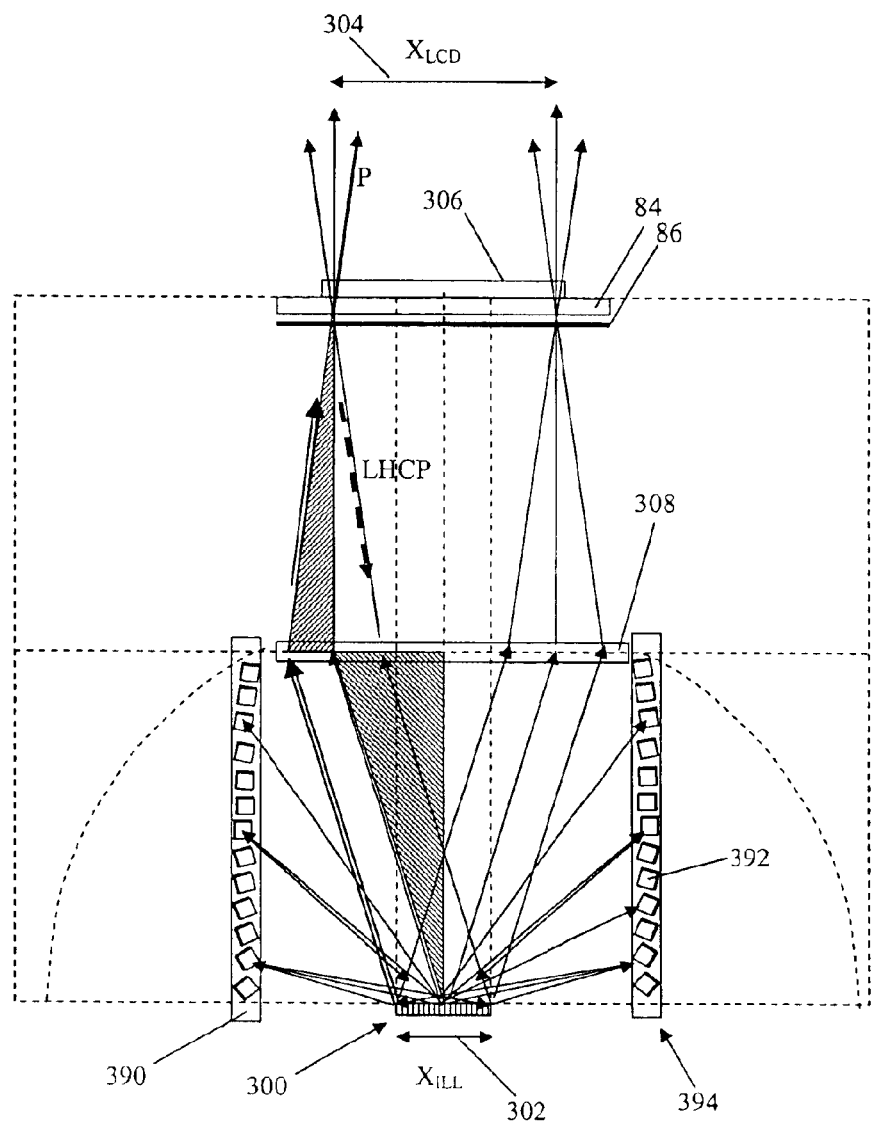
FIG. 18 is a schematic cross-section illustrating geometry and ray paths for the optical system of FIG. 13 combined with a corner-cube-based light-recycling reflector.

FIG. 18 shows an analogous if fundamentally different reflective re-cycling structure also disposed about the interior rings of an essentially cylindrical form 390. In this related construct of the instant invention each of the illustrative 13 ring sections contain a circular array of corner cube reflectors such as 392 whose optimum pointing direction has been aimed so that the ray bundle within each corner cube's aperture is retro-reflected generally back along the direction of incidence. This requires separate aiming of the corner cubes in each successive cylindrical ring section.

N. Factors Affecting Efficient Re-Use of Re-Cycled Light

Whether the re-cycling of light from light source 300 is caused by total internal reflections within prism sheets 88 and 92, reflection from hemispherical reflector 392, reflection from the ringed facets of Fresnel-type hemispherical reflector 370, the return light from corner cube type retro-reflector 394, or any equivalent form of return, the light ray directions that so return to the interior of source 300 from whence they came are in the wrong angular directions for subsequent re-transmission as usable incremental output. Unless a means exists within light source 300, is artificially provided within or external to light source 300, to change the out-going angular directions of light returned, there can be no net increase in the total light output of the systems of FIGS. 3A–B, 5A–C, 11, 13, 15A–E, 17, or 18. For there to be a net output light increase, some angle-changing mechanism needs to be introduced. The collective optical light paths of returning light must net a sufficiently large change in angular direction so that transmission through condenser element 308 is permitted.

One potential angle-changing means that can be invoked is the re-passage of return light through the physical structure of light source 300, including all reflections, refractions and diffractions involved. In this case, the light source arrays reflecting bins serve as randomizing cavities. Since the return path of recycled is not exactly the same as the original output path, return to light source 300 typically takes place with a spatial offset from the point of origin. Because of this spatial offset, the net effect on output angle of recycling through light source 300 can be quite different. Ray 338 in FIG. 15A originated within a reflecting cavity on the left hand side of the array, but returned as ray 340 to a reflecting cavity on the right hand edge.

Despite this spatial offset, the collective change in angular direction must be large enough that the re-cycled output light passes through prism sheets 88 and 92 if present, in such a way that the ultimate output transmission occurs somewhere within the aperture of condenser lens 308. The chances for favorable angular conversion are encouraged in the following ways.

Figure 19A:
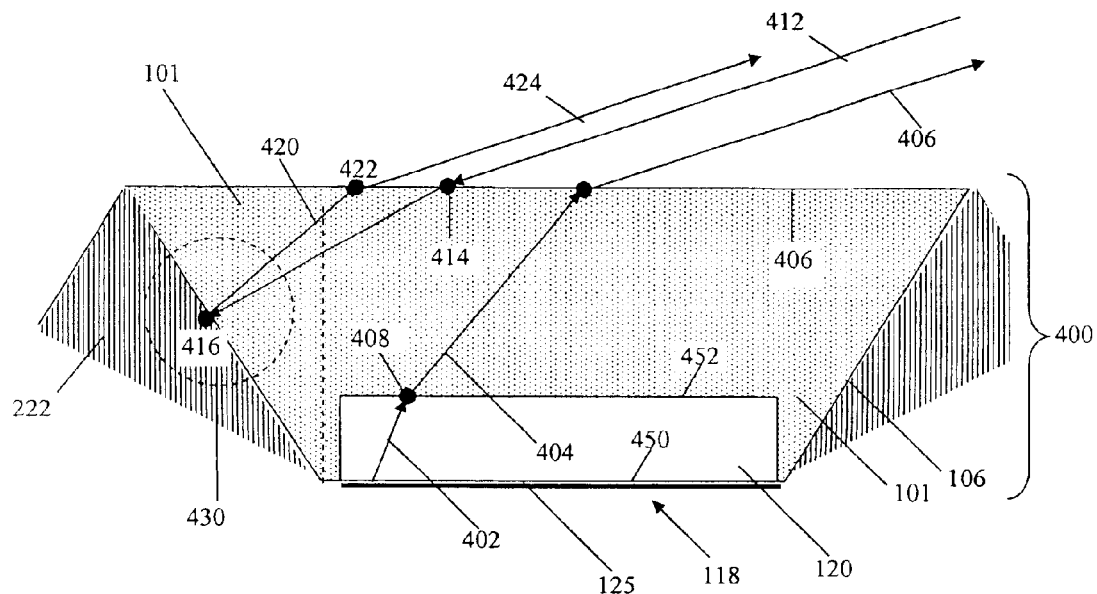
FIG. 19A is the schematic cross-section of a single tapered reflecting bin with constituent LED chip showing illustrative optical ray paths for LED emission and the behavior of incoming light rays.
Figure 19B:
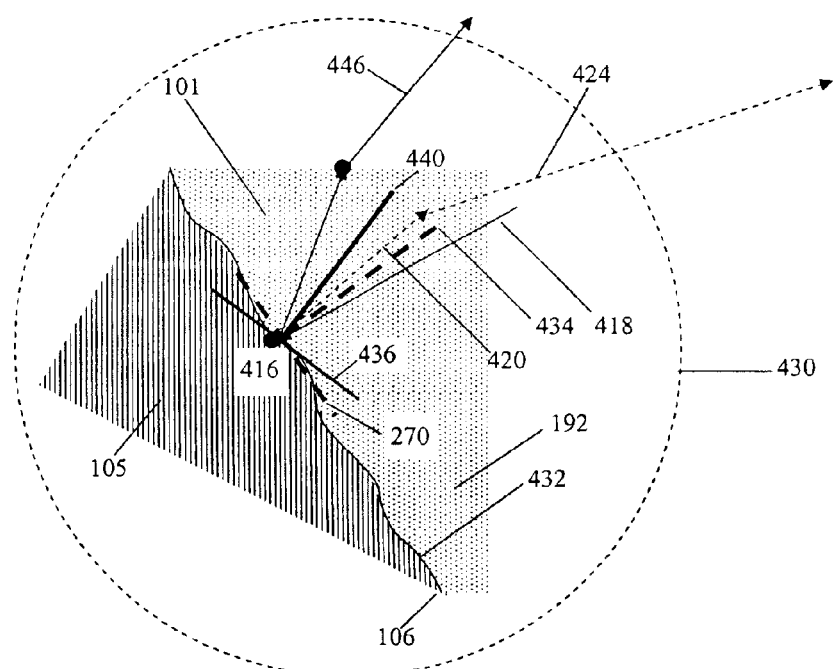
FIG. 19B shows a magnified view of the tapered reflecting sidewall's surface flatness as represented in the schematic of FIG. 19A.

FIGS. 19A–B show the basic schematic cross-section of one illustrative LED-containing bin element 400 within the instant invention including bin array layer 82 (FIG. 19B showing a magnified portion of the bin sidewall). This same general structure appears in FIGS. 3A–B, 5A–D and 11, as well as within the generalized light source 300 of FIGS. 13, 15A–E, 17 and 18. All major surfaces (and interfaces) shown in cross-section 400 have been drawn with smooth and regular specularly-reflecting surfaces, smooth and regular refracting interfaces. Under these pristine circumstances the path of emitted ray 402 is completely deterministic. Ray 402 passes though sapphire substrate 125, optical encapsulating medium 101 as ray 404, and then outwards as ray 406 into the medium above bin 400 (typically air). Perfect Snell's law refraction occurs at points 408 and 410, the substrate/fill medium boundary and fill medium/air boundary respectively. Upon reflective return via the reflective re-cycling mechanisms described above, corrected in energy by the losses due to each reflection, this ray returns displaced some distance from its out-going trajectory 406, as ray 412. The return location of this particular trajectory is only approximate, and just for illustration purposes. Nevertheless, it can be seen that despite refractions and points 414 and 422 and reflection at point 416, ray path segments 412, 418, and 420, at least in this case, do not result in a substantial output ray 424 direction different than incoming return ray trajectory 412. For as long as this situation remains so, and for however many return cycles there are between bin 400 (or any neighboring bins 400), there will be no effective net contribution to the system's useful output light.

Changing the course of this outcome requires introduction of structural randomness.

O. Structural Randomness and Recycling Efficiency (as in FIGS. 20 and 21A–E)

One form of structural randomness is generated by encouraging the presence of continuous surface slope errors 432 about the average surface slope, as in FIG. 19B detail 430 (showing just one of several possible highly magnified examples, the rippled micro surface on bin sidewall 106). Such slope errors, generally no greater than about +/–5 degrees, often occur naturally as macro or micro imperfections created during surface formation. Such micro features can be introduced deliberately. In either case, the effect on recycled light illustrated in FIGS. 19A–B operates in combination with ordinary reflections and refractions to increase the net change in angular re-direction. Such surface imperfections are explicitly distinguished from the rougher and more abrupt surface imperfections that scatter light rays over a +/–90 degree angular range. While scattering surfaces increase chances for successful angular conversions, they also can prevent otherwise successful output rays from escaping in the first place.

Non-scattering microstructures are the gentle depressions or dimples in surface slope brought about by physical surface deformations caused by impingement of spherical particles. One process for accomplishing this is known as liquid honing wherein spherical particles are contained within a liquid flow. Another means for this is the machining (or gentle etching) of surface relief patterns into the sidewalls 127 of form tool 128 as in FIG. 4B. Such patterns made in the forming tool, are transferred to the molded or embossed part FIG. 4A.

One example of the effect of structural randomness is given by the behavior of illustrative return ray 418 as shown in FIG. 19B, detail 430. This incoming return ray 418 reflects from the flat average surface at point 416 about surface normal 434. Dotted ray trajectories 420 and 424 represent the normal optical path were the surface flat, as shown in the top view. When the local microstructure at point 416 results in surface normal 440 tilting by 5 or more degrees with respect to original surface normal 434, reflected ray 442 and its reflected output component 446 are themselves tilted by an equivalent amount, in this case, closer to the preferable output direction.

The more (high-efficiency) surface reflections and refractions a return ray makes during its travels through bin 400, the more deviated the resulting output ray can become from its otherwise idealized trajectory.

A degree of angle changing on critical optical interfaces increases the percentage of re-use possible. As a result, one group of rays will return further outside the preferred output acceptance range, while another group will return closer to, or within, the preferred acceptance range. As with the earlier system performance analyses of FIGS. 7–10 and 12, predicting the magnitude of such net improvement requires either direct experimentation, which is cumbersome and expensive, or the equally predictive realistic computer model described above. Skew rays and the chances for multiple reflections and refractions complicate analytical predictions.

Angle-changing microstructures can be applied with similar (or greater) benefit to media/air interface 406, sapphire interfaces 450 and 452, and the LED's reflective return mirror 125.

Figure 20:
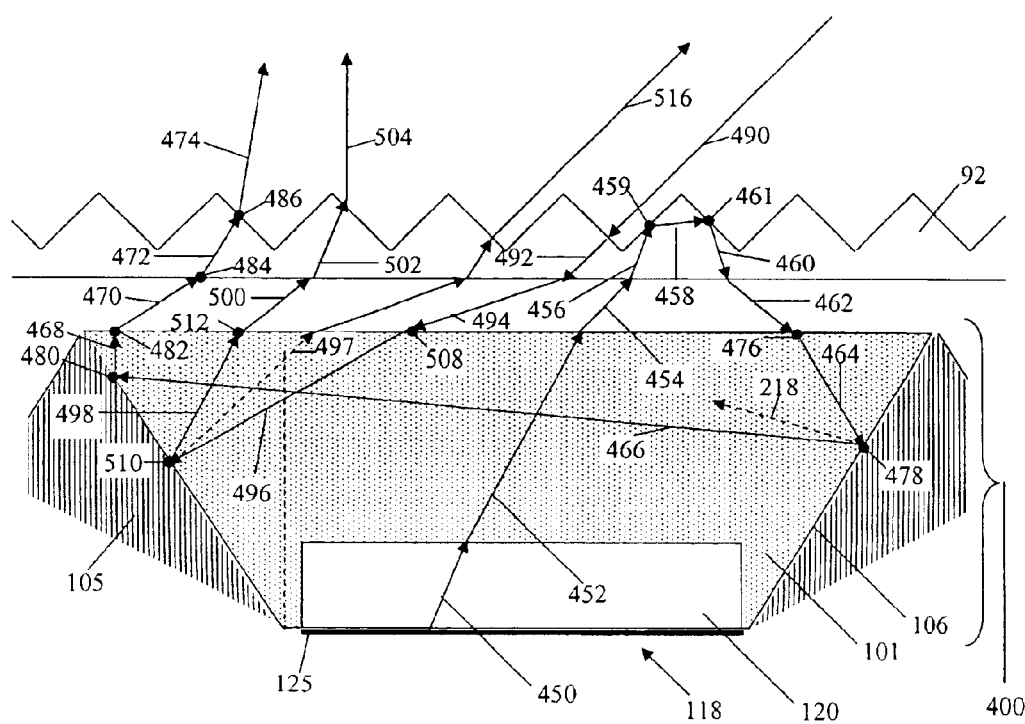
FIG. 20 is the schematic cross-section of a single tapered reflecting bin with constituent LED showing the geometrical effects of refraction by a single prism sheet elevated above, with illustrative optical ray paths shown both for LED emission and an incoming light ray.

FIG. 20 shows another schematic cross-section of bin 400, this time illustrating the angle changing effects as they occur in conjunction with lower prism sheet 92. By virtue of microstructure applied on bin sidewalls 106 (and potentially on the bin medium's interface with air), combined with the angle-changing action of the prism sheet, a ray's return trajectory, otherwise blocked by total internal reflection within a prism, can be converted to one that achieves output. Some converted output rays will add to those already within the preferred angular range (i.e. that which passes through the aperture of condenser element 308). The same will be true of prism sheet output rays that exist outside the preferred angular range, and that return to the aperture of bin 400, or any neighboring bin 400, by the retro or hemispherical reflection described previously.

One example of this particular return mechanism is illustrated in FIG. 20 by the behavior of sequential ray segments 450, 452, 454, 456, 458, 460, 462, 464, 466, 468, 470, 472, and 474. On this particular optical path starting within LED 118, which may have directional components into (or out from) the plane of the drawing, is such that the trajectory of ray segment 456 forces an angle with the normal to the prism facet at point exceeding the critical angle for the prism's dielectric media. Reflected ray segment 458 therefore travels across the prism element and strikes the opposing facet at point 461, where it also exceeds the critical angle, thereby producing total internally reflected ray segment 460 whose direction is substantially backwards into the bin and LED from which it came. By this return process, emitted LED ray 450 fails on its first pass to become part of the system's useful output light, but gets another chance, as the ray continues to reflect and refract within bin 400 via segments 462, 464, 466, 468, 470, 472, and 474. This optical path involves refractions at bin points 476 and 482, refraction at prism sheet substrate surface point 484 and reflections at bin sidewall points 478 and 480. The result of this is that prism sheet output ray 474 transmits as output within preferred angular range, and thus adds incrementally to the total useful output.

Without prism sheet 92, and the multiple return reflections and refractions, the original LED output ray segments 450, 452 and finally 454 would have remained outside the preferred angular range.

FIG. 20 further illustrates the system's collective effect on a generalized external return ray 490, which is presumed to have reflected back from, for example, a reflecting facet of the Fresnel-type hemispherical recycling mirror 370 as in FIG. 17. Relatively high angle ray 490 traces back through the system of FIG. 20 along ray segments 493, 494, 496, 498, 500, 502, and finally as output segment 504. This is just one of many possible ray trajectory examples of this type. Without spatially varied surface microstructure introduced at point 510, ray segment 496 would have reflected along dotted trajectory segment 497, which would have continued outwards along dotted path segments 512, 514, and 516, path 516 heading well outside the preferred angular output range, and not substantially improved over the angular direction of incoming return segment 490. As a result of the surface microstructure at point 510, the actual outgoing ray path segments are successively 498, 500 502 and 504, ray segment 504 heading out well within the preferred angular range.

The microstructure developed along bin sidewalls 106 may be any geometry that spatially varies the local surface slope, such as to mention a few, spherical bumps, spherical depressions, sinusoidal oscillations, prismatic growths, prismatic depressions diffraction gratings. Generally, diffuse scattering type surface textures are to be avoided in favor of specularly reflecting or diffractive surface textures with smooth or predictable variations in surface slope.

Figure 21A:
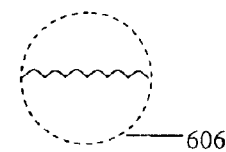
FIG. 21A shows a magnified cross-sectional view of a triangularly rippled surface boundary between the transparent dielectric fill and air within the output aperture of a micro-reflecting bin such as that shown in FIG. 20.
Figure 21B:
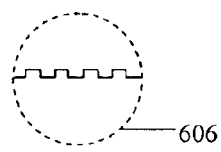
FIG. 21B shows another magnified cross-sectional view of a rib-like rippled surface boundary between the transparent dielectric fill and air within the output aperture of a micro-reflecting bin such as that shown in FIG. 20.
Figure 21C:
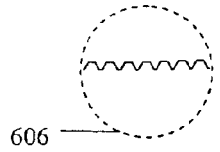
FIG. 21C shows yet another magnified cross-sectional view of a cylindrically or spherically rippled surface boundary between the transparent dielectric fill and air within the output aperture of a micro-reflecting bin such as that shown in FIG. 20.
Figure 21D:
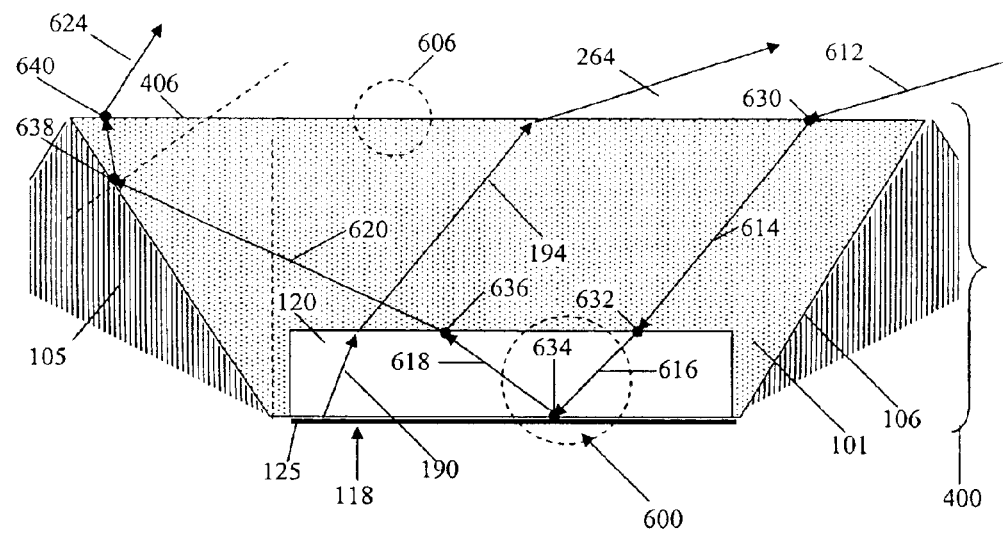
FIG. 21D is the schematic cross-section of a single tapered reflecting bin with constituent LED chip showing illustrative optical ray paths for LED emission and an incoming light rays as affected by the existence of rippled surface structures.
Figure 21E:
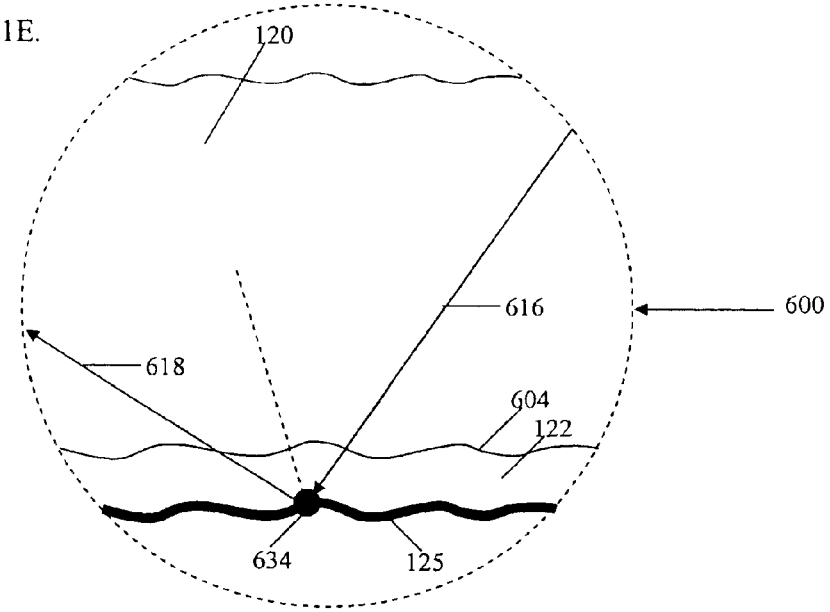
FIG. 21E is the magnified schematic cross-section of a single tapered reflecting bin with constituent LED chip in the vicinity of the LED showing illustrative optical ray paths for LED emission and an incoming light rays as affected by the existence of rippled surface structures of the LED's epitaxial layer, metallic reflecting electrodes and supporting substrate.

Similar spatially varying surface modifications are useful on each of the other material interfaces within bin or bins 300, such as shown in the schematic cross-section of FIGS. 21A–E. Detail 600 in FIG. 21E shows a magnification of LED 118 and its integral layers as sketched in FIG. 6. Transparent LED substrate 120 (sapphire in present flip-chip technology) has upper plane surface 602 and lower plane surface 604. Either or both of these surfaces may be altered so as to contain, either intrinsically or deliberately, non-scattering and continuously varying microstructure, such as the spherically rippled (or dimpled) structure illustrated. As long as the microstructure depth is sufficiently less than the thickness of the epitaxial layers themselves (about a micron or so), and the structural period more than several microns or so, epitaxial LED device layers 122 may grow in conformance with the surface slope variations on lower substrate surface 604. In this manner, metal electrode mirror 125 will also conform to the surface pattern.

Surface microstructures may also be formed at bin 300's dielectric-air interface 604 as shown in the magnified details 606 in FIGS. 21A–C respectively. Among the many possible microstructures contributing spatially varying refraction angles are the spherical lenslets shown in FIG. 21C (alternately spherical depressions), mesas or ribs as in FIG. 21B, and prismatic or pyramidal structures as in FIG. 21A.

One ray path example illustrating the combined effect of these additional microstructures is also shown in FIGS. 21D–E, starting with high-angle return ray 612. As this ray passes back through the bin structure, it encounters potential direction altering mechanisms at points 630, 632, 634, 636, 638 and 640. The collective result is that recycled output ray 624 has been made significantly different that than of incoming ray 612.

Figure 22A:
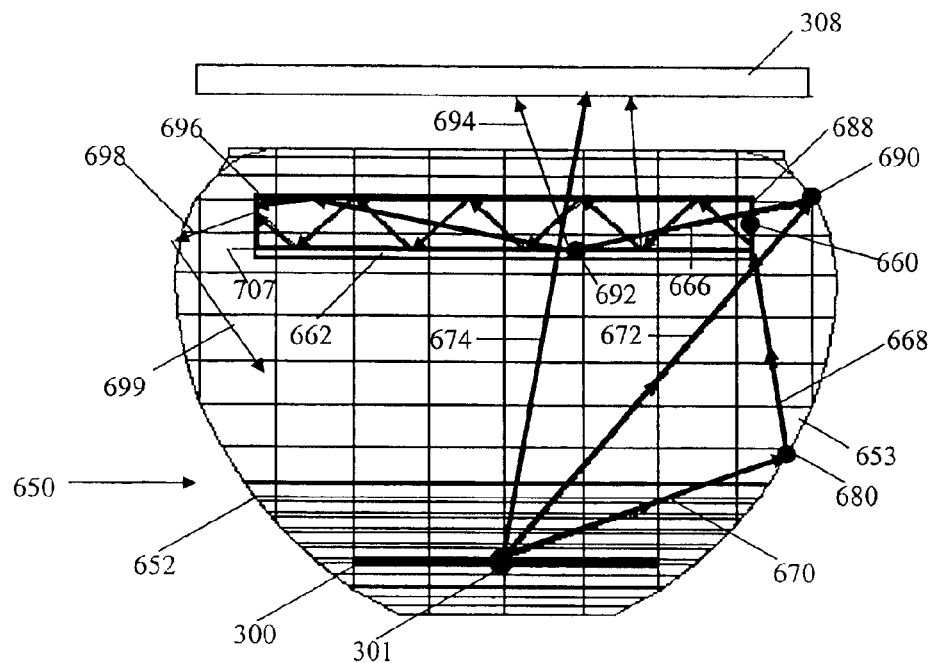
FIG. 22A is a schematic cross-section of an optical system combining the LED light source array of FIGS. 3A–B and 5A–C with a secondary angle transforming element, a structured light pipe plate and a four-sided elliptical reflector.
Figure 22B:
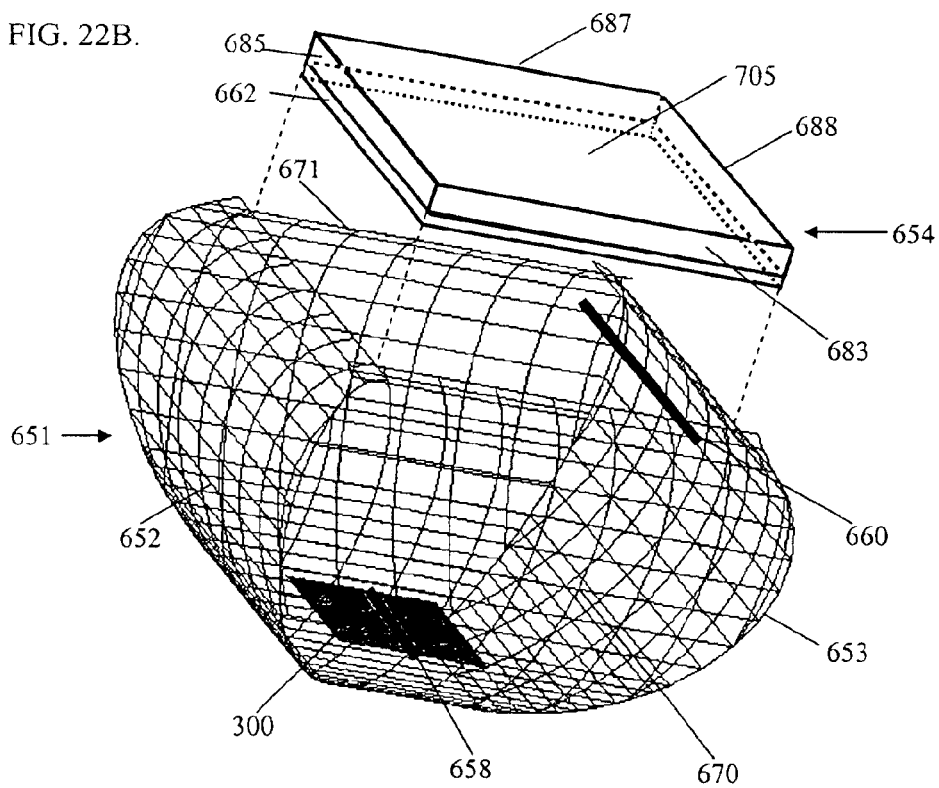
FIG. 22B is the associated perspective view of the schematic cross-section shown in FIG. 22A.

P. Angle Re-Cycling with External Re-Use (FIGS. 22A–B)

In some applications of the instant invention there is advantage in spatially separating the re-use of re-cycled light from angle changing mechanisms brought about previously within the bins of bin array 300 themselves. Such mechanistic separation is possible, as in FIGS. 22A–B, by adding an external angle-changing optical system 650 between light source array 300 and condensing element 308 of FIGS. 15A, 17, and 18. One of two cooperating external elements, mirror 650, is used to collect (and then redirect) high angle light rays from light source array 300 that would otherwise miss the input aperture of condensing element 308. The cooperating optical element, light pipe 654 with angle changing optical layer 662, is arranged above array source 300, so that it transmits the source's narrow angle output light with minimum optical effect, while simultaneously processing any wider-angle light that is deliberately coupled into it. Optical layer 662 is configured to transmit reasonably collimated light, such as ray 664, without a substantial change in direction. Layer 662, however, is configured to behave much differently for more obliquely directed light such as ray 666.

Q. Collection and Recycling by Means of Elliptical Troughs (as in FIGS. 22A–B and FIGS. 23A–B)

This light collecting and redirecting means consists of two sets of opposing elliptical reflecting troughs, 652 and 653 plus 670 and 671, arranged in the form of a 4-sided reflecting box made with internally reflecting sidewalls. Each of the four elliptical troughs have two focal lines apiece, one generally in the output plane of light source array 300, and the conjugate one position at or near an edge of light pipe 654. With regard to elliptical trough 653, the two focal lines are shown as 658 and 660. The focal lines appear as points in the cross-section of FIG. 22A, and as lines in the perspective view of detail 651 in FIG. 22B. Focal line 658, for example, is positioned at or near a central portion of light source array 300 (for example, the line through center point 301) while the other focal line 660 is positioned at or near one parallel end face (or edge) of optical light pipe element 654, as shown. (Note, elliptical curves have two related focal points, but elliptical troughs have two related focal lines.) In this manner, all light emanating from light source array 300 at or near the line running through its center point 301 is collected by focal line 658 and coupled via reflecting surface 653 efficiently through corresponding focal line 660 into light pipe 654.

This collection and re-direction behavior is also traced by several illustrative rays 670, 672 and 674 all of which leave light source array 300 from the vicinity of its center point 301 at high enough angles that they were destined to miss the entrance aperture of condensing element 308. The ray paths shown in FIG. 22A are those actually traced by the aforementioned computer model, and the shapes depicted in FIGS. 22A–B are those actually developed by the computer model. Ray 670 propagates towards elliptical trough 653 and reaches it at point 680, whereupon it is reflected towards corresponding focal line 660 as ray 668. Whether ray 668 passes exactly through focal line 660 depends on the exact location of its point of origin within the output aperture of light source array 300. This particular illustrative ray path 668 actually just misses mathematical focal line 660, but still successfully enters light pipe 654 through its right hand edge-face 688, and subsequently makes numerous light pipe reflections by total internal reflection. The same behavior is exhibited by lower angle ray 672 that is reflected by element 653 at point 688 towards light pipe face 688 as ray 666. Ray 666 also makes total internal reflections within light pipe 654, but they are fewer in number than those resulting from more steeply angled ray 668.

Figure 23A:
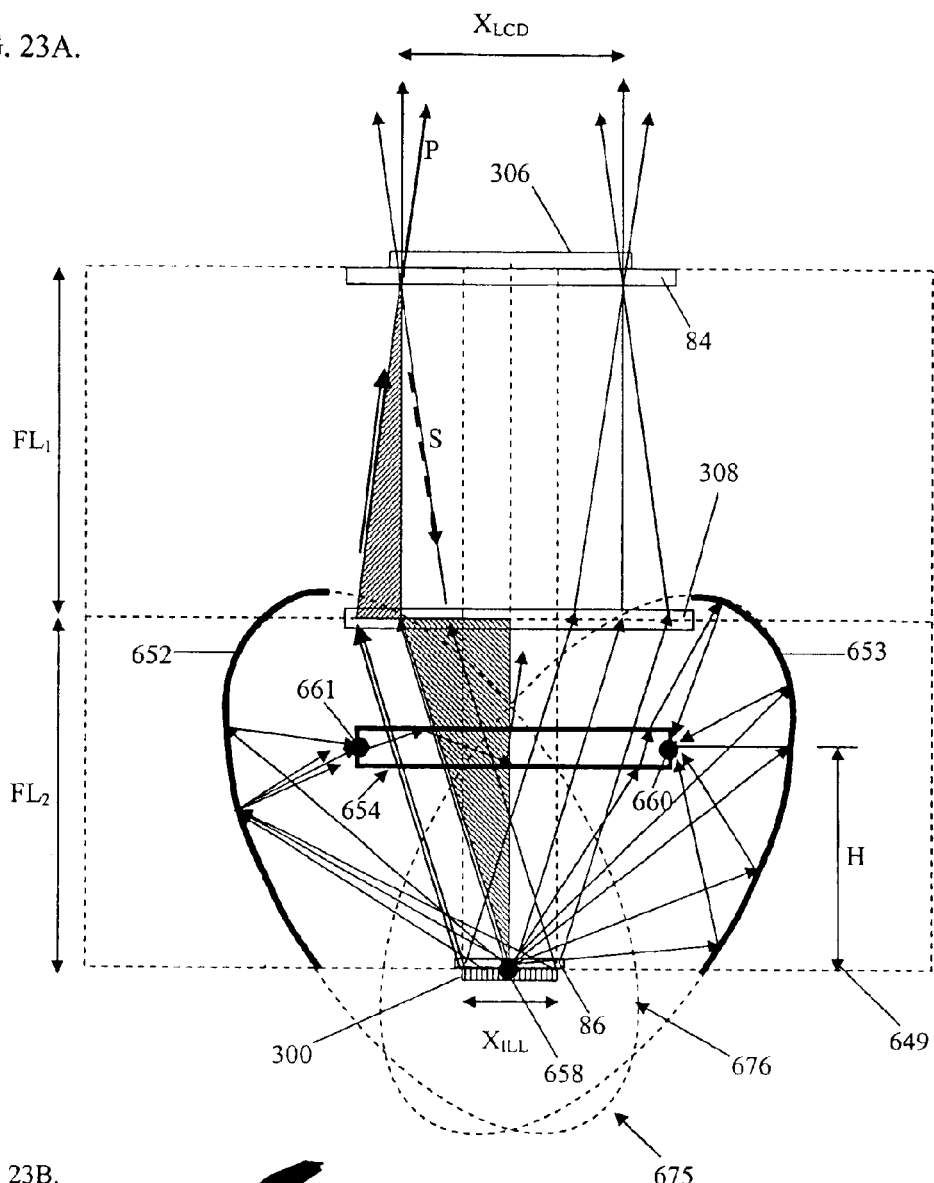
FIG. 23A is a more detailed schematic cross-section of the side view of the optical system represented in FIG. 22A–B showing its geometric positioning within the optical system of FIG. 13.
Figure 23B:
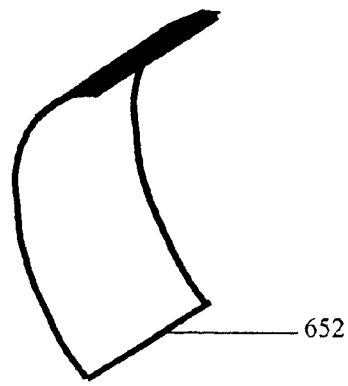
FIG. 23B is a perspective view of on of the mathematically shaped reflecting sidewalls shown in FIG. 23A.

FIGS. 23A–B provide a more descriptive cross-sectional view of the invention of FIGS. 22A–B showing its complete positioning within the projection system of FIG. 13. Opposing elliptical mirrors 652 and 653 are rendered as solid-lined segments of equivalently tilted ellipses 676 and 675. A perspective view of mirror 652 is added for clarity. Elliptical curves 675 and 676 have been rotated in the plane of the cross-section FIG. 23A about common their focal line 658, which has in turn, been made to lie in or near the output aperture plane of light source array 300. The degree of rotation between elliptical curves 675 and 676 is established by the coincidence of each secondary focus (660 and 661) with opposing edge faces (685 and 688) of light pipe 654. This coincidence depends geometrically on the elevation H of light pipe 654 above light source array 300. As in FIG. 13, the distances between planar light source 300, condensing element 308 and spatial light modulator 306 are set by the corresponding upper and lower focal lengths $FL_1$ and $FL_2$ (which are equal unless the refractive index of the corresponding media are different).

R. Re-Use and Recycling by Means of a Light Pipe (as in FIGS. 22–25)

None of the rays coupled to light pipe 654 through any of its four edge-faces (683, 685, 687 or 688) are able to enter the aperture of condensing element 308 without some cooperative out-coupling action by light pipe layer 662.

Figure 24A:
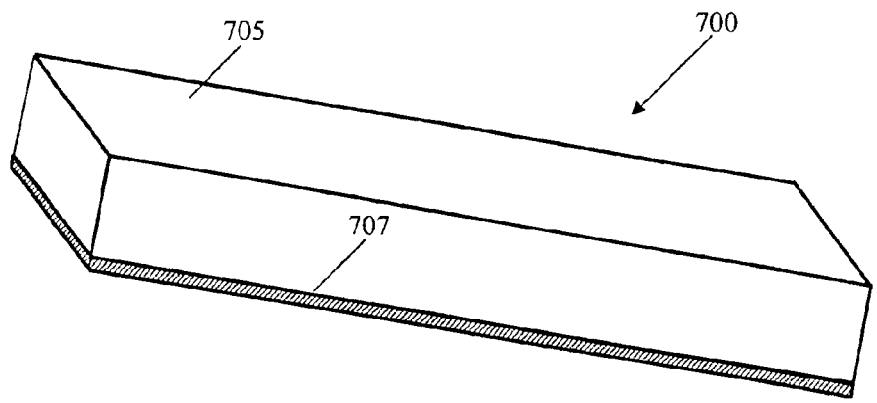
FIG. 24A is a perspective view of a slab-type structured light pipe plate.
Figure 24B:
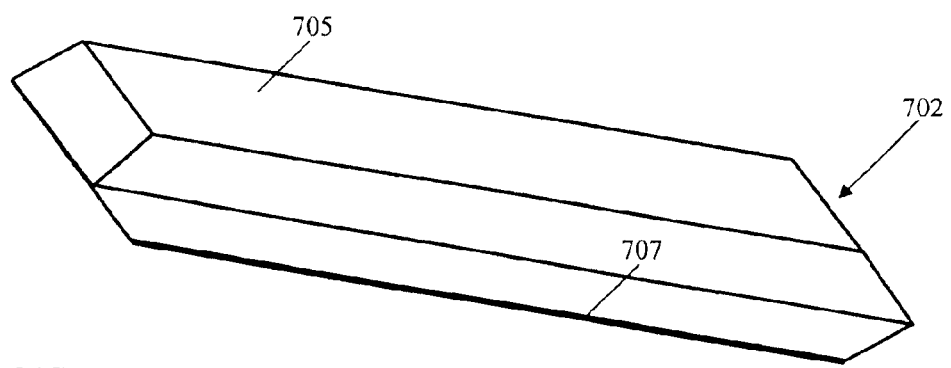
FIG. 24B is a perspective view of a light pipe plate with plane beveled end faces.
Figure 24C:
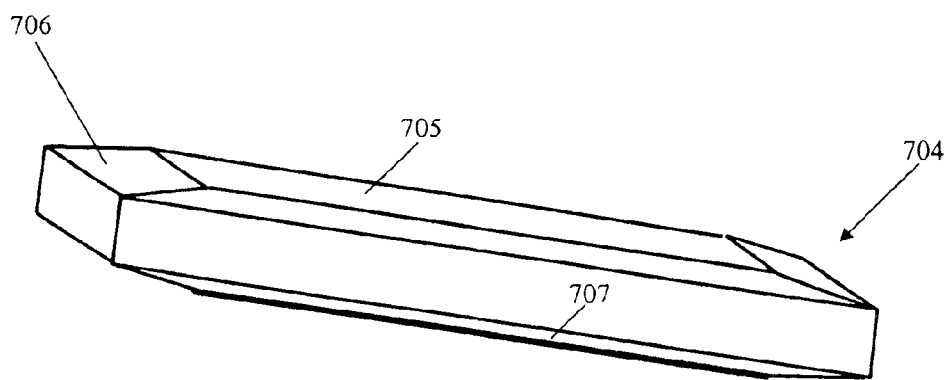
FIG. 24C is a perspective view of a light pipe plate with truncated plane beveled end faces.

Several preferable forms of light pipe 654 are shown schematically in FIGS. 24A–C, including slab 700 (FIG. 24A), slab with sharply beveled edge 702 (FIG. 24B), and slab with slowly tapered edge 704 (FIG. 24C). The slowly tapered edge 706 OF FIG. 24C may be configured as an ideal angle transformer, efficiently colleting up to +/−90-degrees of input light to the approximately +/−42 degrees appropriate for total internal reflection within a light pipe. Slab structures 700, 702 and 704 may include out-coupling layer 662 on either or both their upper or lower faces, while not within the region of their coupling edges.

Specifically, light pipe layer 662 is arranged, selectively, to counteract the light pipe's prevailing conditions of total internal reflection, and in doing so, re-direct otherwise trapped rays outwards from the light pipe and towards condensing element 308. One example of out-coupling layer 662 is represented schematically in FIG. 25, by means of light pipe cross-section 710 and illustrative surface layer magnifications 712 (cross-section) and 714 (perspective view). Illustratively, left hand input ray 714 enters light pipe 654 through face 685 and proceeds within ray segment 716, reaching layer 662 at region 712, whose cross-section is magnified in detail 718, and whose perspective view is magnified in detail 720. The behavior of ray segment 716 depends exactly where within layer 662 the ray travels. Two illustrative trajectories 722 and 724 are shown for generalized ray 714 and illustrative micro-surface 726. Illustrative ray segment 722 strikes surface 726 of layer 662 on flat facet 728 and continues by total internal reflection as ray segment 728. Illustrative ray segment 724 strikes surface 726 or layer 662 at tilted facet 730 and is total internally reflected more sharply upwards as continuing ray segment 732. Because tilted facet 730 produces so sharp an angular redirection, ray 732, on reaching upper light pipe surface 705, fails the conditions of total internal reflection, and refracts through surface 705 as out-coupled ray segment 734.

Figure 25A:
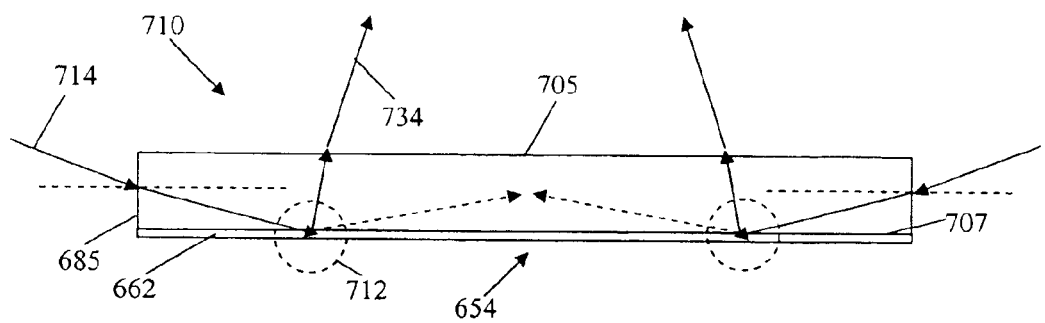
FIG. 25A is a schematic cross-section of the effects of light pipe structure on illustrative total internally reflecting light rays.
Figure 25B:
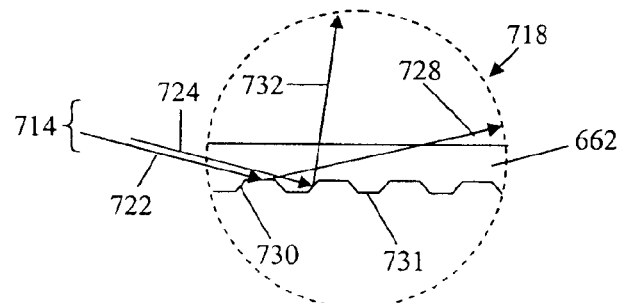
FIG. 25B is a magnified view of the lower light pipe surface as depicted in FIG. 25A and the effect of a mesa-like surface structure on the process of total internal reflection.
Figure 25C:
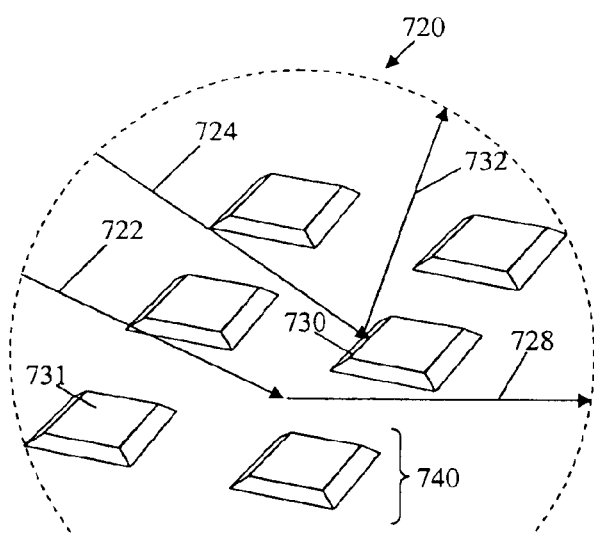
FIG. 25C is a perspective view of the mesa-like surface structure depicted in FIG. 25B.

Light pipe layer 662 can be made an integral part of either of the light pipe's plane surfaces (upper, 705, or lower, 707) by any one of various methods known in the prior art including the incorporation of a distribution of light scattering dots, prism facets, micro lens curvatures, pyramids, straight-walled ridges, holographic optical elements, diffraction gratings, and truncated faceted structures 740 shown in FIGS. 25A–C, to mention but a few. In general, whenever a total internally reflecting ray such as 666 in FIGS. 22A–B hits such a disruptive feature in or on layer 662, as at illustrative point 692, the ray is made to exceed the light pipe's critical angle for total internal reflection at that point, so that its re-direction and subsequent refraction as ray 694 lies within the entrance aperture and angular acceptance range of condensing element 308.

The features of layer 662 do not convert every light pipe ray into rays having output angles appropriate for entering condensing element 308. Some rays miss out-coupling features and remain trapped in the light pipe. Other rays are out-coupled, but at angles higher than those useful to the system. Any light pipe light that is converted to light passing through condensing element 308, however, adds to the illumination system's efficiency.

Rays that remain trapped within light pipe 654, such as illustrative ray 696 in FIG. 22A, despite the collective actions of out-coupling elements in layer 662, eventually return (re-cycle) to light source array 300 for another chance. In this case, ray 696 leaves light pipe 654 through its left hand edge face 685 as ray segment 698. Return of ray segment 698 to light source array 300 occurs via Any light that returns to light source array 300 may return along a quite different angular path, and may actually return along more favorable paths such as that of ray 674.

For best performance though, it is important that the features formed within light pipe layer 662 cause substantially more rays within the light pipe to enter condensing element 308 than they cause otherwise favorable light rays from light source array 300 such as illustrative ray 674, to become unfavorable as a result of the interaction. Since light pipe 654 and layer 662 are positioned directly in between light source array 300 and condensing element 308, their collective transmission properties for rays such as 674 must be highly transparent and minimally disruptive to angular direction.

S. Polarization Re-Cycling and Re-Use Mechanisms

Spatial light modulators such as LCDs only make efficient use of well-polarized light. (Note: The metallic micro mirrors in DMDs make efficient use of un-polarized light.) With LCDs, less than one-half the un-polarized light output from LED light source array 300 passing through the input aperture of condensing element 308 (as in the inventions of FIGS. 13, 15A–E, 17, 18 and 22A–B) is used effectively. Increasing the LCD's utilization efficiency of this light requires a corresponding means of converting some fraction of the light in the unused polarization state into light polarized in the orthogonal polarization state accepted by the LCD.

One mechanism for such polarization re-cycling was described previously in the inventions of FIGS. 5A–C and FIG. 11 for an LED light source array in which reflective polarizing layer 84 was used in conjunction with polarization conversion layer 86 just above bin array 82 (or just above prism sheets 159) to cause the effective recycling and re-use of light. In this first example, polarization recycling, conversion, and re-use have been arranged entirely within the confines of the metallic reflecting bin structure forming the array plus the prism films directly above. One linear polarization state is transmitted as output; the other, blocked by reflection, converted by phase retardation and reflection, and ultimately recycled by reflection.

There are a number of other ways for achieving efficiently polarized output light by locating some elements of the same polarization recovery process external to the multi-layered light source array itself, as in FIGS. 15A–E, 17, 18, and 24–26.

T. Reflective Polarizing Layer Moved to LCD Input (as in FIGS. 15A–E, 17 and 18)

One such way has been anticipated in the illumination system inventions of FIGS. 15A–E, 17 and 18. The polarization changing and recycling layers 84 and 86 may be moved to the input aperture of LCD 306 with practically the same beneficial gain in polarized output lumens. To see this through one example, suppose initial output rays 354 and 356 in FIG. 15A are un-polarized. Quarter-wave phase retardation layer 86 and reflective polarizer 84 (located just before LCD output aperture 304), separates condensed and un-polarized ray 356 into orthogonal linear polarization ray components, p-polarized output ray 358 and re-cycled s-polarized return ray (which becomes left hand circularly-polarized (LHCP) ray 360 on returning back through converting layer 86. LHCP return ray 360 then passes back through condensing element 308 (for example, a lens) and into light source 300 as return ray 362. Once inside the reflective structure of light source 300, the LHCP component ray 362 converts on an odd number of metallic reflections, to the orthogonal circular polarization state, RHCP, which ultimately passes efficiently through output layers 86, 84 and 306 in the same manner described previously.

This same external polarization recovery mechanism also applies to the higher angle light rays such as 334 and 338 that are processed (as described above) by metallic hemispherical reflector 332. When a ray such as 338 is first emitted, it is un-polarized, and therefore undergoes no polarization change on reflection at point 536 on hemisphere 332. When a ray such as 338 results from the return process of a LHCP ray such as 360, however, rays reaching external metallic reflector 332 convert to the orthogonal state of circular polarization.

U. Reflective Polarizing Layer Moved to Condenser Input (as in FIG. 26)

Figure 26:
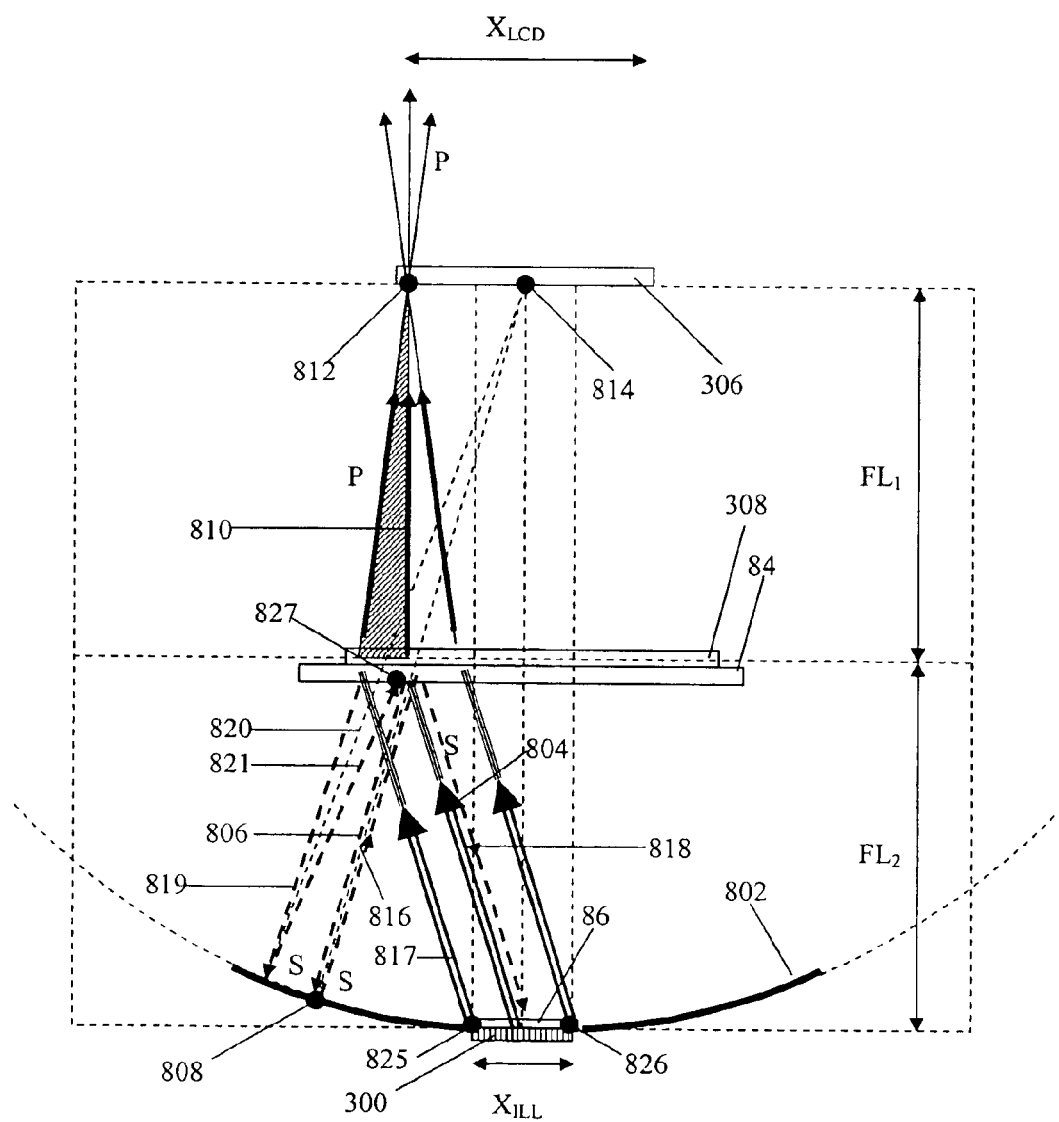
FIG. 26 is the schematic cross-section of a variation on the optical system of FIGS. 1A–B3 that includes a hemispherical reflector for the recycling and reuse of polarized light.

Another way to return and re-use the portion of LED output light in the unacceptable linear polarization state is shown schematically in FIG. 26. In this particular variation on the inventions of FIG. 13 and FIGS. 15A–E, the metallic hemispherical reflector 802 is reversed in its orientation (relative to that in FIG. 15A for example), increased in radius and used only for the collection and return of unacceptably polarized light. Hemispherical reflector 802, shown as one example, may also be a generalized conicoid.

Described schematically in FIG. 26, reflective polarizing layer 84 is located just below condensing element 308, and quarter-wave phase retardation layer 86, just at the output aperture of light source array 300. By this arrangement, one initially un-polarized output ray 804 (shown double-lined after the convention of FIG. 11) is emitted from the center point of light source array 300. Illustrative ray 804 remains un-polarized and generally unaffected by its passage through quarter-wave phase retardation layer 86. Yet when 804 reaches reflective polarizing layer 84 just below condensing element 308 it splits by design into its two orthogonal linear polarization components (s and p), s-polarized ray 806 (shown dotted after the convention of FIG. 11) reflecting downwards towards the left hand portion of hemispherical mirror 802 at point 808, and p-polarized ray 810 transmitting outwards through reflective polarizing layer 84 and condensing element 308 towards LCD 306 at edge point 812. When s-polarized ray 806 reflects at plane reflective polarizing layer 84, it does so with a predictable angle to the surface normal set by the angle between un-polarized ray 804 and the surface normal to the aperture plane of light source 300. When ray 806 reaches hemispherical reflector 802 at point 808, it is reflected without polarization change back towards the hemispherical focal point deliberately positioned at point 814, the center point of LCD 306. With hemispherical focal point set deliberately at point 814, reflected ray 816 must reflect back along its original path set by ray 806, towards reflective polarizing layer 84, and then by reflection, back along the path of the original output ray 804, this time as s-polarized ray 818, through quarter-wave phase retardation layer 86 and into the depths of light source 300 from whence it came.

When an un-polarized ray such as ray 804 passes through phase retardation layer 86, its passage has no net effect on its state of polarization. Any linearly polarized ray component such as s-polarized ray 818 passing through this element, however, changes the ray's state of polarization from linear to, in this case, left hand circular polarization. Beyond this, the handedness of any circularly polarized ray (i.e. left or right) reverses on each metallic reflection that it makes. Whenever an odd number of metallic reflections are made within light source array 300 and prior to departure through phase retardation layer 86, the converted output ray resulting reverses from left hand circularly polarized (LHCP) to right hand circularly polarized (RHCP). Accordingly, any so-converted circularly polarized rays passing back though phase retardation layer 86 converted to their corresponding linear polarization state and therefore can transmit outwards through reflective polarizing layer 84.

The result of this polarization recycling and conversion process is a useful one from the standpoint of power gain and efficiency only if the resulting p-polarized rays are generated with angular directions falling within the angular (and spatial) aperture of condensing element 308. If they do fall within this range they will, as described previously, be conveyed to LCD 306 within its acceptable angular range, and thereby increase the projection system's overall illumination efficiency.

V. Simultaneous Polarization and High-Angle Recovery (as in FIG. 27)

The invention of FIG. 26 only provides for light in the potentially wasted polarization state to be recovered and re-used. No comparable means are provided, as in FIGS. 15A, 17 and 18, to recover and re-use the otherwise wasted high angle light.

Figure 27:
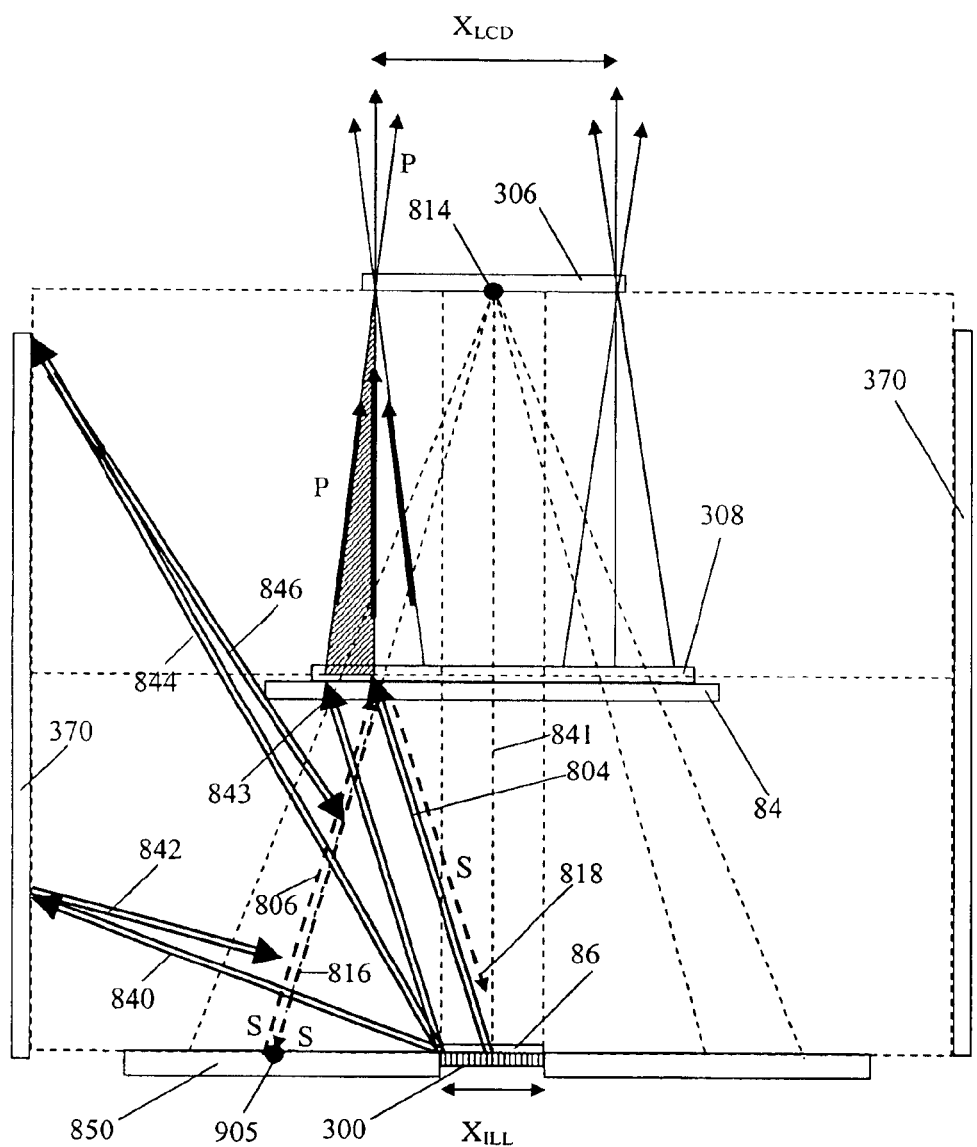
FIG. 27 is a generalized schematic cross-section of the optical systems based on FIGS. 13, 15A–E, 17, 18, 22A–B, 23A–B, and 26 incorporating planar LED light source arrays of FIGS. 3A–B and 5A–C.

A practical means for recovering both components of wasted light (i.e. unusable polarization and unusable angle), however, is described schematically by the cross-section of FIG. 27.

In this variation of the instant inventions introduced above, the locations of reflective polarizing layer 84 and quarter-wave phase retardation layer 86 remain the same as in FIG. 26, but now hemispherical reflecting mirror 802 is converted to flat version 850 comprised of metallic reflecting rings in much the same manner as was described previously (see 386 in FIG. 17). In this case, each reflecting ring comprises a continuous circular reflecting facet (circular about system axis of symmetry 841) whose center of curvature is fixed on LCD center point 814. As such, the treatment of illustrative rays 804, 806, 816, and 818 is much as described above in FIG. 26, and the contribution to polarization recovery therefore much the same.

Yet, because of reflecting mirror 850's flat configuration, high angle rays produced wastefully by light source array 300 (e.g. rays 840 and 844), previously dispersed by the curved surface of hemispherical reflecting mirror 802 in FIG. 26, are now free of all obstructions (such as the reflector's curvature) that might otherwise inhibit the ability to re-direct rays in more useful directions. For this purpose, a second collecting mirror 370 is added, made in the same form described previously in FIG. 17, with each reflecting ring's radius centered as before, on light source 300's center point 384. Consequently, all high angle rays that are re-directed by 370, whether un-polarized or circularly polarized, return to the aperture region of light source 300 for further re-processing, and do so along substantially the same (if not exactly the same) paths they arrived on. The metallic reflecting rings of element 370 have no effect on the polarization state (or lack of) of the linearly polarized light rays or the un-polarized light rays they receive and re-direct. Only circularly polarized rays reaching element 370 have their handedness reversed; and the positioning of phase retardation layer 86 directly above light source 300 makes this outcome unlikely.

In this manner, reflecting element 850 processes all light rays reflected to it by layer 84, whereas reflecting element 370 process all light rays remaining outside the respective collecting apertures of condensing element 308 and reflective polarizer layer 84.

In one example of this dichotomy, consider the case of un-polarized ray 844. This ray is turned back in direction by reflector 370 towards the aperture of light source 300 from whence it came as ray 846, without change in polarization. As such, ray 844 and its extension 846 are given another chance to be output by light source 300. Additional reflections within light source 300 may change the ray's ultimate output direction to one falling within the range of reflecting layer 84 (e.g. a direction similar to that of ray 804). Whenever this happens, the p-polarized component of this recovered energy passes outwards through the system, and the s-polarized component is recycled in the same manner as rays 816, 806 and 818.

In another example of this dichotomy, consider the case of an s-polarized (rather than un-polarized) ray such as 818 returning to light source 300 by the cooperative actions of elements 84 and 850. Suppose internal reflections with reflective array elements of 300 causes eventual re-output in a ray direction similar to or in-between those of wider-angle rays 840 and 844. Such rays are returned to light source 300 for another chance at conversion as above, with one stipulation. Their polarized energy remains trapped in multiple reflections between elements 84, 850 and 370 unless reflections (and conversions) within light source 300 results in the collective re-output of p-polarized light having angles relative to system axis 841 no greater than that of boundary ray 843.

As first applied in the invention of FIG. 17, the faceted reflecting rings of element 370 receive un-polarized high angle light rays, leaving conversion to useful angles and polarization up to internal mechanisms entirely within light source 300.

W. Generalization of Illumination Recovery and Re-Use (as in FIGS. 28A–E)

The recovery and re-use mechanisms embodied in the basic light source array inventions of FIGS. 3A–B, 5A–E and 11, as well as in the basic projection system illuminator inventions of FIGS. 13, 15, and 17–27 are applied as means of decreasing the system's optical inefficiency, and not as means to reach the theoretical efficiency limit. As will be shown further below, fundamental laws and geometric relationships govern the maximum possible light conversion efficiency within given spatial, angular, polarization and wavelength constraints.

The present inventions compromise optical efficiency to achieve a higher density of LED's within a given light source array such as 300. The methods summarized in FIG. 28A are introduced to reduce the degree of efficiency compromised.

Figure 28A:
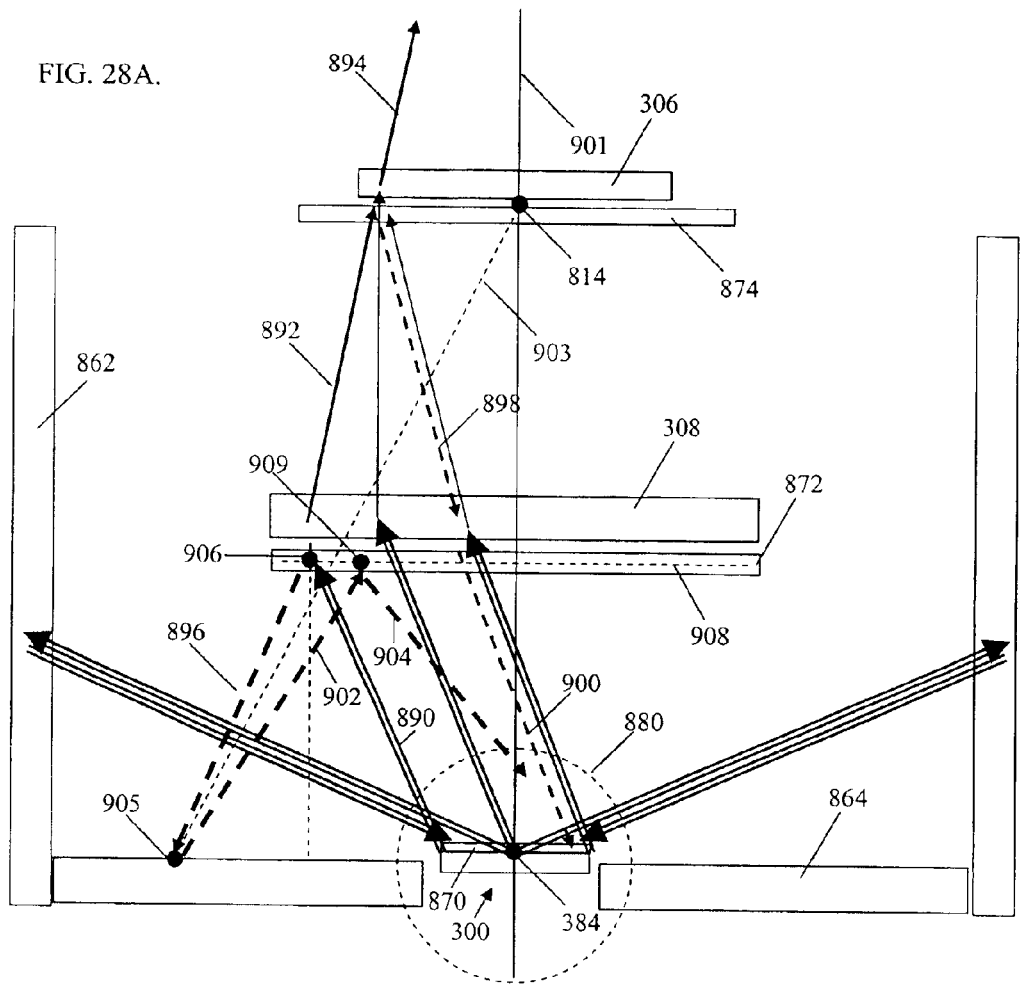
FIG. 28A is another generalized schematic cross-section of the optical systems based on FIGS. 13, 15A–E, 17, 18, 22A–B, 23A–B, and 26 incorporating the planar LED light source arrays of FIGS. 3A–B and 5A–C as well as other possible LED array structures.
Figure 28B:
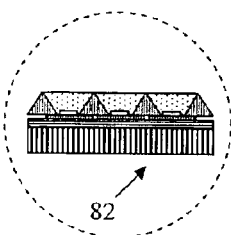
FIG. 28B shows a magnified cross-sectional view of the micro-reflecting LED bin array type of FIG. 3A as one possible choice for use in the optical system of FIG. 28A without optical over-layers.
Figure 28C:
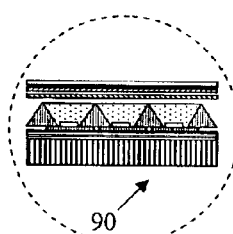
FIG. 28C shows the magnified view of a single LED bin that can be used in the system of FIG. 28A without optical over layers.
Figure 28D:
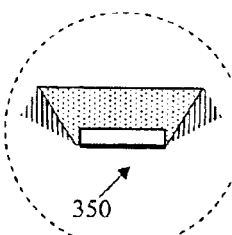
FIG. 28D shows the type of LED bin array illustrated in FIG. 3B that can be used in the system of FIG. 28A with the addition of optical over layers.
Figure 28E:
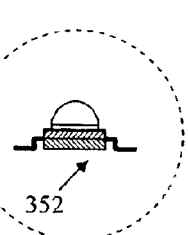
FIG. 28E shows a graphic illustration one type of commercially available LED package structure that can be used singly or in a tight array within the system represented in FIG. 28A.

FIG. 28A serves as a schematic cross-section generalizing the basic inventive elements introduced thus far, with FIGS. 28B–E summarizing the compatible LED light sources that can be used. Light source 300, in this view, is a two-dimensional array of LED elements distinguished by use of discrete LED chips disposed within contiguous reflecting cavities (or bins) whose tapered reflecting sidewalls have primarily a metallic specularly reflecting behavior. While the tapered sidewalls can also be created by the total internal reflection that occurs at a dielectric-air boundary layer, this format achieves somewhat lower net optical efficiency than metallic boundaries (due to failure of total internal reflection at some angles and lack of a polarization conversion mechanism) and is not as preferable in applications requiring highest output efficiency. Some specific examples of light source 300 are suggested in details 880 in FIGS. 28B–E. FIG. 28B represents the basic two-dimensional reflective bin structure introduced in FIGS. 3A–B, 5A–E, and 11 as layer 82. Angular recycling is added via hemispherical reflector 862. FIG. 28C summarizes the prism sheet recycling approach of FIGS. 3A–B, 5A–C and 11. FIG. 28D indicates that while the array of bins in detail 880 may be preferable in some situations, the use of a single bin containing one or more LED chips is also possible, with angular recycling added by reflecting element 862 or the addition of prism sheets. FIG. 28E represents a discretely packaged type of commercially available LED (such as the Luxeon™ emitter manufactured by LumiLeds) and is used singly or in an array. While offering less favorable performance gains than the compact LED bin arrays of FIG. 28B, arrays formed of discretely packaged devices function similarly, either with angle recycling prism sheets above them, or by themselves in concert with hemispherical reflecting element 862.

In general perspective, the inclusion of polarization recovery requires a minimum of 3 cooperating elements: a reflective polarizing layer (84 in FIGS. 3A–B, 5A–C, 11, 15A–E, 17, 18, 23, 26 and 27; 872 or 874 in FIG. 28A), a quarter-wave phase retardation layer (86 in FIGS. 3A–B, 5A–C, 11, 15A–E, 17, 18, 23, 26 and 27; 870 in FIG. 28A) and at least 1 (or any odd number) of metallic reflections prior to efficient output. Reflective polarizing layer 84, 872 and 874 appears as a polarization selective mirror plane that separates un-polarized light into its two orthogonal linear polarization states (s and p) by reflecting one and transmitting the other. Such materials are manufactured using polymers preferably by Minnesota Mining and Manufacturing Company (3M), under the trade name, DBEF™. Quarter-wave phase retardation layer 86 is preferably a thin polymeric film material, one useful example manufactured by Nitto Denko. These films, when oriented appropriately with respect to the polar axis of the linear polarized light passing through them, cause efficient conversion from linear polarization to circular polarization.

Numerous examples of the polarization recovery process using these elements have been given above. The purpose of FIG. 28A, however, is to show within a single schematic, a graphic summary of all the various angle and polarization recovery responsibilities.

Illustrative output ray 890 emanates from the left hand edge of planar light source 300. This illustrative ray is directed with the maximum angular extent permissible by the aperture conditions of condensing element 308. When this ray is p-polarized by re-cycling and polarization conversion processes are within light source 300 there is no need for further processing, except by condensing element 308, which re-directs the ray as continuing segment 892 to LCD 306. If ray 890 were un-polarized leaving light source 300, further external processing steps are introduced to recover or re-use a fraction of what would be otherwise wasted polarization. Such recovery steps involve a polarization converting element 872, placed just below condensing element 308 or, alternatively by an equivalent converting element 874 placed just below LCD 306. In either case, the converting element (872 or 874) is composed of a reflective polarizer layer that reflects one linear polarization state and transmits the orthogonal state. A cooperating quarter-wave phase retardation layer 870 is located just above light source 300.

As one example of this configuration, converting element 872 is presumed in position just below condensing element 308. As such, element 872 serves to split un-polarized light ray 890 at point 906 into its two orthogonal linear polarization states, p-polarized ray 892, transmitted and processed by condenser 308, and s-polarized ray 896, reflected downwards towards reflective element 864 and target point 905 on reflective element 864.

When s-polarized ray 896 reaches reflective element 864 it is reflected symmetrically and without change in polarization about line 903 extending from point of reflection 905 to center of curvature 814. As a result, reflected ray segment 902 heads back towards point 909 on converting element 872, which it sees as mirror plane 908. Consequently, s-polarized ray 902 is redirected as s-polarized ray 904 back towards light source 300, and the region of its right most edge. As ray 904 passes through quarter-wave phase retardation element 870 its polarization converts from linear to circular. This conversion step is critical to the instant inventions herein as it enables the metallic reflections occurring within light source 300 to effect changes in polarization. Without such polarization changes, there would be no possibility of polarization recovery and gain. Re-emitted output rays from light source 300 remain s-polarized, and thereby unable to pass through converting element 972. Such rays remain trapped reflectively between element 972 and light source 300. Only by means of polarization change are these rays able to escape entrapment, as potentially useful contributions to output.

As another example, converting element 872 is positioned just below LCD 306. In this case, illustrative un-polarized ray 890 is redirected towards LCD 306 by condensing element 308 as un-polarized ray segment 892. When ray 892 reaches converting element 872, it immediately splits into transmitted p-polarized output ray 894 and back-reflected s-polarized ray 898. S-polarized ray 890 is directed downwards, back through condensing element 308 and through phase retardation element 86, onwards into light source 300. Once again, effective reuse of this recycled energy depends on the polarization conversion process: conversion of s-polarized ray segment 900 by element 86 into its corresponding circular polarization state and subsequent conversion to the orthogonal circular polarization by metallic reflection.

Two external ring-segmented reflecting elements are involved in the recovery processes. Disk-like element 864 surrounds light source 300 and its circular reflecting rings redirect rays reflected towards it by converting element 872 when it is located below condensing element 308. Cylindrical element 861, whose axis is concentric with symmetry axis 901, also surrounds light source 300, and redirects light rays emanating from it, regardless of polarization state, that are not otherwise collected and used by condensing element 308. It is applied as a means of recovering and reusing high angle light rays that would otherwise escape the system.

Disk-like ring-segmented hemispherical reflector 864 is designed in conjunction with converting element 872 so that its focal point 814 is folded by mirror plane 908 to coincide with center point 384 of light source 300.

Cylindrical ring-segmented hemispherical reflector 862 is designed to return high-angle light rays, whether they are polarized or un-polarized. Focal point of reflector 862 is also made to coincide center point 384 of light source 300.

X. Illuminator Performance, the Fundamental Geometric Limit and Spatial Character of Arrays Ultimate performance of LED illuminators such as have been described in the sections above, and regardless of their application, is limited by a fundamental geometric invariant known as etendue. Assessments of performance are best made in relation to designs that operate at or near this theoretical limit. While the geometric invariant applies to individual LED illuminators and arrays of individual LED illuminator elements alike, a distinguishing feature of the present inventions is the way in which they capitalize on the collective performance of array elements. That is, the spatial overlap or sharing of output light between neighboring LED array elements found to be a critical contributor to the collective performance achieved.

As a deliberate starting point, the instant inventions of FIGS. 3A–B, 5A–C, 11, 13, 15A–E, 17, 18 and 22–28 were not constructed to preserve etendue from aperture to aperture throughout their optical systems. Starting with the LED source aperture etendue limits are equated by the Sine Law ($A_i \times \mathrm{Sin}^2 \theta_i$), relating the net etendue of every $i^{th}$ aperture. Designs preserving etendue are constrained geometrically, a consequence, in geometrically constrained applications as projection display, that could restrict suitability. Plus, with etendue preserved, no further optical output gain is allowed (within any given polarization state or wavelength) by the re-cycling and re-use methods that have been incorporate above.

Re-cycling and re-use as applied herein, reduces the amount by which the otherwise non-etendue preserving designs fall short of the fundamental geometric limit. The more re-cycling and re-use that is included, the closer output performance can come to that associated with the geometric limit—without exceeding it.

Moreover, the particular mechanisms of recycling and reuse impart a degree of spatial de-localization that contributes to the array's spatial uniformity and enhances its overall performance efficiency.

Y. Etendue-Preserving Reflector Array (as in FIGS. 29A–B)

Figure 29A:
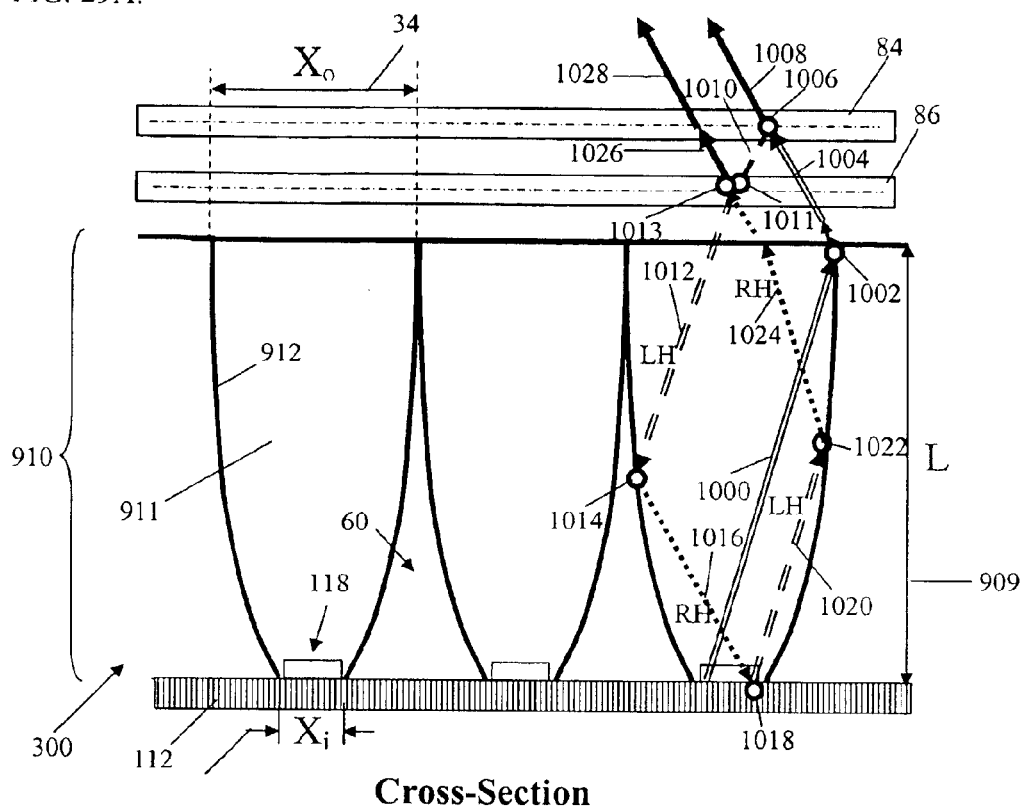
FIG. 29A is the schematic side view cross-section of a multi-layered planar LED light source array in which flip-chip LEDs are arranged in a regular array on a planar circuit plane, each LED protruding through the input aperture of an array of contiguous bins having curved reflecting sidewalls designed so as to preserve etendue from input to output aperture and whose bin apertures are located beneath an elevated stack of polarization converting films.
Figure 29B:
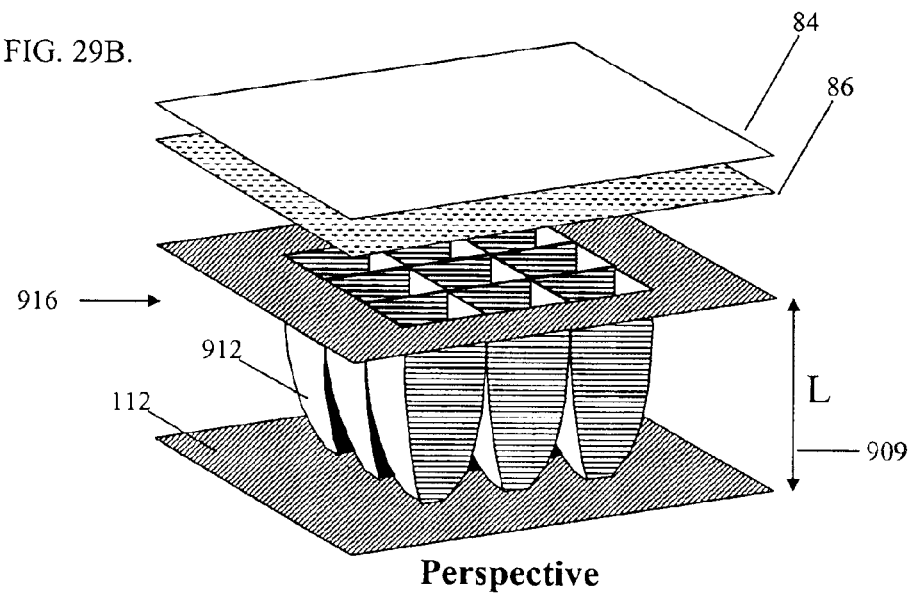
FIG. 29B is a perspective view of the multi-layered planar LED light source array depicted in FIG. 30A.

The etendue-preserving version of the instant inventions is shown in both the schematic cross-section 910 of FIG. 29A and in the perspective view 916 of FIG. 29B, illustratively, for a 9-element array. Each contiguous etendue-preserving bin 913 is designed with a minimum of 4 reflecting sidewalls 912, the shape of each which varies mathematically as described by prior art in such a way that the Sine Law is preserved between input 100 and output 914 apertures. The same LED chip 118 as has been described above is placed within input aperture 100 of each bin. The well-known Sine Law determines the minimum size of the output aperture, $X_o$, 914, by equation 7, where $X_i$ is the input aperture size and $\theta_o$ is the maximum output angle. LED 118 is presumed to emit over the full +/−90-degree hemisphere, but other more limited angular emission ranges are just as easily accommodated by means of equation 7.

$$X_o = X_i \, \mathrm{Sin}\, 90 / \mathrm{Sin}\, \theta_o \tag{7}$$

The structure of FIG. 29A–B is best suited for those illumination applications where highest possible efficiency is critical and compactness constraints on illumination aperture 914 are sufficiently modest. Video projection systems, such as those described by the invention of FIG. 13, have been shown to impose very strict boundary constraints on illuminator size. One illustration of this restriction is offered for a maximum preferable illumination angle of +/−25-degrees in air (+/16.48-degrees in encapsulating media of refractive index 1.49), in conjunction with a 1.2 mm (diagonal) LCD (or DMD) video image source and f/2.4 projection optics. Under these conditions, the maximum permissible illuminator size becomes, by the geometry of FIG. 13, 12 mm×12 mm. Suitability of the bin array depicted in FIGS. 29A–B depend on determining just how many of its ideally designed bins (and LEDs) fit within the geometry-limited aperture. Using 1 mm×1 mm LED chips arranged to fit exactly within input aperture 100 of each reflecting bin 913 ($X_r$=1) and bins filled with dielectric material 911 of refractive index 1.49 rather than air, its seen from equation 7 that $X_o$=3.53 mm. Accordingly, for X and Y-meridian symmetry, we find that only eleven 3.53 mm×3.53 mm bins fit within the 12 mm×12 mm illumination aperture. With each 1 mm green LED emitting a maximum of 100 lumens/ mm², the maximum output power per bin array 910 is therefore 1,100 un-polarized lumens, which after allowances for realistic reflection losses and absorption falls to about 900 lumens.

Judging suitability under these conditions depends on the target projector's total lumen need. Today's commercially competitive front projector products using conventional discharge lamps deliver more than 1,000 white-field lumens on-screen. It was shown earlier that to achieve this performance level at least 1,600 un-polarized green lumens must be realized within the illustrative +/−25-degree angular range from all bins fitting within the corresponding 12 mm×12 mm aperture. While this output level has been offered by the less-efficient non-etendue-preserving inventions of FIGS. 3A–B, 5A–C, 11, 13, 15A–E, 17, 18 and 22–28, there is a 1.6× shortfall using the more efficient etendue-preserving array of FIGS. 29A–B.

The primary reason for this shortfall is that the Sine Law preserving design of bins 910 achieves high efficiency at the expense of reduced lumen density. The primary reason the non-etendue designs succeed is that they achieve elevated lumen density at the expense of efficiency.

Z. Genus of Non-Etendue-Preserving Reflector Array (as in FIGS. 29A–B–FIGS. 30A–B)

Circumventing theoretical limits without violating fundamental law begins by compromising on efficiency. Designing to reach the Sine Law's theoretical limit implies 100% efficiency (prior to material losses).

Such inefficiency trade-off is precisely the genus of the non-etendue-preserving inventions of FIGS. 3A–B, 5A–C, 11, 13, 15A–E, 17, 18 and 22–28. The etendue-preserving invention of FIGS. 29A–B transfers, before normal material losses, 100% of the emitted flux to the angular range of interest (i.e. +/−25-degrees in this example). Correspondingly, and even after benefit from the recovery and re-use inventions of FIGS. 15A–E, 17, 18, and 22–28, only about 50%–60% of the total emitted flux (from each LED) is expected to transfer within the angular range of interest.

The specific path of inefficiency taken is traced schematically in FIGS. 30A–B and FIGS. 31A–B. The evolution begins imaginarily by moving the ideal reflecting bins of the cross-section in FIG. 29A toward each other so that bin reflecting walls 910 overlap as indicated by the solid lines of FIG. 30B and the dotted lines of FIG. 31B. By doing so, more bins can be fit within any given area. Of course, overlap regions 922 have no optical function, and the imposing reflector sidewalls 925 would drastically alter optical throughput.

Figure 30A:
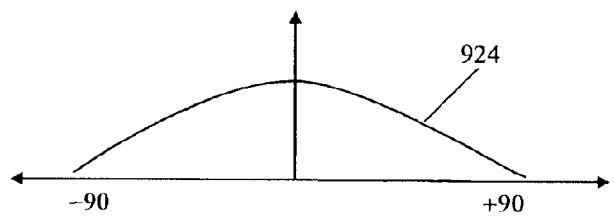
FIG. 30A shows the Lambertian angular output distribution of an LED light source, such as the micro-reflecting array depicted in FIG. 30B.
Figure 30B:
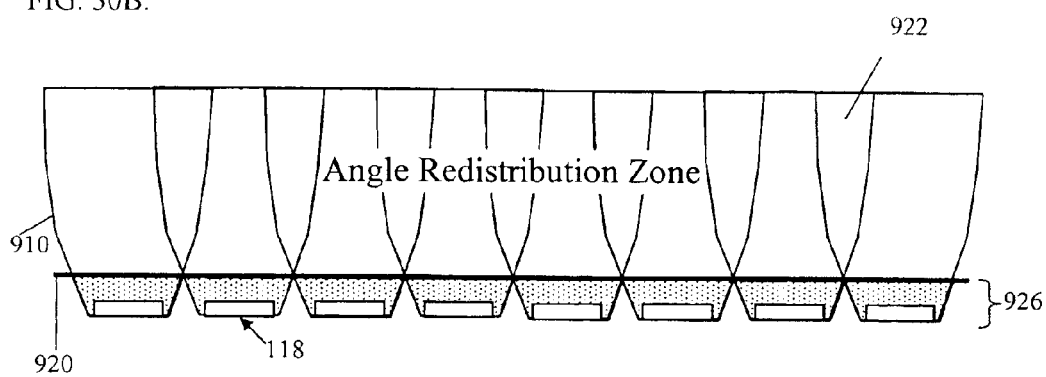
FIG. 30B is a schematic cross-section of an LED array of truncated etendue-preserving micro-reflecting bins whose centers have been pushed closer together than physically possible, with the reflector truncation line placed at the onset of reflector overlap.
Figure 31A:
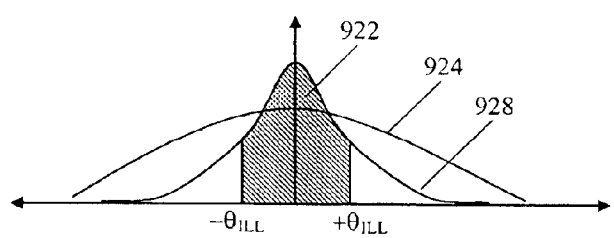
FIG. 31A shows the non-Lambertian angular output distribution of an LED light source such as that of FIG. 31B whose behavior has been modified so as to increase light emission at lower angles at the expense of light emission at higher angles.
Figure 31B:
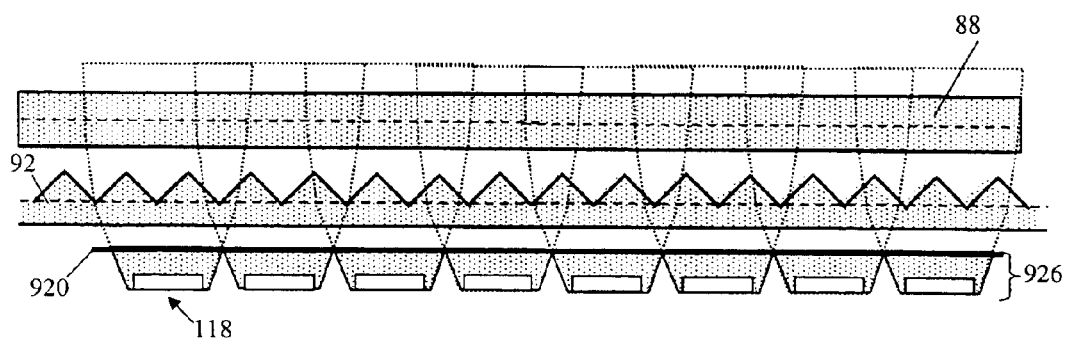
FIG. 31B is the schematic cross-section of the truncated LED array shown in FIG. 30B with the addition of two prism sheets elevated above the array to replace the overlapping reflector region that had been removed as the result of the truncation.

The boundary between practical and impractical is indicated by line 920 in FIG. 30B and FIG. 31B. Only the non-overlapping reflecting region drawn below line 920 is practical, but achieves practically no selective angle transformation over the range +/−90 degrees. Light output 924 from truncated bins 926 is essentially a Lambertian distribution. The entire reflector shape 910 is needed to impart angle transformation from +/−90 degrees to the range of interest. Consequently, shifting optical power from the higher output angles to the lower output angles requires finding a functional alternative to upper bin portions 929 of FIG. 30B.

One such functional alternative is provided by prism sheet structures 92 and 88 of FIGS. 3A–B, 5A–C, and 11, as represented schematically in the light source array of FIG. 31B.

While conjunction of a specularly reflective LED bin array with over-lying prism sheets as depicted in FIG. 31B does not achieve as sharply a confined angular output as do the deeper bin array of FIGS. 29A–B, it does achieve a much more favorable non-Lambertian output distribution, FIG. 31 A, than do the truncated bins 926 of FIG. 30B used alone, which develops the Lambertian distribution of FIG. 30A. Truncated bin array 926 establishes lumen density, and cooperating prism sheets 88 and 92 facilitate the angular redistribution process. The new output distribution 928 shows significantly increased output within angular range of interest 922 at the expense of reduced output at higher output angles. The angular redistribution process implicit in such light source arrays involve the reflective recycling mechanisms discussed above, as well as a unique interaction between the design variables of the reflecting bins 926 (depth and sidewall slope) and those of the prism sheets 88 and 92 (prism angle, refractive index, and elevation above the LEDs 118).

In addition, there is another unique characteristic of the non-etendue-preserving bin arrays of FIGS. 31A–B. Light generated by any one bin in the array spreads by the recycling process to neighboring bins. Because of the fixed tightness of the array, this spatial spreading only dilutes lumen density at the array boundaries, while constant lumen density is maintained within the array by spatial superposition. This important characteristic of the present inventions will be described in more detail further below.

AA. On the Degree of Theoretical Inefficiency

The etendue-preserving bin array of FIGS. 29A–B achieves the maximum geometric efficiency allowed by thermodynamic law. The non-etendue-preserving designs of FIGS. 3A–B, 5A–C, 11, 13, 15A–E, 17, 18, 22A–28A, and 31A–B have purposely sacrificed this efficiency to develop higher lumen density. The degree of inefficiency involved depends on the details of the embodiment.

A convenient way to characterize inefficiency of non-etendue-preserving arrays is to consider the array as a single entity and contrast its performance with a single etendue-preserving LED source of the same total emitting area. For the 40-bin, 9 mm×12 mm LED array example used frequently above, with 1 mm LEDs emitting 100 lumens over +/−90 degrees from dielectric to air, the equivalent LED source area is that of the 40 LEDs themselves, or 40 mm². The geometrical limit then insists that the Sine Law product of the array be less than the effective source product, which is $(40^{0.5})$ (Sin 25)/(1.49) or 1.79.

The fundamental source density has been consciously diluted in the array inventions of FIGS. 3A–B, 5A–C, 11, 15A–E, 17, 18 and 22A–28A. The illustrative 40-bin array involves 40-mm² of LEDs spread over the 72-mm² array's aperture. Consequently, there is a corresponding loss to the fundamental (efficiency) limit. With 40 identical 1.6 mm bins, the loss to the fundamental limit reduced to $1.6^2/1.0^2$ or 2.56. This deliberate inefficiency allows considerable margin for the re-cycling and re-use inventions of FIGS. 3A–B, 5A–C 11, 15A–E, 17, 18, 22, 23 26–28B and 31A–B to improve output performance—and do so without any violation of fundamental law.

Simply, there is no violation of law unless it can be shown that some combination of mechanisms lead to a system aperture brightness exceeding that of the fundamental source.

The inventions of FIGS. 3A–B, 5A–C, 11, 13, 15A–E, 17, 18, 22, 23 26–28B and 31A–B retreat from the geometric limit at +/−90 degrees by dispersing the source (array) over a larger aperture than required theoretically. While the selective re-cycling and re-use mechanisms then decrease this initial inefficiency, their constructive actions never reach the theoretical limit.

The flip-chip LED configurations described by FIGS. 6A–C are surrounded in a transparent dielectric medium (rather than air) to extract the maximum possible emitted flux. For this reason, such LEDs are better suited to the non-etendue-preserving illumination systems of FIGS. 3A–B, 5A–C, 11, 13, 15A–E, 17, 18, 22, 23 26–28B and 31A–B than to ideal etendue-preserving system of FIGS. 29A–B, at least for the projection system embodiments of FIGS. 15A–E, 17, 18, and 22–28B that have particularly tight illumination aperture constraints.

In projection systems, as mentioned earlier, etendue is driven by spatial and angular constraints on its image aperture 306 (LCD or DMD). Critical elements include physical area and maximum permissible acceptance angle. The fundamental light source used might typically be larger and thereby contain more geometric limit than can be used effectively. The digital micro mirror device, also known as a DMD (or digital light processor, DLP™), has micro mirrors that are deflected electronically through a maximum angle of 24 degrees. Most commercial micro-sized LCD contrast ratios fall significantly at illumination angles beyond +/−12 degrees.

The impact of such constraints is more apparent by an early projection system example. Additional examples will be introduced in section 6 below.

AB. Projection System Example

The effect of such constraints on projection system efficiency is illustrated by the following example for the illustrative 4:3 image aperture 306 of 446 mm$^2$ (1.2" diagonal with 4:3 aspect ratio). This image aperture supports a maximum illumination angle of +/12 degrees in air. Accordingly, the effective geometric limit becomes (446)(Sin$^2$ 12) or 19.28. Condenser element 308, as in FIG. 13, converts light from light source 300 within a chosen angular range (i.e. +/25 degrees) to the specific angular range (+/−12 degrees in air) handled effectively by the imaging device 306. This means that the overall illumination aperture area at +/−25-degrees, $A_{25}$, cannot exceed its Sine Law equivalent through the equality, $(A_{25})(\text{Sin}^2\ 25)=(446)(\text{Sin}^2\ 12)$. So, maximum effective illumination area $A_{25}$ is 107.9 mm$^2$.

The non-etendue-preserving illuminator arrays of FIGS. 3A–B, 5A–C, 11, and 31A–B are restricted to this area, but contain 40 mm$^2$ of LEDs whose output, while boosted in the range of +/−25-degrees, spreads over +/−90-degrees.

This result is related to the geometric ideal by determining the LED aperture at +/−90-degrees that, converts all LED emission to the same angle (+/−25-degrees) and aperture (107.9 mm$^2$)—as by the idealized bin structure of FIG. 29. This ideal LED emitter has an aperture (107.9)(Sin$^2$ 25/n$^2$), $A_{LED}$=8.68 mm$^2$ with n=1.49. This hypothetical LED corresponds to about 9 individual 1 mm$^2$ chips packed tightly together as a 3 mm×3 mm composite.

Hence, the higher lumen density achieved with the non-etendue-preserving approach over the etendue-preserving approach clearly stems from its use (and powering) of 4.6 times more LEDs. For example, using 40 green LEDs at 100 lumens/mm2 per LED, in the 1.6 mm×1.6 mm optimized reflecting bins of FIG. 7, contributes about 1000 un-polarized lumens to image aperture 306. Adding optimized prism sheets 88 and 92 as in FIGS. 3A–B, 5A–C 11 and 31A–B increases lumen use to 1550 (practically the 1600 un-polarized lumen required from this discussion above for a 1000 white-field lumen front projector).

As re-cycling is made more efficient, and as the angle-changing mechanisms associated with re-use efficiency improved, still further advances in illuminator performance are permitted without penalty.

AC. Aperture Brightness Perspective

Yet another way of looking at the difference between the two types of light source arrays introduced above is in terms of their comparative aperture brightness. The fundamental brightness of a 40 mm$^2$ LED source aperture at an LED performance level of 100 lumens/mm$^2$ is 9,290,000 FL (foot-Lamberts or FL). Yet, the act of spreading these same 40 LEDs and their +/−90-degrees of angular emission over the larger etendue-preserving aperture of chosen angular range (i.e. +/−25-degrees), dilutes this fundamental full angle brightness spatially by a factor of 1/(1.6$^2$) or 2.56 to 3,628,906 FL. Then, by virtue of the angular discrimination imparted by condenser element 308 (as in the image projection system of FIG. 13), only about +/−25 degrees of this LED's angular emission is redirected to image aperture 306. Such angular dilution, if not tempered in some way, further reduces aperture brightness (i.e. by Sin$^2$(25) from 3,628,906 FL to 648,145 FL). The recycling and reuse mechanisms embodied in the instant inventions of FIGS. 3A–B, 5A–C, 11, 13, 15A–E, 17, 18, 22, 23, 26–28B and 31A–B act explicitly to reduce angular dilution. One example is taken from FIG. 7, with 1550 lumens achieved in +/−25-degrees over an aperture of 102.4 mm$^2$. This performance corresponds to an aperture brightness of 1,406,247 FL—about twice the fully diluted brightness achieved using conventional technology. While a doubling of performance is significant, there is still considerable room for additional improvements without violation of fundamental law.

AD. LED Arrays and Spatial Overlap of Output Light

A critical facet of the performance character of illuminator arrays of the present inventions relates to the nature of optical overlap achieved between physically distinct array elements.

The spatial distribution of output light immediately above an array of LEDs enclosed in physically distinct reflecting bins, cavities or compartments is composed of a corresponding array of contiguous or overlapping light patterns generated at and beyond the output apertures of the entire array from the performance due to any one LED element of the array turned on and all the others turned off. The collective superposition affects output efficiency and spatial uniformity. In addition, when the LEDs in the array represent more than one emission color, the collective superposition affects color homogeneity as well.

Figure 32A:
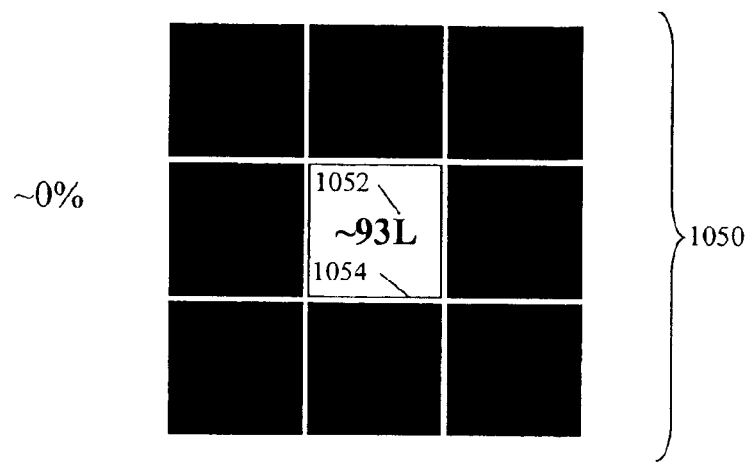
FIG. 32A shows the schematic top view of a 3×3 LED light source array composed of the contiguous etendue-preserving reflector bins as illustrated in FIGS. 29A–B with light output (~93 lumens) as represented for the case when only the center LED has been lighted.
Figure 32B:
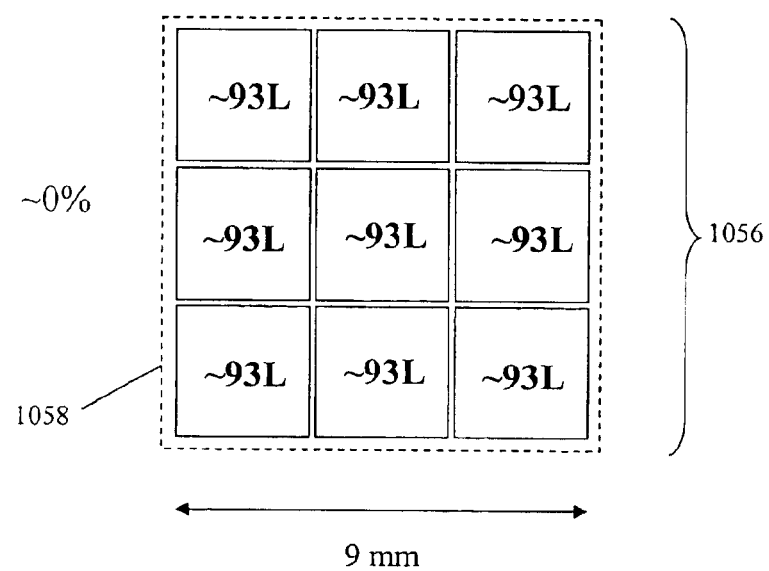
FIG. 32B shows the schematic top view of a 3×3 LED light source array composed of the contiguous etendue-preserving reflector bins as illustrated in FIGS. 29A–B with light output shown for the case when all 9 LEDs have been lighted.

AE. Output of Etendue Preserving Arrays: FIGS. 32A–B

The simple output light composite pattern 1050 of a 3×3 array of etendue-preserving bins as formed in FIGS. 29A–B is shown schematically in FIG. 32A with the central unit 1052 on (white) and the 8 surrounding bins off (black). Output light is confined spatially to physical aperture 1054 of the bin whose LED is activated. For a 100 lumen LED, about 93 lumens are output within the angular range designed. Equally simple output light pattern composite 1056 of the same 3×3 array of etendue-preserving bins is shown schematically in FIG. 32B with all 9 LEDs turned on (white). In such cases, the output light from the complete array becomes a contiguous representation of the light pattern developed at the output aperture of any representative bin unit in the array operating alone. In such cases, the array's lumen density (in lumens/mm$^2$) is defined by lumen density at the output aperture of any array element. Output light is confined to square boundaries 1058 of the etendue-preserving bin's output aperture—which for an illustrative +/−30-degree design is 3 mm×3 mm. So for this 3×3 array, the overall area of contiguous elements is 9 mm×9 mm.

When polarization recycling re-cycling elements 84 and 86 are included in the array, as in FIGS. 29A–B, light emitted by any or all given bins within the array re-cycle to and are re-emitted by neighboring bins, creating a situation of spatial light spreading and overlap such as described just below. In this case, lumen density results of the same spatial overlap that is a more important fundamental characteristic of the non-etendue preserving arrays.

Figure 33A:
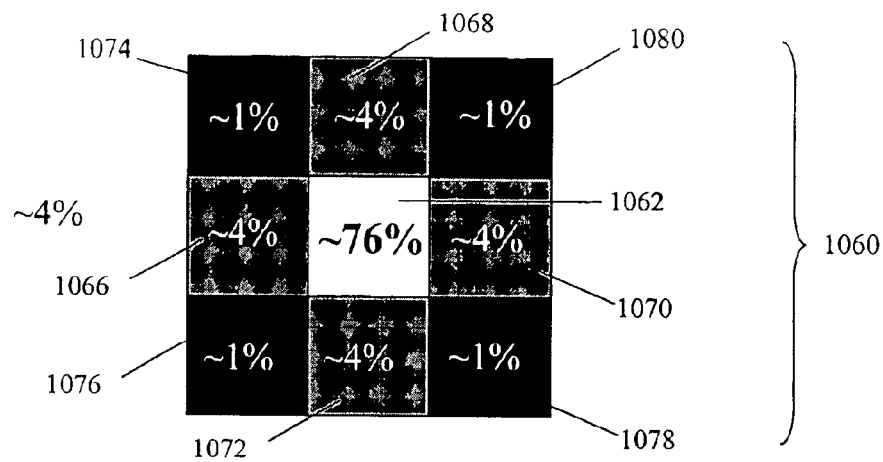
FIG. 33A shows the top view of a 3×3 LED light source array composed of the contiguous non-etendue-preserving reflector bins and elevated prism sheets shown in FIGS. 3A–B and 5A–C and depicts the 9-bin array's light output for the case when only the center LED has been lighted.
Figure 33B:
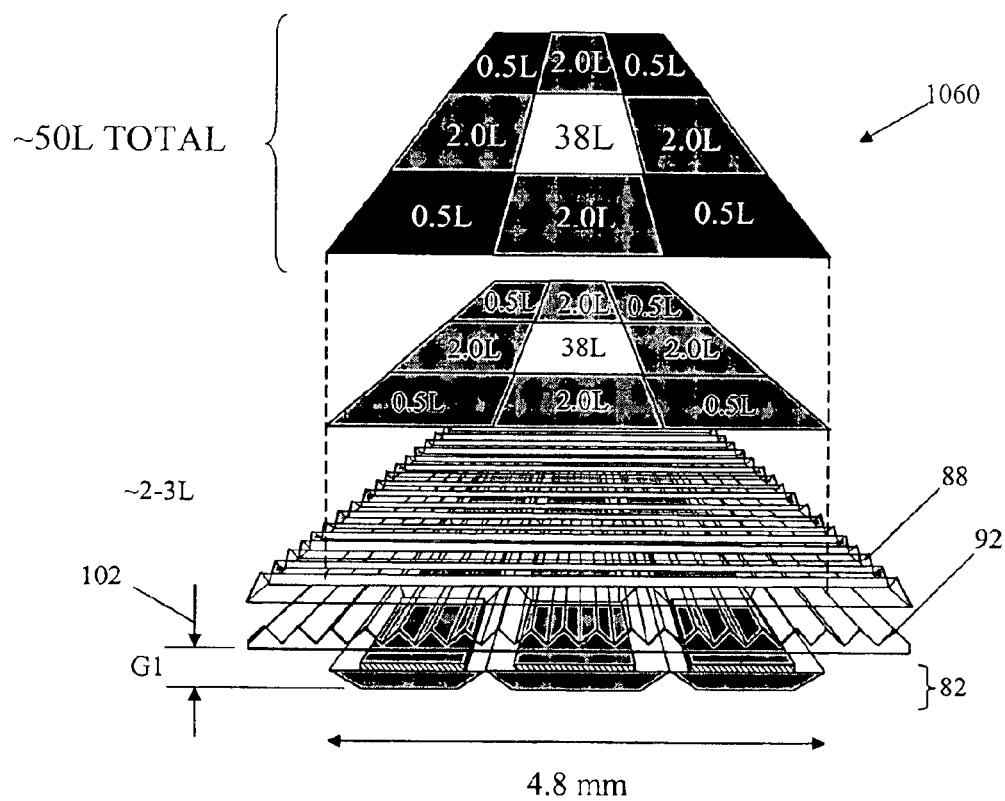
FIG. 33B is a perspective view of the 3×3 LED light source array of FIG. 33A.

AF. Output of Non-Etendue-Preserving Arrays: FIGS. 33A–B.

The spatial light spreading that occurs in the non-etendue-preserving illuminator inventions of FIGS. 1A–3B, 5A–C, 11 and 31A–B is shown schematically in FIGS. 33A–B for a 3×3 array of contiguous 1.6 mm square bins 82 (one 100 lumen LED per bin), bin array 82 covered by two prism sheets 88 and 92 containing preferably 104-degree prisms. The total lumen output from any given bin within the illustrative +/−30-degree angular range is about 50 lumens. Detail 1060 of FIG. 33A is a topographic map showing exactly how these lumens distribute spatially in percent among the nine contiguous 1.6 mm bins involved. Map 1060 is formed for the special illustrative case when the LED in central bin 1062 is on, and all surrounding LEDs are off. For this case, about 76% of the total lumens within the +/−30-degree angular range specified, or about 38 lumens, remain confined to the 1.6 mm square aperture area of central bin 1062.

A perspective view of bin array 82 and prism sheets 88 and 92 is shown in detail 1064 of FIG. 33B, so as to illustrate more clearly the effective light spreading involved. Spatial overlap of output light to neighboring bins is a deliberate feature of the illuminator inventions combining bins and prism sheets, bins and polarization re-cycling, or both. In the simple case of bins and prism sheets, the spreading to neighboring bins is a feature brought about specifically by the optical interplay between elevated prism sheets 88 and 92 and the underlying reflecting bins 82, as discussed earlier. The extent of the spreading is controlled by prism sheet elevation 102, G1, above the LED array itself, plus geometric parameters of the prism sheets used.

Detail 1060 in FIG. 33A is representative of the characteristic spatial output pattern observed both experimentally and with the computer model described earlier. The four nearest neighbor bins 1066, 1068, 1070, and 1072 about central bin 1062 each contribute about 4% of the lumen total. The four next-nearest neighbor corner bins 1074, 1076, 1078 and 1080 each contribute 1% of the lumen total.

Figure 34:
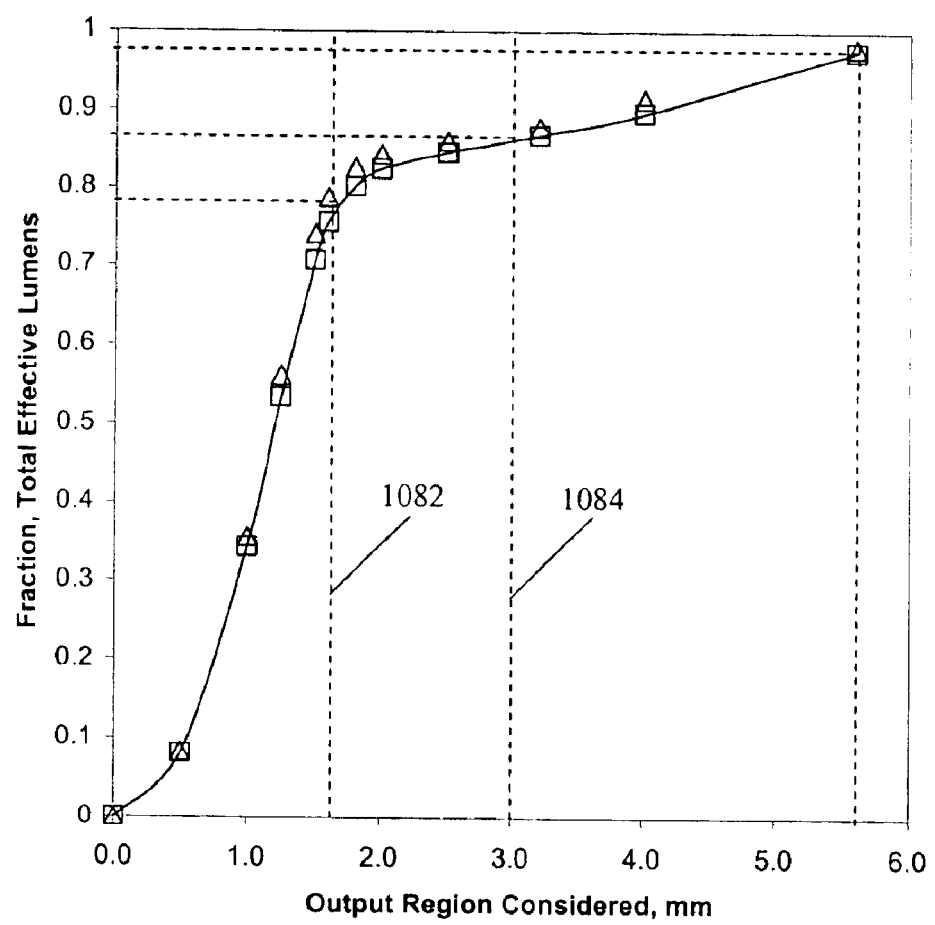
FIG. 34 shows the graphical result of the fraction of total effective lumens produced by the single lighted bin of the LED light source array of FIGS. 33A–B as a function of the size of the output square area considered, for light within two similar angular ranges (+/−25-degrees, triangles Δ; +/−30-degrees, squares, □).

Yet another perspective on the bin array's light spreading characteristic is given in FIG. 34, which plots the fraction of total effective lumens that are enclosed within progressively larger squares about central bin 1062 as a function of the size of the squares considered. In this context, effective light is that light contained within the specified angular range, either +/−25-degrees (triangles, Δ) or +/−30-degrees (squares, □).

The numeric data represented in FIGS. 33A–B and the graphic data represented in FIG. 34 are directly related. The number of lumens contained within 1.6 mm×1.6 mm central bin 1062 in FIGS. 33A–B is related by dotted line 1082 in FIG. 34. Similarly, the number of lumens contained within the 3×3 array's 4.8 mm×4.8 mm boundary, as in FIGS. 33A–B, is related by dotted line 1084 in FIG. 34.

AG. Third Form: Deeper-Profile Multi-Layer LED Arrays Using Shaped-Wall Reflecting Bins The third form of the present invention, introduced previously in FIGS. 29A–B, features an LED light source array composed of contiguous reflecting bins 910 whose curved sidewalls 912 have been shaped to preserve etendue from LED input aperture 100 to angle-limited output aperture 914. An optional polarization recovery and reuse mechanism has been added by elements 84 (reflective polarizer) and 86 (quarter-wave phase retardation film) for applications needing polarized light. This compact array design is distinguished by its contiguous bin structure and in polarization-sensitive applications like LCD video projection, by its metallic sidewalls 912.

Despite the etendue-preserving array's remarkable brightness efficiency, the bin geometries impose fundamental limit on the number of output lumens that can be achieved per square millimeter. Best use applies to applications needing to maximize lumens per watt.

AH. Performance of an Etendue-Preserving Light Source Array

Suppose etendue-preserving reflecting bins 910 of FIGS. 29A–B contain, as described above, 1 mm green LEDs capable of emitting 100 lumens at 50 lumens/watt in 1 mm square input apertures 100. Each dielectrically filled bin has an output aperture edge size of 3.53 mm, and a length, L, 909, $(X_o+X_i)/2 \tan \theta_o=7.67$ mm, for output light at +/−25-degrees. Only 11 such bins fit in the projection-system-limited (12 mm×12 mm) illumination aperture at +/−25-degrees. Accordingly, this design yields 880 lumens at 22 watts (40 lumens/watt), including realistic material loss.

The non-etendue preserving multi-layered LED light source arrays of FIGS. 3A–B, 5A–C, and 11, with illustrative 1.6 mm bins fits about 56 bins in the same aperture area and yields 38.3 lumens per bin over the same angular range. This corresponds to a total output of over 2,000 lumens at 112.5 watts (19.4 lumens/watt).

It is clear than the etendue-preserving design of FIGS. 29A–B has a decided efficiency advantage, using 5 times fewer watts (and LEDs) over the same aperture. At the same time, the etendue-preserving design yields 2.5 times fewer lumens. Matched to the same aperture and lumens, the etendue-preserving design uses half as many watts as the non-etendue-preserving approach with half as many LEDs.

AI. Efficient Polarization Recovery and the Etendue-Preserving Light Source Array The LCD micro displays used in video projection systems such as described in FIGS. 13, 15A–C, 18, 22, 23, 26–28B used only polarized light. When un-polarized illumination is directed to their input apertures, half the light is discarded (either by absorption or reflection). A key aspect of the present invention has been including illumination processes that recover, convert, and re-use some portion of this otherwise wasted light.

One means of polarization recovery are films 84 and 86 in FIGS. 29A–B as described earlier. High efficiency is possible because of the particularly straightforward relation between films and metallic bins, along with the relatively few return cycles needed before recycled output is achieved.

An example of this process was discussed earlier. In summary, un-polarized LED light ray 1000 passes through the bin's dielectric fill material 911 and reflects from right hand sidewall 912 at point 1002. After reflection reflected ray 1004, remaining un-polarized, passes through quarter-wave phase retardation layer 86 with no effect and strikes reflective polarizer 84 at point 1006. With films 86 and 84 properly oriented with respect to each other, linearly polarized output ray 1008 is p-polarized, and linearly polarized reflected ray 1010 is s-polarized. When s-polarized ray 1010 passes back through phase retardation layer 86, its polarization state is converted from linear to left hand circular, as has been well established in prior art, and in previous examples above. So-converted, left hand circularly polarized ray 1012 passes back (in this one example) into the same bin from which it came, reaching left hand sidewall at point 1014, where it is converted again to right hand circularly polarized ray 1016 and specularly reflected downwards towards the LED at bin bottom point 1018. In this case, illustrative bottom point 1018 is the LEDs underside mirror. Accordingly, incoming ray 1016 is converted on reflection at 1018 back to left hand circular polarization as out-going ray 1020. Out-going ray 1029 reaches bin sidewall 912 at point 1022, and on reflection, converts back to right hand circular polarization, as ray 1024.

In the above sequence, circularly polarized rays made polarization-converting metallic reflections three times at points 1014, 1018 and 1022. Because of the odd number of metallic reflections, the state of circular polarization changed from the left-handedness of incoming ray 1012 to the right-handedness of out-going ray 1024. Accordingly, bin output ray 1026 converts from right hand circular polarization to linear p-polarization on passing back through phase retardation layer 86, and thereby, also through reflective polarizer 84 as p-polarized output ray 1028.

In this manner, the total amount of p-polarized light is incrementally increased. If bin sidewall reflectivity is $R_{BIN}$, LED mirror reflectivity, $R_{LED}$, phase retardation layer transmissivity, $T_{QW}$, reflective polarizer reflectivity, $R_{RP}$, and reflective polarizer transmissivity, $T_{RP}$, an estimate can be made of the potential polarization recovery gain. In this case, very few of the Fresnel reflections are actually lost completely from use. So, ignoring Fresnel reflections for convenience, it can be shown that the polarization recovery gain, η, is approximated by equation 8 below. Moreover, since output light is contained within a reasonably narrow angular range (the illustrative +/−25-degrees), transmissivity and reflectivity performance of wide band reflective polarizer 84 are higher than in the LCD backlighting applications for which they were first developed. With $R_{BIN}$ set at 0.95, $R_{LED}$ at 0.85, and $R_{RP}$ at 0.94, the estimated polarization recovery gain, η, becomes approximately 1.75.

$$\eta = 1 + (R_{BIN})^2 (R_{RP})(R_{LED}) \tag{8}$$

This analytical estimate was verified by actual laboratory measurements of polarization gain in a metallic reflecting system using green LEDs manufactured by LumiLeds, silver coated electro-formed nickel reflecting bins, wide band quarter wave phase retardation film manufactured by Nitto Denko and the reflective polarizer known as DBEF™ manufactured by 3M. The Nitto Denko phase retardation film was actually laminated to the DBEF using a non-birefringent pressure sensitive adhesive, and positioned as shown in FIGS. 29A–B, just above output apertures 100 of light-emitting bin array 910. Output light was collected through the 1" diameter entrance port of a 48" in diameter integrating sphere manufactured by Labsphere, Inc. An absorption polarizer was used to verify the linear polarization of the resulting output light. Measurements were made with and without the laminated film pack in place. Without the film pack, output light remained un-polarized. With the film pack in place as shown, measured output was linearly polarized.

The measurement of gain ratio involved the polarized light output with film pack in place divided by half the measured amount of un-polarized light without the film pack. Gain measurements varied between 1.7 and 1.75, depending on reflector quality.

AJ. Practical Aspects of Fabrication and Assembly

Critical material elements of the instant inventions included herein are the metallic reflecting bin arrays (element 12 and 22 in FIGS. 1A–B, element 60 in FIGS. 2A–C, element 82 in FIGS. 3A–B, 5A–C and 11, element 126 in FIG. 4A and element 910 in FIG. 29A), the LED chip (element 20 in FIGS. 1A–B, element 70 in FIG. 2, element 118 in FIGS. 3A–B, 5A–C, 6, 11, 19–21 and 29A–B), prism sheets (elements 4 and 6 in FIGS. 1A–B, elements 88 and 92 in FIGS. 3A–B, 5A–C, 11, 20 and 31B), polarization recovery films (element 28 in FIGS. 1A–B, element 56 in FIG. 2, elements 84 and 86 in FIGS. 3A–B, 5A–C, 11, 15A–E, 17, 18, 23, 26 and 27, and elements 870 and 872 in FIG. 28A) and conicoidal (hemispherical or ellipsoidal) collecting mirrors (element 332 in FIGS. 15A–E and 16, element 382 in FIG. 17, element 394 in FIG. 18, element 650 in FIG. 22A–B, element 802 in FIG. 26, elements 370 and 850 in FIG. 27, and elements 862 and 864 in FIG. 28A).

AK. Fabrications and Processing of Critical Parts

All critical parts are either available commercially, or have been fabricated using existing commercial infrastructures. The information provided below is for purposes of illustration only. More suitable materials and processes are likely to develop over time.

AL. Metallic Reflecting Bin Arrays

The generalized non-etendue-preserving bin arrays shown in the perspective view of FIG. 4A have square (or rectangular) symmetry. While analogous circular and hexagonal structures are permissible, the square (or rectangular) forms of FIG. 4A are the most straightforward, and match the shape of current LED chips. Such structures are formed using conventional form tool 128 or in materials like silicon compatible with crystallographic-based reactive ion etching. Conventional tool masters such as element 128 in FIG. 4B are cut or ruled in a relatively soft metal such as copper or nickel using pre-shaped diamond cutters. The master tool (a negative pattern) is then copied by nickel electroforming, in two well-known process steps (first making the positive structure, and then electroforming the positive to make the negative copy). The negative tool copy is then used repetitively to make the desired bin arrays. These arrays can be based on the nickel electroforms themselves, or the tool copy can be used to emboss or mold this pattern into a high temperature resistant polymer. In either case, the as-formed bin array sidewalls 106 are then coated with a high-reflectivity metallic film (i.e. silver or aluminum), by vapor deposition (evaporation, CVD, or sputtering) or electroplating.

One additional complication of the electroforming process is that it doesn't provide intrinsically for the clear holes needed in each bin element from input to output aperture. The excess nickel electroform material must be physically removed by cutting, grinding or polishing, just to the top of the tool mesas 129 as in FIG. 4B. This extra step is not necessary when molding casting or embossing a polymer (or glass-polymer alloy), as double-sided tooling is a practical consideration.

When forming metallic parts, the backside of the array (i.e. nearest the LED) is insulated with a layer of photo-resist, spun on glass, silicon dioxide, aluminum oxide or other non-conductor.

The same methods are used to form the deeper etendue-preserving bin arrays of FIGS. 29A–B.

AM. LED Chips

The instant light source array inventions depicted by FIGS. 3A–B, 5A–C, 11, 29 and 31A–B are best embodied with flip-chip LEDs as have been described earlier, because the flip-chip mounting style facilitates making electrical interconnections. The older vertical-junction-type LEDs requires one connection on the chip bottom, and another on the chip top (usually a gold wire bond). Although planar methods have been described for avoiding top-of-chip wire bonds, they introduce considerable assembly process complexity.

Another advantage of the flip-chip format is that it enables using a highly reflective underside mirror (element 125 in FIG. 6B). Manufacturers making LEDs without this feature may not be able to achieve as high a level of luminous flux (lumens) as does LumiLeds with their Luxeon™ styled 1 mm and 2 mm flip-chips. Moreover, using LEDs without underside mirror 125 within present light source inventions reduces illuminator efficiency primarily by reducing the effectiveness of angular and polarization recycling processes. As one example or this, consider right hand circularly polarized ray segment 1016 in FIG. 29A. Without mirror 125 being a part of LED chip 118, not only would there be very little energy in reflected ray 1020, but there would be no effective polarization conversion at point 1018. Without polarization conversion occurring at point 1018, this illustrative component of recycled energy would remain trapped within the light source.

AN. Prism Sheets

The prism sheets preferred for best mode results using the instant inventions of FIGS. 1A–3B, 5A–C, 11 and 31B are those, as described above, whose 25–100 micron sized micro-prisms nominally contain 100–108-degree apex angles, and that have been formed using a non-birefringent optically transparent polymeric material.

Ordinary commercially available micro-scale prism sheets are made with only 90-degree prisms, and may involve additional modifications (peak rounding, prism rounding, and diffusing substrates, as well as deliberate prism height and prism pitch variations) added for performance enhancements in the direct view LCD display applications for which they are intended. Minnesota Mining and Manufacturing Company (3M) produces such materials under a variety of BEF-related trade names including BEF, BEF II, BEF III-M, BEF III-T, RBEF, WBEF and more recently, under the general envelope of Vikuiti™, both sold as display enhancement products specifically for directly viewed LCD panels. BEF II is supplied with 24 and 50-micron 90-degree prisms, BEF III with 50 micron 90-degree prisms. M designates a matt or diffusing substrate, T, a transparent substrate.

In addition to providing less preferable prism geometry, all 3M-made film products have intrinsic birefringence, which limits their performance in applications of the present inventions involving polarized light.

AO. Polarization Recovery Films

Polarization recovery films include a reflective polarizing film 84 and a quarter-wave phase retardation film 86, either separately or as a laminated pair or pack.

The best commercially available reflective polarizers are those supplied by 3M under the trade names DBEF and DBEF M for dual brightness enhancement film with and without a diffuser, and DRPF for diffuse reflective polarizer film. For use as element 84, the DBEF product is preferred. All reflective polarizers 84 include a designated polarization axis that, for best results with the present light source inventions, must be oriented at or about 45-degrees to the designated axis of quarter-wave phase retardation film 86.

The best quarter-wave phase retardation films for use as element 86 are those supplied by Nitto Denko. These are pre-stretched polymer films with a designated alignment axis.

AP. External Mirrors

A variety of conicoidal reflectors have been described, whose shape is either hemispherical, cylindrical with hemispherical reflecting rings, cylindrical with rings containing corner cube retro-reflecting elements, or ellipsoidal. These elements can be made by a wide variety of conventional forming processes including numerically controlled machining, fly cutting, molding, casting and electroforming, to give a few examples. The elements can be made from a continuous piece of material (metal or plastic), or can be formed in sections that are later snapped, soldered or glued together. Forming in sections is most convenient for the cylindrical geometries (i.e. half cylinders).

AQ. Integration and Interconnection of LED Chips

The instant LED light source array inventions of FIGS. 1A–3B, 5A–C, 11, 29A–B and 31A–B require making electrical interconnection to the positive and negative sides of as few as 1–9 high-power LEDs, and as many as 64. This means assuring not only proper voltage drop across each diode (nominally about 3 volts; typically 2.5–3.5 volts), but also the means for the maximum current flow required (nominally 0.667 amperes for the higher operating power possible in the near future (typically 0.35 amperes to 0.700 amperes).

Generally, there are four regimes of practice: providing a separate constant current source for each LED; wiring all LEDs in series, wiring all LEDs in parallel, and some practical combination. The means of incorporating these different wiring arrangements will be illustrated below for the two prevailing interconnection possibilities: individually sub-mounted LED chips, and all LED chips in the array mounted to a common substrate circuit.

AR. Interconnection of Separately Sub-Mounted LED Chips (as in FIGS. 35A–E and FIG. 36)

Commercially-available high-power flip-chip LEDs, such as those represented in FIGS. 6A–C, are currently pre-mounted (i.e., by LumiLeds) mirror 125 side down on silicon substrate circuits 112, with accessible positive and negative electrode pads 116 and 114 as the external lead-outs from the proprietary solder-bump electrical interconnections made under LED chip 118 to mirror electrodes 125.

Using individually pre-mounted structures is possible, as represented schematically in FIGS. 35A–E, although doing so is generally inconvenient particularly for large LED arrays, since this corresponds to twice the effort. For small arrays, the method of FIGS. 35A–E is manageable, but for the relatively large (i.e., 6×8) arrays illustrated, a two-step interconnection process is much more labor intensive than necessary.

Figure 35A:
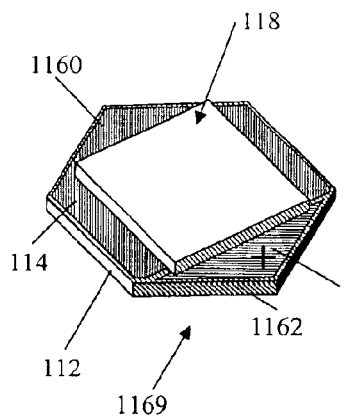
FIG. 35A is a schematic representation of one type of sub-mounted flip-chip LED having a hexagonal sub-mount circuit with positive and negative contacts on opposing hexagonal points.
Figure 35B:
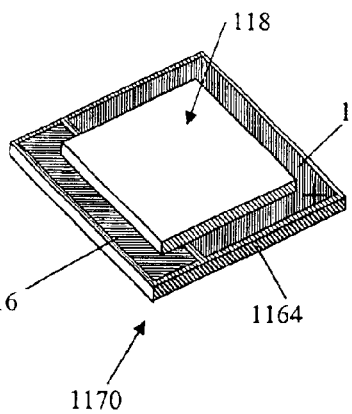
FIG. 35B is a schematic representation of one type of sub-mounted flip-chip LED with square sub-mount circuit.
Figure 35C:
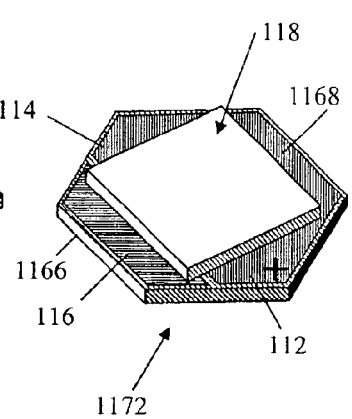
FIG. 35C is a schematic representation of another type of sub-mounted flip-chip LED having a hexagonal sub-mount circuit with positive and negative contacts on opposing hexagonal edges.
Figure 35D:
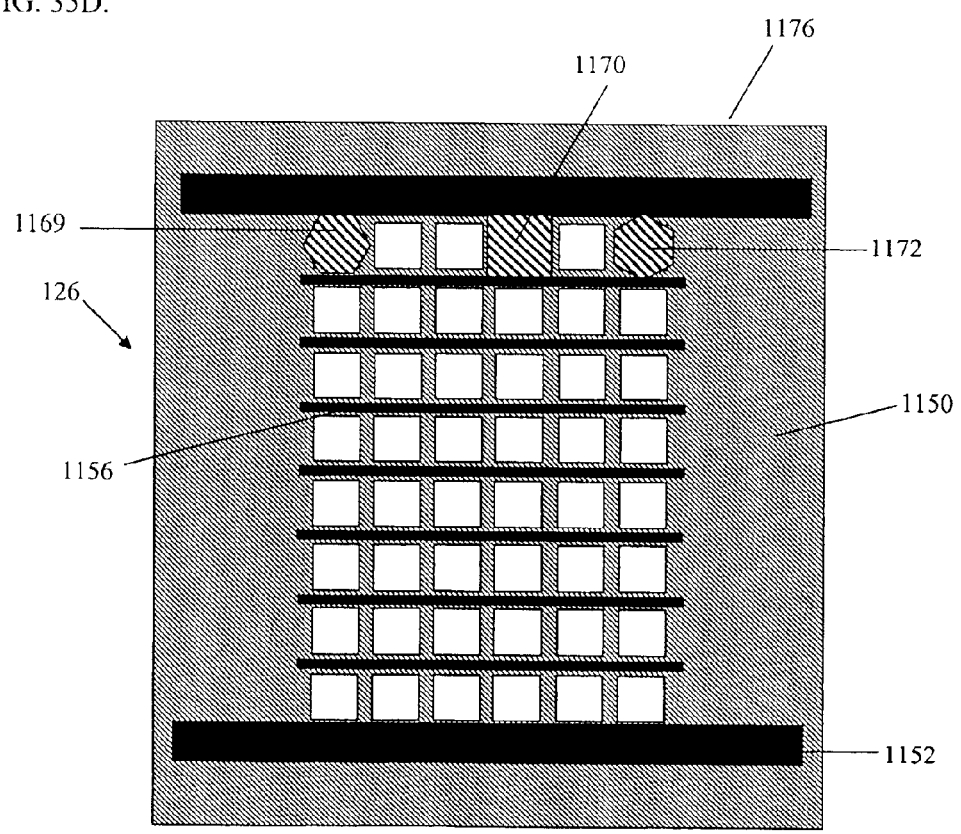
FIG. 35D is a schematic back-side representation of an illustrative series-parallel electrical interconnection circuit applied to the bottom of the metallically reflecting bin arrays shown in the cross-sections of FIGS. 3A–5C and 29A–B, the bin arrays used as a means of attaching and interconnecting an array of the discretely sub-mounted flip-chip type LEDs shown in FIGS. 35A–C.

The method of FIGS. 35A–E was first introduced in principle by the cross-section of FIGS. 3A–B, where LED chip 118 was inserted through input aperture 100 of reflecting bin layer 82, so that its LED sub-mount 112 makes physical and electrical contact with the underside of bin array sidewall structure 105. FIG. 35D is an illustrative top view of this bin array layer back plane. If bin layer 82 is made of an electrically conductive material such as nickel or silicon as described previously, its backside (diagonally ruled) must be insulated with a thin non-conductive over coating such as for example, photo-resist, silicon dioxide, aluminum dioxide or a spin-on-glass 1150. If bin layer 82 is made of a suitable high-temperature polymeric material such as a thermo set resin, no secondary-insulation layer 1150 is necessary.

In either case, a thin-film electrical circuit layer 1152 is deposited or printed as shown, so that a particularly then means is provided for electrically conductive interconnection to sub-mounted electrode pads like 114 and 116 on each pre-mounted LED as in FIGS. 35A–C. The use of conventional gold wire bonds would restrict the degree of physical proximity possible between bin array 82 and LED sub-mount 112. Best performance by the instant inventions and their previous descriptions, require the bottom of the LED's physical substrate to be made as close to co-planar with bottom surface 1154 of bin array sidewall structure 105 as possible.

Ordinarily, a convenient way to form such a thin delineated printed circuit is by means of photolithography. In such a case, and to avoid the possibility of short circuits between the conductive film material and the conductive bin array material (if it is conducting), it is best that the conductive circuit elements such as 1156 are made physically narrower than the insulated space upon which they are to be formed. There are several common photolithographic means to achieve this condition, including the lift-off process wherein photo-delineated photo-resist is over-coated with a vapor-deposited gold film. After deposition, the photo-resist is dissolved, and the unwanted gold is carried away leaving the desired conductive pattern. Thickness of the gold conductors can be increased to several microns by subsequent gold electroplating. At least 2 microns of conductor thickness are preferred so as to accommodate the high electrical power levels involved.

Figure 35E:
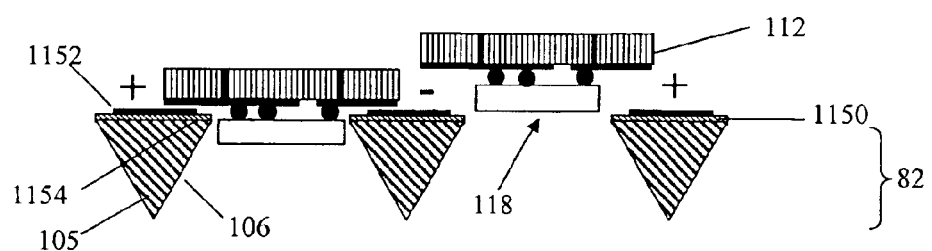
FIG. 35E illustrates by means of a cross-sectional view how a sub-mounted LED of FIGS. 35A–C is assembled to the micro-reflecting bin array depicted in FIG. 35D.

A schematic cross-section of the LED insertion process is shown in FIG. 35E. Two illustrative reflecting bins are shown in cross-section, with an LED 118 about to be inserted downwards into the right hand bin, and another LED already properly inserted downwards into the left hand bin's aperture. It can be seen that LED sub-mount contact pads 114 and 116 touch the bin arrays adjacent conducting bars 1156.

AS. Sub-Mount Styles: FIGS. 35A–C

LumiLeds Luxeon™ sub-mounts 112 are currently hexagonally shaped, with positive pad 116 and negative pad 114 relative to the hexagonal points 1160 and 1162 as in 1169 of FIG. 35A. Equally feasible is square sub-mount 1164, as in upper center 1170 of FIG. 35B, and hexagonal sub-mount 112 with opposing contact pads 114 and 116 relative to two opposing hexagonal edges 1166 and 1168 as in upper right detail 1172 of FIG. 35C.

In any case, compatibility with the array inventions of FIGS. 1A–3B, 5A–C, 11, 29A–B, and 31A–B requires the maximum size of sub-mount 112 to be adjusted so that it is less than or equal to the pitch of the array. In the example above for non-etendue-preserving shallow bin light source arrays illustrated in the cross-section of FIG. 5A, the reflecting bins are 1.6 mm square and arranged contiguously. As such, compatible LED sub-mounts must be just less than 1.6 mm. If size compatibility is not considered, sub-mounts 112 in FIGS. 35A–C could not be placed on the bin array plate of FIG. 35D without physically interfering with each other.

AT. Interconnection Circuitry on Bin Array Bottoms: FIGS. 35D–E

The illustrative electrical circuit shown in FIG. 35D for a 6×8 bin array is composed of 9 parallel (electrically conductive) buss bars: 1176 for positive voltage, 7 thinner bars like 1156, and ground bar 1152. This particular circuit connects all 6 LED sub-mounts in any of the 8 rows in parallel, and then the six rows in series. The LED sub-mounts in any column would therefore be oriented p-n, p-n, p-n, p-n, p-n, p-n, p-n, and p-n from top to bottom; and in any row, each diode would have identical orientation. Another related interconnection scheme is shown schematically in FIG. 36 in which each set of two adjacent LED sub-mounts in every row are connected in parallel.

Figure 37:
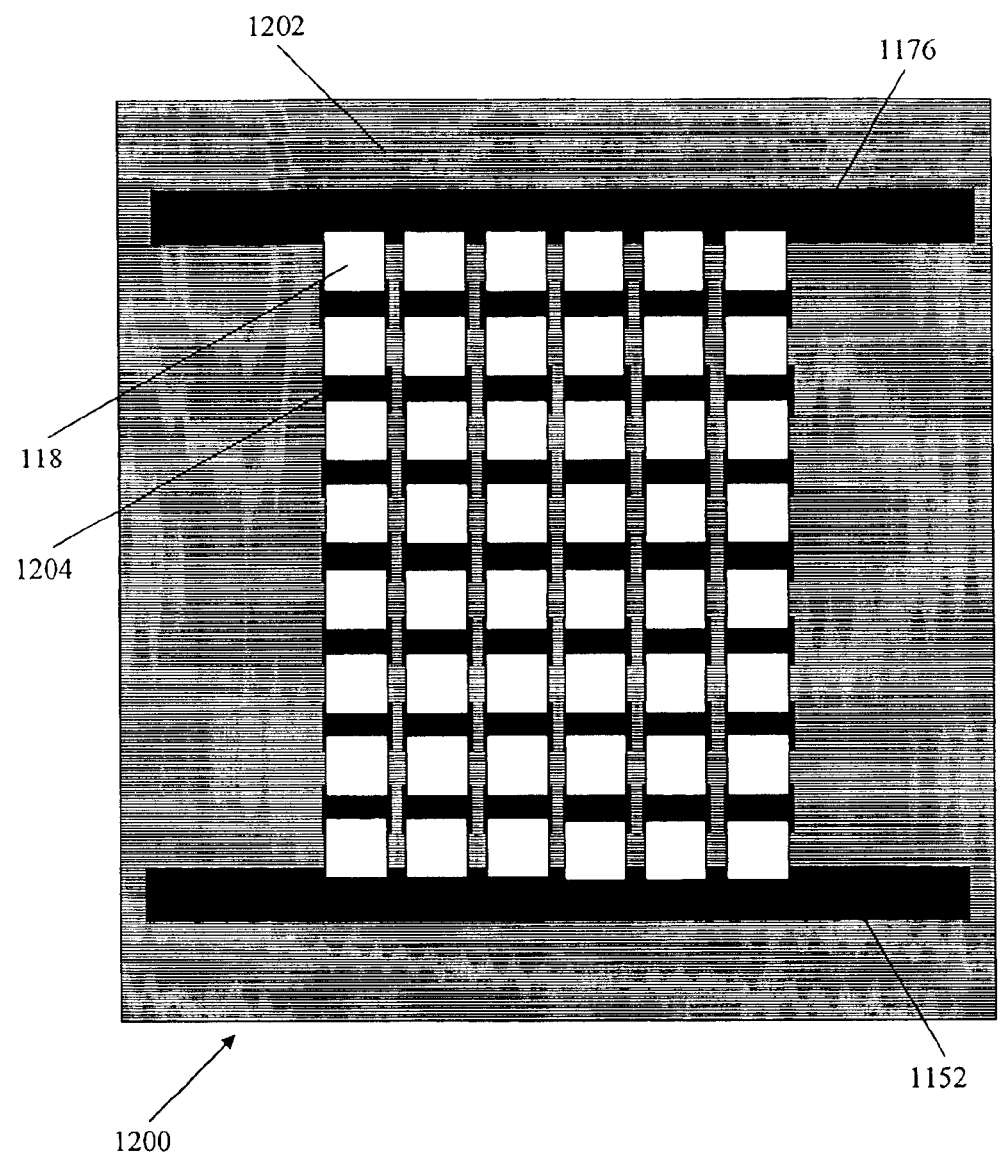
FIG. 37 is the schematic representation of another illustrative series-parallel electrical interconnection circuit applied to the top surface of a planar substrate for the purpose of attaching and interconnecting an array of un-mounted flip-chip LEDs for use with the bin arrays of FIGS. 3A–5C and 29A–B.
Figure 38:
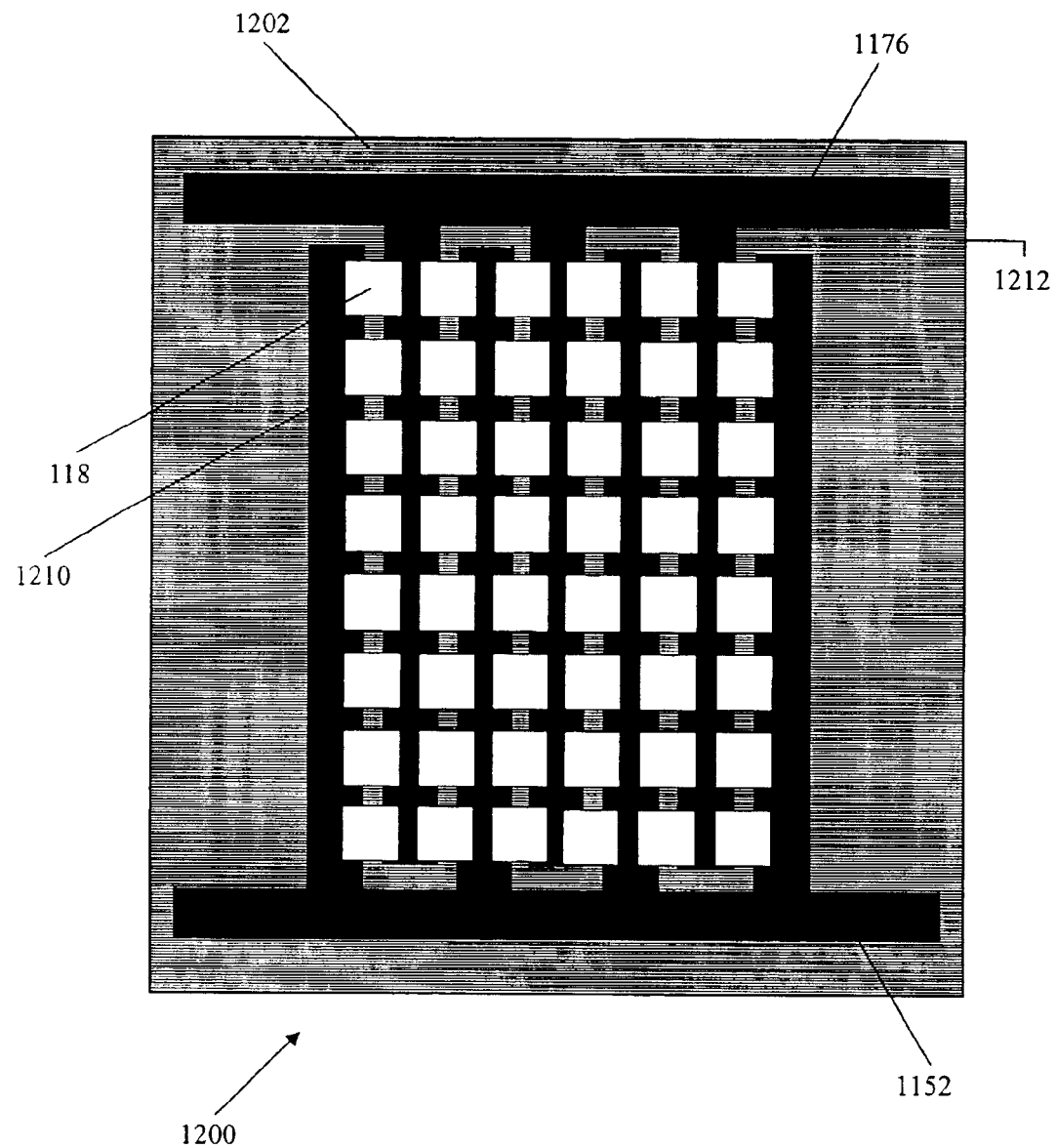
FIG. 38 is the schematic representation of the completely parallel electrical interconnection circuit applied to the top surface of a planar substrate circuit for the purpose of attaching and interconnecting an array of un-mounted flip-chip LEDs for use with the bin arrays of FIGS. 3A–5C and 29A–B.

AU. Interconnection of LED Chips on a Common Back Plane Circuit: FIGS. 37–38.

A better way of interconnecting an array of LED chips 118 for use in the instant inventions herein is to arrange the LED chips 118 in rows and columns on a common back plane circuit such as 1200 as depicted schematically in the top view of FIG. 37. The individually sub-mounted LEDs are sawed from a larger silicon wafer to which they have been permanently attached. Rather than perform this extra cutting step, each master silicon wafer can be arranged with larger regions 1200 of properly oriented interconnection pads for the flip-chip LEDs in each array. Then individual array regions 1200 can later be sawed from the master wafer rather than the individual chips. The silicon wafer has been pre-oxidized to provide insulating barrier layer 1202 between the silicon itself a semiconductor, and over-lying conducting circuit elements 1152, 1176 and 1204. Oxidized silicon layer 1202 is preferred in that it minimizes the chances of leakage paths through the semi-conducting silicon for the high current levels flowing in the electrical circuitry. As in FIGS. 35D and 36, the black bars correspond to photo-delineated conducting films (i.e. vapor or electrodeposited gold). In the illustrative circuit of FIG. 37, LED chips 118 placed in 6 columns on the 6×8 array shown in this particular illustrative view, wired in series from positive supply buss conductor 1176 to electrical neutral or ground buss 1152. Individual interconnection bars 1204 straddle each two adjacent LED chips 118. Upper and lower buss bars 1176 (upper) and 1152 (lower) assure that the 6 columns are connected in parallel.

Figure 36:
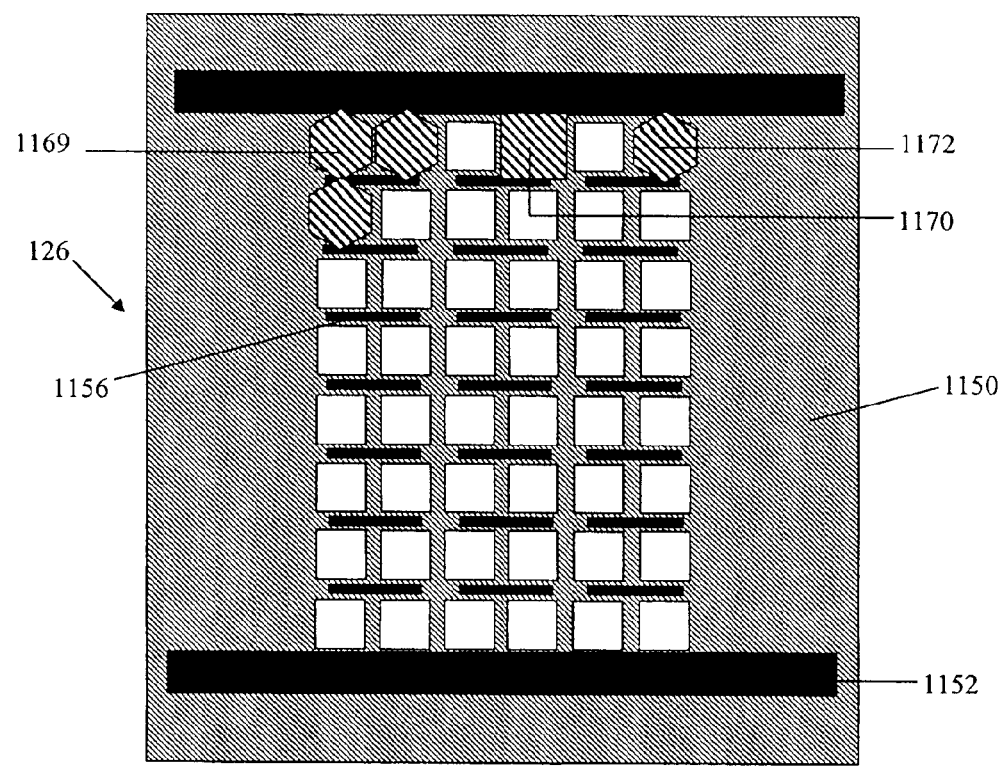
FIG. 36 is a schematic representation of the micro-reflecting bin array of FIG. 35D except for the use of a different series-parallel electrical interconnection circuit.

Yet another circuit arrangement beyond those examples in FIGS. 35–37 is provided in FIG. 38, in which all 48 LED chips 118 are connected in parallel. The conductive circuit that achieves this type of interconnection is the well-known inter-digital electrodes used in many types of electronic devices. One advantage of its use herein is that the voltage-drops across each LED in a column are equivalent. This is because the sum of the lengths of inter-digital conducting bars 1210 and 1212 from source buss to any particular LED in a column is always constant.

Each LED chip in the array is attached to the conductive circuit by the same solder-bump process used currently by manufacturers of flip-chip products like LumiLeds, as symbolized in FIGS. 35D–E and 36.

The principal advantage of this interconnection method is that any reflecting bin array 82 such the one shown by partial perspective in FIG. 4A can be simply over-laid on the common back plane, even by hand. The only requirement for the success of this assembly step is that each LED must have been placed onto element 1200 within the rather wide tolerance allowance provided by each bin's slightly over-sized input aperture. As shown in the cross-sectional details of FIGS. 3A–B, 5A–C and 11, bin aperture $X_i$ 100 is made deliberately larger than LED chip size $X_c$, 97 (as in FIGS. 3A–B) by some practical amount (i.e., $X_i=1.1X_c$ or $X_i=1.05 X_c$).

The principal drawback of the common LED back plane 1200 is that every LED chip 118 bonded to it must be functioning properly (or at least within acceptable limits) for the array to perform satisfactorily in any given application. The use of individually-sub-mounted LEDs allows, in principal, for each device element to be checked for performance prior to its attachment to element 1200.

While some means of testing can be developed for the bare LED chips, prior (and even during) the process of attaching them to the array, it is important to realize that within the instant inventions herein, it is not essential for every LED chip 118 in the array to perform either identically or even similarly. That is, the use of the non-etendue-preserving instant light source inventions of FIGS. 1A–3B, 5A–C, 11 and 31A–B as integrated by the system inventions of FIGS. 13, 15A–E, 17, 18, 22A–23B and 26–28E provides sufficient spatial averaging in the output beam conveyed to (and through) output aperture 304, that less than ideal LED array uniformity is tolerated. Moreover in the illustrative 48-element arrays of FIGS. 35A–38, the completely unsatisfactory performance of even 5 devices, worst case, reduces expected output lumens by only 10% (or less).

AV. Special Applications in LED-Based Video Projection

The LED light source inventions described above apply to two different classes of video projection system application: those driven by total lumens regardless of power efficiency of light source arrays of FIGS. 1A–3B, 5A–C, 11 and 31A–B) and those lower-powered designs driven by the higher wattage efficiency of light source arrays of FIGS. 29A–B).

Although some useful examples have been given along the way in the course of the discussions above, it serves in summary to contrast the differences between these two commercially important application regimes. Before doing so, however, the underlying geometrical relationships common to both regimes are summarized for convenience.

AW. Geometrical Relationships in Preferred LED-Based Projection Systems (as in FIGS. 13, 15A–E, 18, 22, 23 and 26–28E)

A preferred arrangement for integrating the planar LED light source array of the instant inventions in a video projection system has been generalized in FIG. 13. [The same basic principles apply to the equivalent systems of FIGS. 15A–E, 18, 22A–B, 23A–B and 26–28E.] In this illustrative configuration, space 317 between light source 300 and condensing element 308 is typically air, and space 319 between condensing element 308 and the LCD (or DMD) 306 is taken up by a system-specific dielectric element. The form of this intervening medium and the effective location of LCD (or DMD) 306 (as in FIG. 13 or rotated 90-degrees from the position shown in FIG. 13) depend on the projection system architecture. That is, when using an LCD that is reflective, the intervening medium becomes a polarizing beam splitter. When the LCD is transmissive the intervening medium may either be empty (air), or for field-sequential applications using a single LCD, may be a dichroic color mixing X-cube, dichroic reflecting plates or dichroic prism group.

As one possible example common to both high lumen and low wattage operating regimes, a single transmissive LCD 1400 is considered whose switching speed has been made fast enough for practical field sequential operation (i.e. >180 Hz). In this case, the geometry of FIG. 13 in the X-meridian becomes that of FIG. 46, wherein three separate mono-colored illumination channels (1404, green; 1402, red; and 1406, blue) surround the three adjacent sides of a color-mixing element (in this case dichroic X-cube 1364). Color mixing element 1364 combines the three illumination beams from each channel's condensing element 308 into a single output beam whose angular range has been reduced to $\phi_{LCD}$ in air and $\phi'_{LCD}$ in the dielectric medium. The three planar LED light source arrays 300 (e.g., FIGS. 15B–E, 29A–B) are represented by 1390 (green), 1388 (red) and 1392 (blue). In fact, each illumination channel consisting of an LED light source array and a condensing element, become light engine cores (1404, green; 1402, red; and 1406, blue) of the higher-level projection engine.

Figure 43:
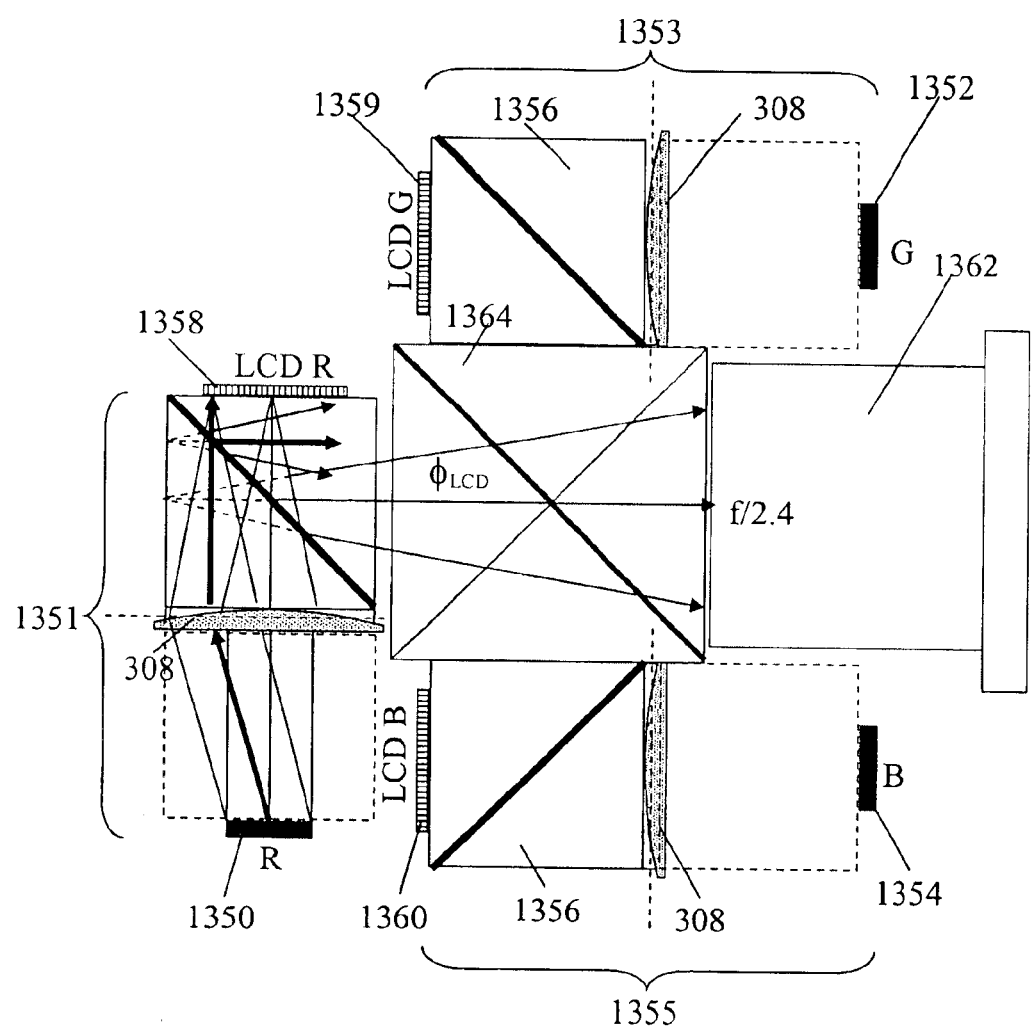
FIG. 43 is a schematic cross-section of an illustrative video projection system for three reflective LCDs, based on the focal plane optical system layout of FIGS. 1A–B3 and the planar light source arrays of FIGS. 3A–B, 5A–C, 11, 29A–B and 42A–B.

The first geometric design condition pertinent to FIGS. 13 and 43 is described by equation 9. It represents the minimum possible focal length for condensing elements 308, as measured through the illustrative optical media of dichroic mixing cube 1364. This media may also be a polarizing beam splitting cube, air, a polarizing beam splitter plate, dichroic reflecting plates or group of optically coupled dichroic prisms.

$$FL_{MIN,media} = \frac{Y_{LCD}}{(1 - 2\text{Tan}(\text{Sin}^{-1}(1/2n(f/\#))))} \quad (9)$$

Figure 46:
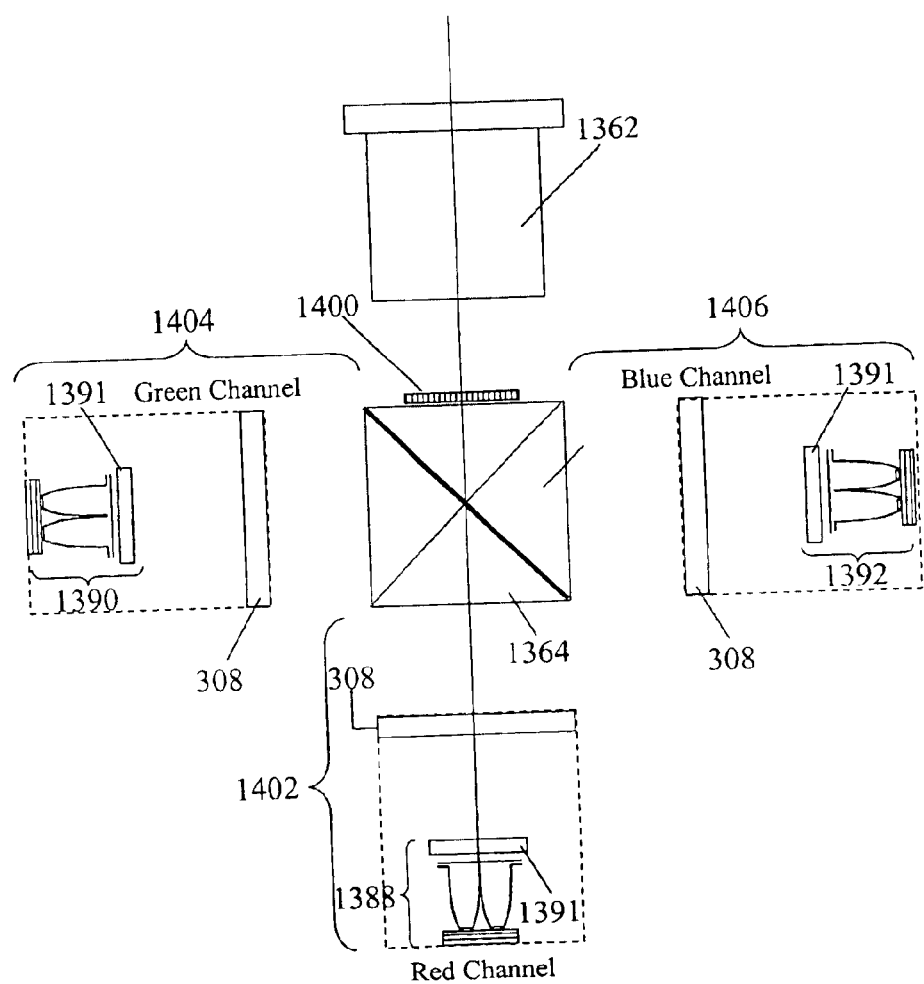
FIG. 46 is a schematic cross-section of an illustrative video projection system for a single transmissive LCD operated field-sequentially based on the focal plane optical system layout of FIG. 13 and the planar light source arrays of FIGS. 1A–3B, 5A–C, 11, 29A–B and 42A–B (shown illustratively with the etendue-preserving light source array of FIG. 42A–B).

The shorter edge length of the LCD, $Y_{LCD}$, is that which extends into the x-meridian planes of both FIGS. 13 and 46, n is the refractive index of X-cube 1364, and f/# refers to the acceptance angle in air of projection lens 1362.

When the projection system's f/# is 2.4 (i.e. +/−12-degrees as in the above examples), refractive index 1.49, and a 1.2" diagonal LCD 1400 with 4:3 aspect ratio is used, the minimum focal length caused by the mixing cube medium (i.e., 310 in FIG. 13, 1364 in FIG. 46) becomes 25.49 mm. A corresponding expression for the minimum focal length in air on the light source side of the light engine (i.e., 311 in FIG. 13) is given by equation 10.

$$FL_{MIN,air} = \frac{0.5X_{ILL}}{\text{Tan}\phi'_{LCD}} = \frac{0.5X_{LCD}}{\text{Tan}\theta_{ILL}} \quad (10)$$

For the same conditions, this back focal length 311 is 16.9 mm. With the focal lengths fixed at their physical minimums, calculation is made of the maximum possible illumination aperture, $X_{ILL}$, 302 in FIG. 13, using equations 9 and 10 to form equation 11.

$$X_{ILL,max} = \frac{2Y_{LCD}\text{Tan}\phi'_{LCD}}{(1 - 2\text{Tan}\phi'_{LCD})} \quad (11)$$

It follows that $X_{ILL,\ max}$ is 7.2 mm, which might be considered too small for some applications. If so, the illumination aperture may be increased progressively by just increasing the system's focal length, as by the simple geometry of equation 12, where focal length and LCD aperture angle are both either in air or in media. Of course, by doing so, the effective illumination angle, $\theta_{ILL}$, decreases proportionally.

$$X_{ILL,extended} = 2(FL)\text{Tan}\ \phi_{LCD} \quad (12)$$

For example, suppose the system's focal length and the size of mixing cube 1364 in FIG. 46 were increased to 41 mm (a size increase of 1.6×). By equation 10, this change corresponds to a lower side focal length in air of 27.18 mm. Then, by equation 12, the illuminator size 302 in FIG. 13 that results has expanded to 11.58 mm. At the same time, equation 10 shows that the effective illumination angle, $\theta_{ILL}$, drops from its X and Y meridian values in air of +/−35.82-degrees and +/−28.42-degrees (average +/−32.12-degrees) before the focal length increase, to +/−24.16-degrees and +/−18.59-degrees (average +/−21.36-degrees) after the change. Whether the tradeoff between system size, illuminator size and illumination angle is worthwhile depends on making detailed analyses using a predictive systems model, such as the one described above, or performing corresponding lab experiments using real parts.

The clear aperture of condensing element 308, from the geometry of FIG. 13 is approximately equal to the cornerto-corner length of LCD (or DMD) 306 plus the corner-to-corner length, $(X_{ILL}^2+Y_{ILL}^2)^{0.5}$, of light source array 300.

The general characteristics of this invention will become apparent considering illustrative examples using each type of optimized illuminator.

AX. Optimum Performance of High Output (Non-Etendue-Preserving) LED Arrays

The analyses discussed in sections A–H for non-etendue-preserving LED-filled bin arrays of the present invention are summarized by the results of FIGS. 7–10, 12 and 14. Preference was found, in the illustrative case of 1 mm sized LEDs, for 1.6 mm square reflecting bins, 0.174 mm deep, flat-tapered reflecting walls, 1 mm input apertures, and prism sheets having apex angles about 104-degrees full angle. Maximum lumen output as a function of angular range enclosed is given in FIG. 39 for effective bin reflectivity 0.95, bin-fill medium refractive index 1.49, prism sheet material refractive index 1.49, and 1 mm LEDs emitting 100 lumens/mm².

Figure 39:
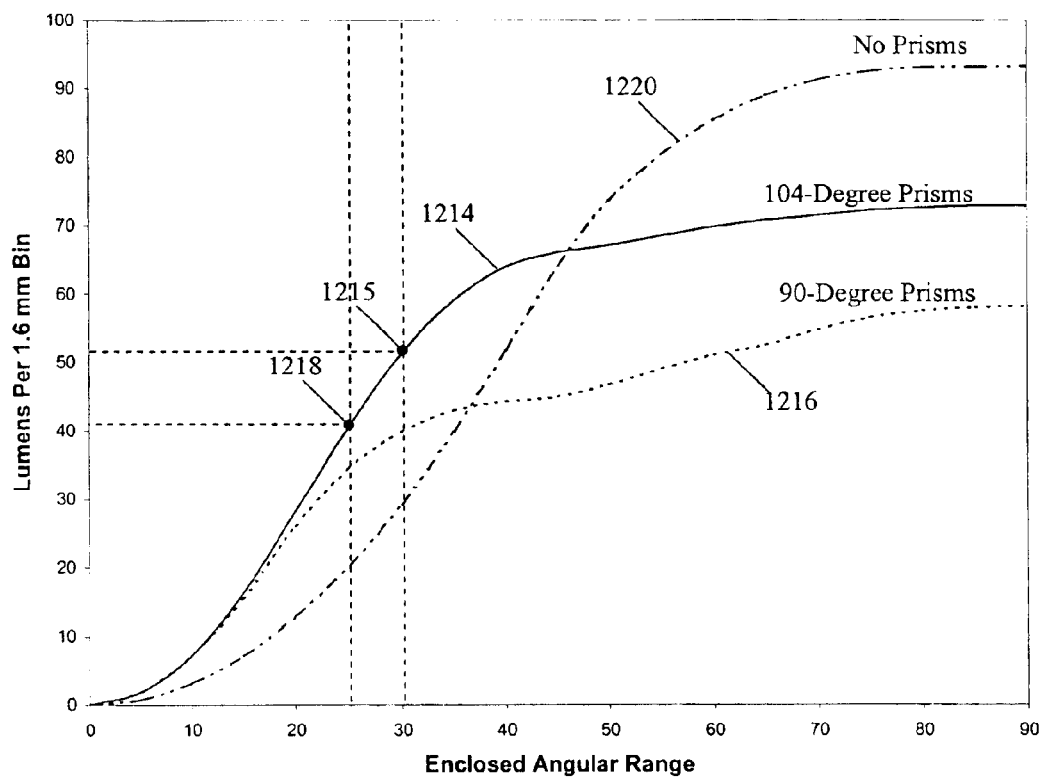
FIG. 39 shows graphical results for the lumens produced by a single 1.6 mm bin in the optimized LED light source array of FIGS. 3A–B and 5A–C as a function of the enclosed angular range of emitted output for three LED bin array cases: no elevated prism sheets, elevated prism sheets with 90-degree prisms and elevated prism sheets with optimized 104-degree prisms.

Curve 1214 represents the optimum result in un-polarized lumens per bin with 104-degree prism sheets 88 and 92 (i.e., without any polarization recovery or re-use). The addition of polarization recovery layers 84 and 86 between the prism sheets and the bin aperture results in polarized output approximately 1.5 times the half-values shown in FIG. 39, provided neither sheets 88 or 92 are made of birefringent material or show effects of residual birefringence. Curve 1216 is the result using prism sheets with standard 90-degree prisms. Curve 1220 shows the performance from the reflecting bins by themselves without any cooperating optical over-layers. The addition of polarization recovery layers 84 and 86 in this case results in a measured polarized output 1.7 times the half-values shown in curve 1220.

The net un-polarized output contributed per bin over +/−25-degrees for the optimized case of curve 1214 is 41 lumens (point 1218); and over +/−30-degrees, about 52 lumens (point 1215). The comparative results for standard 90-degree prisms are 33 and 39 lumens respectively. Hence, the advantage of using optimized 104-degree prism sheets over 90-degree prism sheets is therefore about 24% (over +/−25-degrees) and 33% (over +/−30-degrees). The advantage of using optimized 104-degree prism sheets over reflectively binned LEDs without cooperative action, over either angular range, is about the factor of 2 predicted in earlier analyses.

Figure 40:
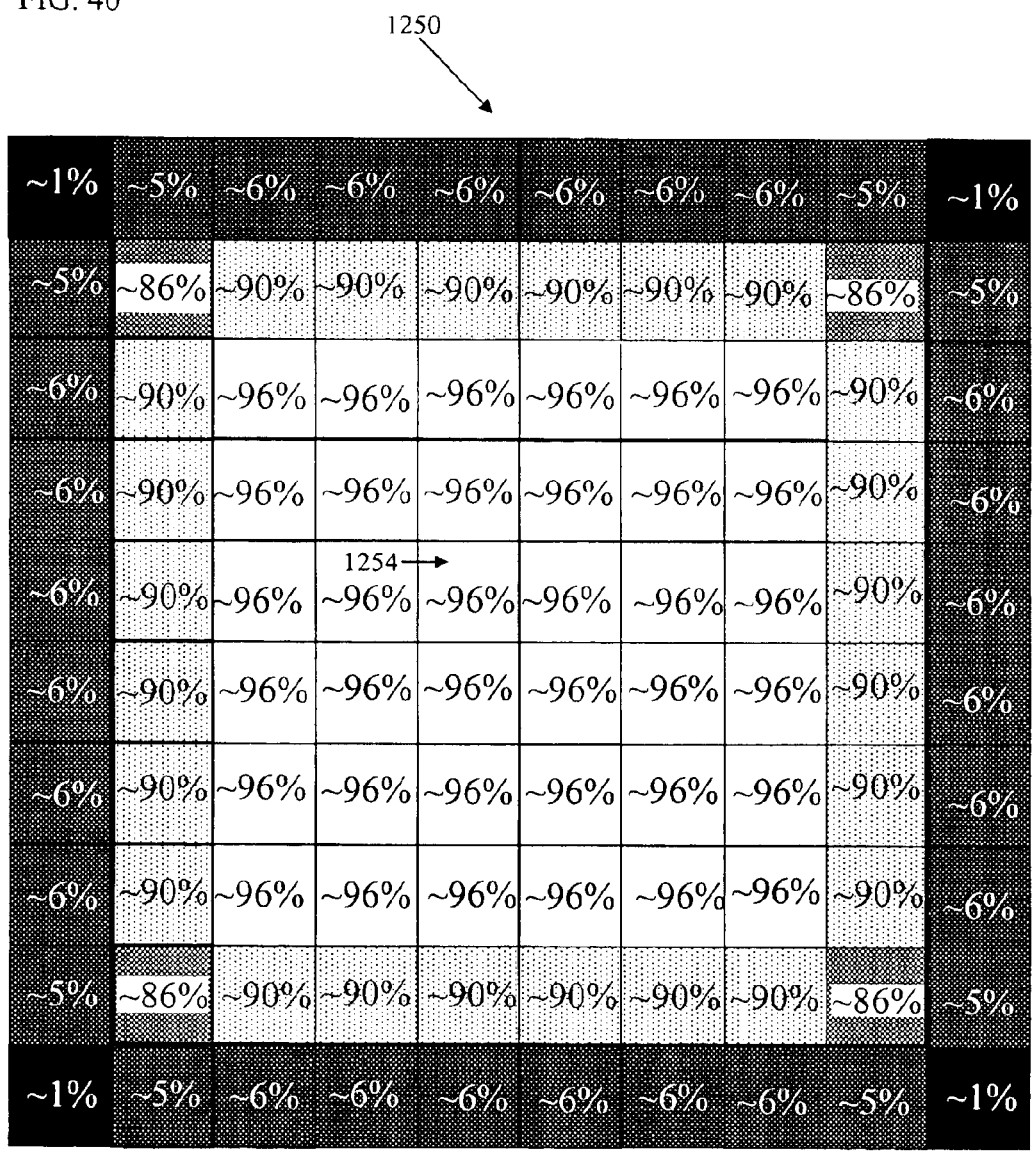
FIG. 40 is a schematic representation of the top view of an 8×8 bin LED light source array with all 64 LEDs operating, showing the spatial output percentage contributed by each 1.6 mm square bin region.

Light distribution across the aperture of a non-etendue-preserving bin array develops by means of the spatial overlap mechanism described in FIGS. 33A–B for the case of single lighted bin 1062 surrounded by 8 unlighted neighbors. FIG. 40 is a top view of an analogous representation of light output over 64-bin array 1250 when all array elements are lighted. The percentage value shown centered within each bin region corresponds to the bin's net output fraction produced within the angular range of interest (in this case, +/−25-degrees). These values already take into account the inherent inefficiency of the non-etendue-preserving process displayed in FIG. 39, which at +/−25-degrees is about 40% of the total lumen output per bin. Average output from the 64-bin array aperture 1252 is 90% of the total lumens produced, from the output ratio [(36)(0.94)+(24)(0.86)+(4)(0.81)]/[64]. This means that with 40 lumens produced by each of the 64 bins, 2,300 lumens are generated within a +/−25-degree beam.

The schematic representation of FIG. 40 directly illustrates the degree of spatial non-uniformity occurring across the array's physical aperture 1252, $X_{ILL}$. This characteristic is not so important in general lighting applications where some intensity roll-off at the beam periphery is even desirable. Beam uniformity, however, is a very important contributor to the brightness uniformity of projected images.

Spatial non-uniformity in this illustrative beam occurs only in the beam periphery. The dark-toned frame of weak output in FIG. 40 corresponds to lumens displaced outside physical illumination aperture 1252. While such wasted light is not desired, its existence does not affect the quality of the light source array's projected output. Only the physical array's 28 outermost bins show any geometric non-uniformity, and that, on image display industry standards, is quite modest. The center to corner roll-off is a very respectable 0.86; and this is before any deliberate system averaging occurs within the focal plane projection systems of FIGS. 13, 15A, 17, 18, 22A–B, 23A–B, and 26–28A.

Non-uniformity may also arise from unintended performance differences between individual LEDs in the array. Manufacturing process variation combined with electric interconnect differences may lead to a random distribution of brightness (or lumen) variations from bin-to-bin. Fortunately, the spatial overlap process of FIGS. 33A–B also works to soften these effects at least slightly.

When all LEDs emit identically, collective overlap from surrounding neighbors increase any given bin's output from 76% to 94% of the single bin total. Each bin's output increases by constructive overlap with neighbors. The 76% a given bin contributes from its own physical boundaries are enhanced by 4 nearest neighbor contributions of 4% each, and 4 next nearest neighbor contributions of 1% each, summing to 96%. In this manner, it can be seen that about 38.4 lumens are emitted within the 1.6 mm×1.6 mm physical boundary of bin 1254 in FIG. 40 (within +/−25-degrees).

Suppose bin 1254 in FIG. 40 contained a low-performing LED producing 50 lumens/mm² rather than the 100 lumens/mm² intended. The effect on local uniformity of this severe perturbation is illustrated by the graphic of FIG. 41A showing only the 6×6 inner core of the 8×8 array of FIG. 40. While the disturbance is concentrated in the region of offending bin 1254, the correspondingly smaller number of lumens overlapping with 8 neighboring bins 1258 has a small effect on their output as well. The details of this lumen distribution are shown in magnified graphic 1260 of FIG. 41B. Because of the spatial lumen influx from brighter neighbors such as bin 1262, deficient bin 1254 outputs 23.2 lumens rather than the 19.2 lumens expected from its half power LED. Accordingly the overlap mechanism as shown in FIGS. 33A–B works to reduce local non-uniformity by 20%.

AY. Optimum Performance of High Output (Etendue-Preserving) LED Arrays

The output performance of the etendue-preserving design introduced in FIGS. 29A–B is typified by curve 167 in FIG. 12. This ideally curved bin wall was designed to output +/−30-degrees into air, and does. As seen in FIG. 12, very little light actually extends outside this angular range. With 0.95 reflecting sidewalls, the highly efficient reflecting bin delivers about 93 of its 100 possible lumens within the angular range designed. In practice, curvature errors may diminish this efficiency slightly.

Output light from the etendue-preserving array, at least in the absence of the addition of cooperating films such as 84 and 86 of FIGS. 29A–B, is tightly bound to each reflecting bin in array 910. This localization is illustrated schematically by the spatial distributions of FIGS. 32A–B.

In geometrically constrained applications like video projection, illuminator size, shape and output angle all must match the need of the rectangular video display used. If the inherent geometric symmetry of both the bins and the array illustrated in FIGS. 29A–B are maintained, however, there will be a considerable loss in optical efficiency. This loss of efficiency stems from the symmetric array's inability to provide even illumination over an asymmetric field without waste from overfill. More specifically, the contiguous array of etendue-preserving metallically reflecting bins surrounding each square LED chip cannot provide adequate illumination flux to the corners of rectangular LCD (or DMD) micro-displays arranged as in FIGS. 13, 15A, 17 or 18. Without further modification, the ability of such illuminators to cover a rectangular field evenly requires significant overfilling of that field, as if by a circular beam, and the attendant inefficiency of so doing. The reason for this deficiency stems from the preservation of etendue in each meridian, combined with the inviolate nature of the well-known Pythagorean Theorem which mandates the relationship between the sides of square (or rectangular) elements, and their diagonal length. The geometry of field coverage in an image projection system has been explained in relation to FIG. 13 as being a consequence of the illumination angles, $\theta_{ILL}$, in each meridian. Generalized in equation 10, the required illumination angles in the X, the Y and the diagonal meridians in air are isolated by equations 13–15, where in this case, FL is the effective focal length in air or media depending on exactly what occupies the space between condensing element 308 and image display device 306, and $X_{LCD}$, $Y_{LCD}$ and $D_{LCD}$ are the respective lengths of the rectangular image display device (either an LCD or a DMD). Converting these angle to their counterparts in bin media is $\sin \theta_{ILL,air} = n \sin \theta_{ILL,med}$. Geometry dictates via the Pythagorean theorem, that $D_{LCD} = (X_{LCD}^2 + Y_{LCD}^2)^{0.5}$.

$$\theta_{ILL,X} = \mathrm{Tan}^{-1}\left[\frac{X_{LCD}}{FL}\right] \quad (13)$$

$$\theta_{ILL,Y} = \mathrm{Tan}^{-1}\left[\frac{Y_{LCD}}{FL}\right] \quad (14)$$

$$\theta_{ILL,D} = \mathrm{Tan}^{-1}\left[\frac{D_{LCD}}{FL}\right] \quad (15)$$

The implication of these geometrical relations can be understood through the following example for a rectangular 0.7" LCD 306 with 4:3 edge-length to edge-width aspect ratio, as in the system arrangement of the instant invention of FIG. 13. The focal length, FL, of condensing element 308 for this smaller LCD format is taken illustratively, as 12.7 mm in air. For these conditions, planar illuminator 300 must provide illumination flux within +/−29.25-degrees in its X-meridian, +/−22.78-degrees in its Y-meridian and +/−34.99-degrees in its diagonal-meridian. If the illumination angles fall short of any of these angular ranges, less than complete field coverage will result—producing dark shadows and/or the complete absence of image information.

The contiguous LED bin array illustrated in FIGS. 29A–B has been constrained by means of each bin's sidewall shape 912 to preserve etendue in each meridian. Although the Sine Law is well known and straightforward, it is still useful to summarize the resulting output illumination angles in each of the illuminator's X, Y and diagonal meridians, as in equations 16–18.

$$\theta_{ILL,X} = \mathrm{Sin}^{-1}\left[\frac{X_{LED}\mathrm{Sin}\theta_{LED,X}}{X_{BIN}}\right] \quad (16)$$

-continued $$\theta_{ILL,Y} = \mathrm{Sin}^{-1}\left[\frac{Y_{LED}\mathrm{Sin}\theta_{LED,Y}}{Y_{BIN}}\right] \quad (17)$$

$$\theta_{ILL,D} = \mathrm{Sin}^{-1}\left[\frac{D_{LED}\mathrm{Sin}\theta_{LED,D}}{D_{BIN}}\right] \quad (18)$$

Using a 1 mm square LED whose natural output spreads effectively over a +/−90-degree hemispherical volume, it follows that $X_{BIN}=1$ and $\theta_{LED,X}=\theta_{LED,Y}=\theta_{LED,D}=90$-degrees. (For LEDs that under certain design and packaging conditions constrain output flux to a narrower angular range, $\theta_{LED}$ reflects that reduced angle.) With conventional near-Lambertian LED emitters the etendue-preserved conditions consistent with the geometry of FIG. 13 and equations 13–15, $X_{BIN}=Y_{BIN}=3.05$ mm, generating in air, +/−29.25-degrees in both X and Y meridians. This 3.05 mm square bin has a diagonal length of 4.31 mm. As such, equation 18 determines that the output angle is 13.41-degrees in the bin media and 20.23-degrees in air. The geometry of FIG. 13 in the diagonal meridian through equation 15 requires an illumination angle of 34.99-degrees. This means that the etendue-preserving reflecting bin, while overfilling the LCD in the Y meridian, is significantly under-filling in the diagonal meridian. The weakness of this condition is that the LCD corners will be comparatively dark—as if illuminated by a nearly circular beam.

One correction path for this condition is to design the reflecting bins from the perspective of its diagonal meridian. Doing so reduces the bin diagonal's length, thereby widening its angular output. Yet while doing this, angular outputs in the X and Y meridians widen simultaneously. The net result is a roughly circular far field beam profile that covers the LCDs diagonal, but that overfills the LCD's X and Y edges. This overfill, leads to a waste in lumens by the ratio of the LCD aperture to the circular area whose diameter equals that of the LCD diagonal. This geometric inefficiency ratio, $\eta_{GEO}$, is governed by equation 19 with the imaging aperture's length-to-width aspect ratio, a/b. For the case where a=4 and b=3, $\eta_{GEO}=0.61$.

$$\eta_{GEO} = \frac{4ab}{\pi(a^2+b^2)} \quad (19)$$

Yet, when the field is overfilled in this manner, the effective bin area is reduced correspondingly, and more bins are then able to fit within any given illuminator area, which in turn increases net efficiency.

The bin size that achieves perfect field coverage in both the X and Y meridians is rectangular, but under-fills along the diagonal, has by equations 13–18 has a generalized area (AREA_1) as in equation 20.

$$\mathrm{AREA\_1} = \left|\frac{X_{LED}Y_{LED}}{\mathrm{Sin}(\mathrm{Tan}^{-1}(X_{LCD}/FL))\mathrm{Sin}(\mathrm{Tan}^{-1}(Y_{LCD}/FL))}\right| \quad (20)$$

The smaller bin-size that achieves perfect field coverage only within its diagonal meridian is also rectangular, and has by equations 13–18 the generalized area (AREA_2) given in equation 21.

$$\text{AREA\_2} = \left[ \frac{ab(X_{LED}^2 + Y_{LED}^2)/(a^2 + b^2)}{\text{Sin}^2(\text{Tan}^{-1}(D_{LCD}/FL))} \right] \quad (21)$$

This means that the net increase in lumens caused by the reduction in bin area is the ratio AREA_1/AREA_2, generalized in equation 22.

$$\eta_{BIN} = \left[ \frac{(ab(X_{LED}^2 + Y_{LED}^2)/(a^2 + b^2))}{\frac{\text{Sin}^2(\text{Tan}^{-1}(D_{LCD}/FL))X_{LED}Y_{LED}}{\text{Sin}(\text{Tan}^{-1}(X_{LCD}/FL))\text{Sin}(\text{Tan}^{-1}(Y_{LCD}/FL))}} \right] \quad (22)$$

For the case of a square 1 mm LED, a condensing element with 12.7 mm focal length and a 0.7" LCD having 4:3 aspect ratio, $\eta_{BIN}$, becomes 1.307. The net inefficiency, $\eta_{NET}$, is given by equation 23, which represents the product of equations 19 and 22, which for this particular case, becomes (0.61)(1.307) or 0.797.

$$\eta_{NET} = \eta_{GEO}\eta_{BIN} \quad (23)$$

AZ. Secondary Optic Elements for More Efficient Rectangular Field Coverage

Secondary optic elements may be added above etendue-preserving illuminators of as in FIGS. 29A–B and FIGS. 42A–B and above non-etendue-preserving illuminators of FIGS. 3A–B, 5A–C and 11 to improve coverage of rectangular fields.

The etendue-preserving LED array invention of FIGS. 29A–B exhibit a generally circular, or at best, elliptical, far field beam profile. This characteristic behavior has been verified, not only by means of equations 13–23 above, but also by far field output patterns from the validated computer model described earlier in section C.

It follows that achieving more efficient coverage of rectangular LCD (and DMD) micro-display fields requires further means to widen the array's angular output distribution predominately along its diagonal meridian, while making as small a corresponding change to the angular output distributions along the X and Y meridians as possible.

While this enhancement is illustrated for the etendue-preserving invention of FIGS. 29A–B, it serves equally well and in the same manner for the non-etendue-preserving inventions of FIGS. 3A–B, 5A–C and 11.

One appropriate angle transforming means that provides the needed modification is an orthogonally crossed arrangement of cylindrical lenses 1320 as in the exploded perspective view in FIG. 42A, or the arrays of cylindrical lenses 1322 as illustrated in the exploded perspective view of FIG. 42B. An exploded perspective view is shown for each case, isolating on a single LED-coupled reflecting unit 910, such as one of the 9 reflecting units shown in the array of FIGS. 29A–B. LED chip 118 is positioned within input aperture 100 of each reflecting bin 910, just as in FIG. 29A. Polarization recycling layers 84 and 86 are positioned either just above the bin's output aperture plane 1330, or just above the lens sets 1320 and 1322. In the case of cylindrical lens set 1320, axis 1332 of lower lens 1331 is aligned parallel with reflecting bin aperture-diagonal 1334, while axis 1336 of upper lens 1337 is aligned parallel with orthogonal aperture diagonal 1339. The same arrangements are made with cylindrical lens array set 1322, with axis 1344 of lens 1346 parallel to bin diagonal 1334; and lens axis 1340 of lens 1342 parallel to bin diagonal 1339. In either case, the optical power is applied predominately across the two orthogonal bin diagonals, thereby effecting angular distribution more strongly in the bin's diagonal meridians than in the X and Y meridians.

Lenses 1331 and 1337 can be either conventional bulk lenses having either positive or negative power, or they can be cylindrical Fresnel lenses. Aspheric or holographic corrections can be made to minimize off-diagonal power contributions. Lens arrays 1342 and 1346 are lenticular arrangements of parallel cylindrical lenses, also known as lenticular arrays.

When applied an as enhancement to the angular output characteristics of the non-etendue-preserving LED light source array inventions of FIGS. 3A–B, 5A–C and 11, the lens pairs of FIGS. 42A–B are preferably disposed above the two prism sheets 88 and 92, the cylindrical lens axes 1332 and 1336 in FIG. 42A or lenticular lens array axes 1342 and 1344 in FIG. 42B are aligned in parallel with corresponding prism sheet diagonals (diagonal 141 of lower sheet 92 and diagonal 143 of upper sheet 88 as in perspective view 159 of FIG. 5C). Prism sheet diagonals 141 and 143 (FIG. 5C), however, need not be aligned in parallel with bin aperture diagonals 129 and 131 (FIG. 4A) for best results.

BA. Performance Comparisons Between Non-Etendue-Preserving and Etendue-Preserving Design Tracks A performance comparison is made between non-etendue preserving LED illuminator array inventions of FIGS. 1A–3B, 5A–C and 11 and etendue-preserving LED illuminator array inventions of FIGS. 29A–B and 42A–B, within a given angular range. As an example, consider the merits of the two embodiments at +/–30-degrees. The non-etendue-preserving design generates 51 lumens per bin before polarization recycling and conversion (point 1215 in FIG. 39). This result is for 1 mm LED chips in 1.6 mm square tapered reflecting bins disposed just below crossed prism sheets having micro-prisms with 104-degree apex angles. The comparable etendue preserving bin design generates about 93 lumens over the same angular range (curve 167 of FIG. 12). On a lumens per solid angle basis this would appear to give the etendue-preserving design as much as 1.8 times greater total lumen efficiency.

For highly constrained video projection systems like those of FIGS. 13, 15A, 17, and 18, however, effective lumen utilization, explained above, also depends on lumens/mm² and the total illuminating area, which together determine the total effective lumens possible through the system's image display aperture.

It is shown by the following examples that choosing of one embodiment over the other depend on the design circumstances. When seeking to maximize lumens/mm², the non-etendue-preserving embodiments are preferred over the more efficient etendue-preserving embodiments by a factor of 2× or more. Yet, used in applications needing highest possible power efficiency, preferable performance is achieved with the etendue-preserving embodiments where the power-saving advantage can be almost as large.

BB. High Power Image Projection With the Non-Etendue Preserving Light Source Array: FIG. 43

Today's best ultra-compact video image projectors weigh less than 5 lbs and deliver more than 1000 white-field lumens through a projection lens and onto a projection screen.

One of many possible compact arrangements for doing so using the non-etendue preserving light source arrays 300 of FIGS. 3A–B, 5A–C, 11, and 31A–B is shown schematically in FIG. 43 for three reflective LCDs (as elements 1358 red, 1359 green, and 1360 blue). Separate red, green and blue illuminator and image forming sections 1351, 1353 and 1355, each based on the inventions of FIG. 13, are used for reasons explained earlier. This illustrative layout uses the reflective LCDs in conjunction with three separate polarizing beam splitters 1356 for a compact layout. Replacing each of the polarizing beam splitter cubes 1356 with air and rotating each of the image forming sections 1351, 1353 and 1354 until each LCD faces an adjacent side of dichroic color mixing cube 1364, transmissive rather than reflective LCDs can be used. Equally straightforward arrangements exist for a single transmissive LCD driven in color field-sequential manner, as in FIG. 46, and a DMD.

Reaching for 1000 lumen performance, the green illumination and image forming section (1353 in FIG. 43) must contribute about 600 lumens (for a 60% green, 30% red and 10% blue mixture). This means, after accounting for all in-line transmission and reflection losses, that the green light source array 1352 must provide at least 1600 un-polarized lumens within an appropriately contained angular range (i.e., +/−25-degrees as illustrated earlier for 1.2" diagonal, 4:3 aspect ratio LCD micro-displays and f/2.4 projection optics). The 1600 un-polarized lumens, become 1200 polarized lumens after 50% efficient polarization recovery, 1080 lumens after passing condenser element 308, 1026 lumens after passing through polarizing beam splitter 1356, 923 lumens after reflection from a reflective-type LCD (such as a liquid crystal on silicon, LCOS) 1359, 877 lumens after reflection by polarizing beam splitter 1356, 710 lumens after passage through dichroic prism cube 1364, and 640 lumens after image projection lens 1362. Anti-reflection coatings are assumed on all critical surfaces, but Fresnel reflections may still account for additional loss.

Optimum results for the non-etendue-preserving light source array have been summarized in FIG. 39 on a per bin basis. Determining how many bins to include in the array and the array's best shape, is a consequence of equations 9–12 above, and the focal length chosen for the condensing element used.

Figure 44:
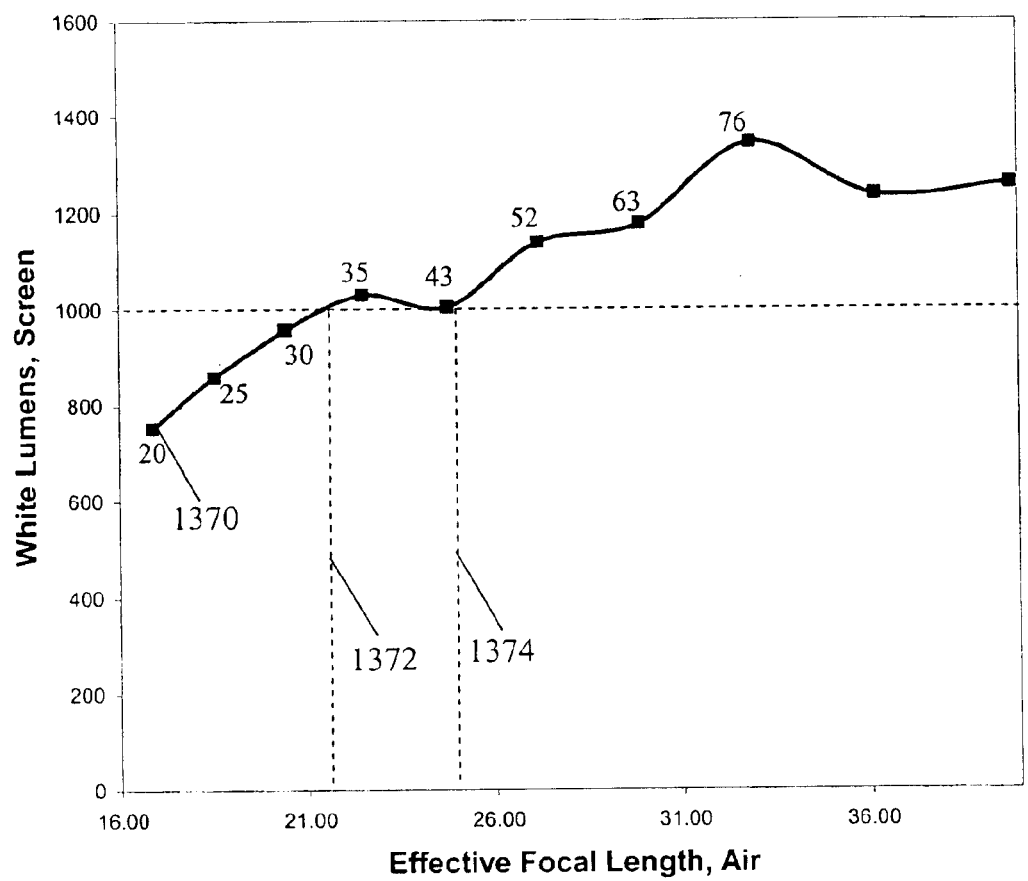
FIG. 44 shows graphical results for the white lumen screen output of the projection system of FIG. 43 using the non-etendue-preserving LED light source arrays of FIGS. 3A–B, 5A–C and 11 as a function of both the condensing element's effective focal length in air and the total number of 1.6 mm bins in each (red, green and blue) array.

FIG. 44 is a graphical summary of the relationship between effective focal length (in air) and white-field screen lumens in the image projection system of FIG. 43. Results are based on the optimum LED bin array performance represented in FIG. 39 for 1 mm LEDs and the projection constraints of a 1.2" LCD used with f/2.4 optics.

In general, as in the projection system geometry of FIG. 13, the longer the system focal length 310 and 311, the larger the illumination area possible, and the smaller the effective illumination angle, $\theta_{ILL}$, 322, needed to assure complete field coverage of LCD (or DMD) 306 in each meridian. At the same time, the larger the allowable illumination area becomes, the more LEDs (or bins) are needed in a given array 300. Increasing the LED chip size from 1 mm to 2 mm, as an example, reduces the number of LEDs and bins, but does nothing in and of itself to reduce the number of watts. Simply, the more square millimeters of LEDs operating at maximum conditions (i.e. 50 lumens/watt), the more watts. There is of course a practical limit.

The first data-point in FIG. 44, 1370, stems from the minimum focal length condition discussed above (16.9 mm in air between LED arrays 1350, 1352 and 1354 and condensing element 308 in the system of FIG. 43). The remaining data-points are obtained by assuming progressively larger focal lengths, and for each ensuing focal length, calculating $X_{ILL}=Y_{ILL}$ from equation 12, $\eta_{ILL,x}$ and $\theta_{ILL,y}$ from equation 10, finding the number of polarized lumens/bin at the respective angles from FIG. 39 (halving them and multiplying by the recovery factor, 1.5), calculating the number of bins from equation 4, and calculating total effective lumens per array from the product of average lumens/bin and the number of bins, where the average number of lumens is the arithmetic average of the lumen values for $\theta_{ILL,x}$ and $\theta_{ILL,y}$. Once the effective number of polarized green lumens has been calculated, the corresponding numbers for red and blue can be calculated from the representative mixture (60% green, 30% red and 10% blue) assumed herein. The weighted sum represents the total number of white lumens produced on mixing. This number is multiplied by the relative efficiencies assumed for transmission or reflection through the system: condensing element 308 in FIG. 43, polarizing beam splitter cube 1356, dichroic color mixing X-cube 1364, LCD 1358 (1359 or 1360), and projection lens 1362.

The integer values adjacent to each data-point in FIG. 44 are the number of bins per array. Since the 1 mm LEDs used in this example are expected to generate 100 lumens at 2 watts, the number of bins effects the total number of watts required. Practical considerations suggest that about 160 watts for the three illumination sections 1351, 1353 and 1355 in FIG. 43 is a reasonable limit for 1000 white-field screen lumens. If this limit were imposed, the maximum number of watts in the green illuminator channel would be about 80, and the number of bins, about 40. Actually, dotted indicator lines 1372 and 1374 in FIG. 44 show that the 1000 lumen target is achievable with this design for focal lengths (in air) between 22 mm and 25 mm, with as few bins as 35.

In practice, the number of bins (and therefore the number of LED chips involved) can actually be any greater number than the target number chosen, with watts reduced and focal length increased accordingly. For example, there is no way to arrange 40 square bins in a square array. Practical choice is between a 6×6 array and a 7×7 array.

Many other practical high-lumen projector examples are possible along these same lines, whether using 1 mm LED chips, smaller ones or larger.

Figure 45:
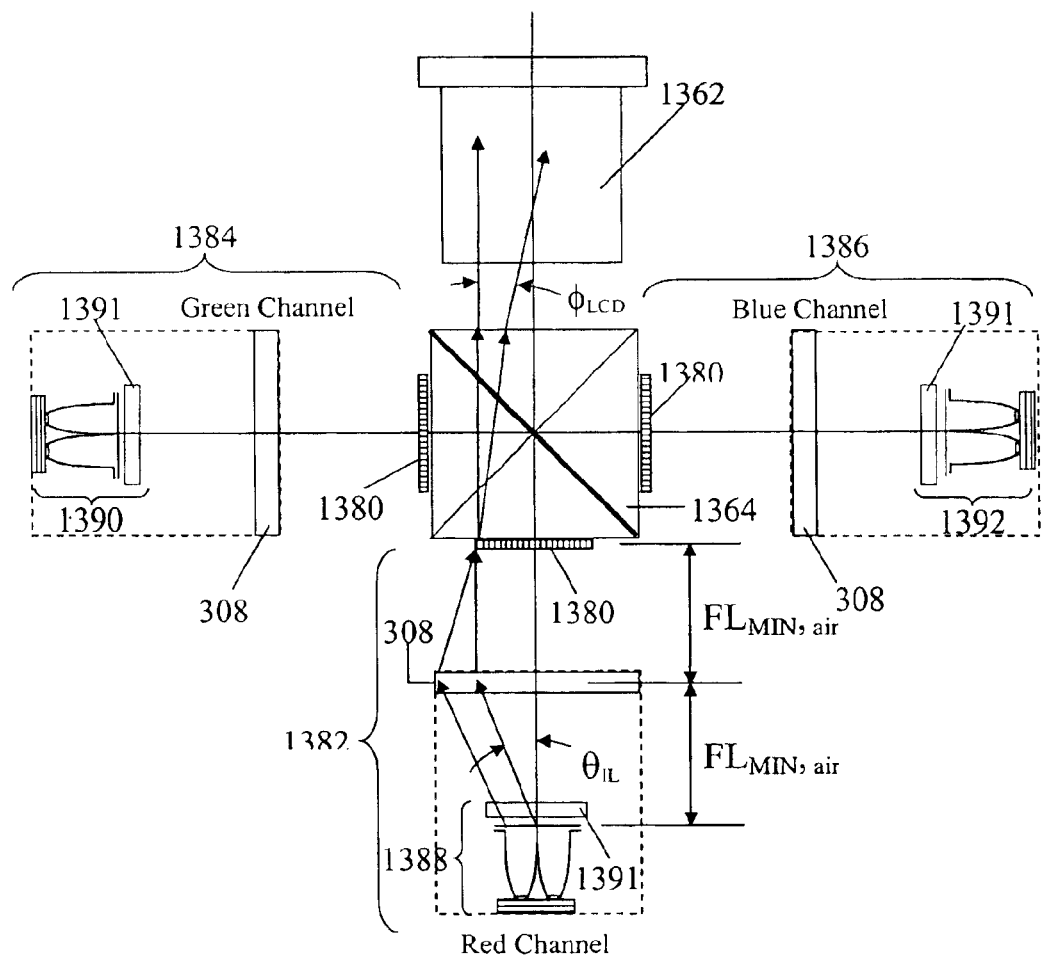
FIG. 45 is a schematic cross-section of an illustrative video projection system for three transmissive LCDs based on the focal plane optical system layout of FIG. 13 including the planar light source arrays of FIGS. 1A–3B, 5A–C, 11, 29A–B and 42A–B (shown illustratively with the etendue-preserving light source array of FIGS. 42A–B).

BC. Special Low Power Image Projector Application of the Ideal (Etendue-Preserving) Light Source Array: FIGS. 45–46.

Many new and highly mobile video projector products become practical as soon as it becomes feasible to operate them on batteries. Diverse combinations of cell phone, camera, camcorder, and computer functions all require larger and yet convenient video viewing capabilities. Direct-view LCDs (having 1"–3" diagonals) are the most common mobile displays used today, but have limited utility because of their small size. Viewing personal videos, the Internet, and computer desktops all need larger viewing surfaces. Yet, just incorporating larger direct view panels within hand held mobile appliances seems impractical. A better solution is the convergence of micro-sized projection displays with the convenience of lightweight hand held projection screens.

Battery-powered micro-sized video projection remains an impracticality with illuminators using conventional light bulbs, but becomes a possibility using the miniature LED light source arrays described above. Not only are LEDs capable of the instant on, instant-off, switching needed, but matched with the present inventions may be just efficient enough to provide the lumens called for.

While a sufficient number of lumens must be supplied to achieve acceptable viewing brightness over the particular screen size chosen, these lumens must be supplied at less than a target wattage suited to realistic battery size and life. For this reason, the potentially more power efficient etendue-preserving designs of FIGS. 29A–B and 42A–B have inherent advantage, even with only a single reflecting element used for each color as in the system of FIG. 43, or single transmissive element for each color as in the system of FIG. 45.

As one example, consider the case of a battery-powered projector capable of achieving at least 200 Nits brightness on a hand-held 8"×10" front projection screen, initially with no screen gain. The simple geometry of such screen and brightness criteria means that 34.2 white-field screen lumens are needed across the screen's area. This implies having a green illumination channel capable of contributing about 20.5 of the 34.2 screen lumens needed.

The starting point for this is choosing the micro-display, selecting its size, and developing the corresponding projection system layout. One possible layout has been illustrated previously in FIG. 43 for three separate reflective LCDs 1358, 1359, and 1360 (i.e., 0.7" LCOS LCDs).

The etendue-preserving illuminators of FIGS. 29A–B then have to be applied within each color channel to provide about [(20.5)]/[(0.9)(0.81)(0.95)(0.9)(0.95)] or 34.6 polarized green lumens, assuming the same transmission/reflection efficiencies cited above. This means there have to be 41 un-polarized green lumens within the critical angular range chosen, as polarization recovery and reuse efficiency for this regime is ~70%.

With 1 mm LumiLeds LEDs emitting 100 lumens/mm$^2$ each reflecting bin used yields about 90 polarized lumens (76 polarized lumens) over the angular range designed. The question remains as to what fraction of these lumens can be utilized in projection.

The etendue-preserving reflecting bin has an aperture size that depends on the angular range emitted. Relationships between angular range, condensing element focal length and effective illuminator size have been summarized in equations 9–12. The angular range provides field coverage needed for the LCD at any given focal length, but simultaneously affects illuminator size. In turn, the fraction of emitted lumens used by the LCD depends on matching effective illuminator size to the system's aperture angle.

The relationship between focal length and illuminator size is governed by equation 10, which for an f/2.4 projection system becomes $(X_{ILL}/2)/FL_{air}$=Tan (12). The smaller the focal length, the larger the effective illumination area, and the larger the number of individual reflecting bins used to create it. Yet, there is a practical lower limit on focal length, as the smaller the focal length becomes, the higher the illumination angle needed to achieve complete field coverage—and well-designed condensing optics are limited to illumination angles within about +/−25−+/−35 degrees.

An individual reflecting bin for a 1 mm LED chip has an input aperture of about 1.05 mm (allowing for some minimal clearance). Equation 10 explains that a minimum focal length of 12.7 mm in air corresponds to a 5.41 mm square effective illumination aperture. This corresponds to an effective illumination angle in each meridian of 29.25 degrees in air (19.63 degrees in bin media). Designed for this angle, the etendue-preserving bin aperture becomes 3.13 mm square. This means that there may be (5.41$^2$)/(3.13$^2$) or 3 etendue-preserving bins used effectively. While the lumen yield from 3 bins is allowed in principle, doing so is precluded by the physical geometry. The closest physically practical compromise is that of a 4-bin (2×2) array, thereby overfilling the 5.4 mm square illumination aperture permitted. It is also reasonable to use a single 2 mm LED chip in its correspondingly larger single 6.10 mm square bin (with approximate 2.05 mm input aperture). In either case the same fraction of available lumens are coupled through the 0.7" 4:3 LCD aperture onto the screen.

When using 4 square etendue preserving bins in a contiguous array (as in the 3×3 array of FIGS. 29A–B shown in FIGS. 45 and 46), one array for each color channel, 4 bins cover about a 6.2 mm square region and yield (e.g., in the green channel) a total of 360 un-polarized lumens (304 polarized lumens) into the bin's sharply constrained +/−29.25 degree angular range in the symmetrical X and Y meridians. Of these lumens, only (5.4$^2$/6.1$^2$) or about 79% convert within the system's f/2.4 constraint and are utilized effectively by the LCD aperture. Light emitted outside the 5.4 mm square illumination boundary and collected by condensing element 308, develops higher angled light at the LCD than can be handled without jeopardizing system contrast. Applying the appropriate aperture (vignettes) limits polarized lumens to 240.

There is also a potential angular inefficiency to correct for, if highest possible illumination in the four field corners is required. Although the 6.1 mm×6.1 mm bin array preserves etendue in the three important meridians (X, Y and diagonal), the angular range along the bin diagonal is smaller than that required by the geometry of equation 10. And since the etendue-preserving design cuts off pretty sharply at its maximum output angle (see curve 167 in FIG. 12), additional angular coverage along the diagonal requires higher than needed angular coverage in the X and Y meridians.

Taking this into account, the net result for a 4:3 LCD aspect ratio can be shown to have 61% geometrical efficiency (rather than 79% by bin aperture size alone). Accordingly, and with this correction, there are actually (0.61)(304) or 185 polarized green lumens available made to the LCD at 16 watts.

Such lumen production exceeds the 34.6 polarized green lumens needed in this example by a factor of 5.3. The 4 green channel LEDs may then be driven to the 34.6 polarized lumens needed with about 1.5 rather than 8 watts at full power. This means the 200 Nit performance sought on an 8"×10" screen is achievable with a total of 3 watts—roughly the wattage of a reasonably long-lived battery in a small-sized laptop computer.

Still better performance is achievable by increasing focal length slightly in the system layout of FIG. 45 (or FIG. 46) and adding the field coverage invention of FIGS. 42A–B to improve angular coverage along the field diagonal without the inefficiency of over-filling. Under these circumstances, and de-rating for 90% transmission through each of the two lens elements 1391 (in FIGS. 45–46) involved in the invention of FIGS. 42A–B, as many as 246 polarized green lumens may be available at 8 watts. This improvement therefore reduces the total white-field wattage need by 50% from 3 watts to about 2 watts.

Another means of improving performance efficiency is to use a single rectangular LED chip in a single etendue-preserving reflector bin of rectangular aperture per color channel. In this case, the LED chip dimensions are scaled to provide proper field coverage in all meridians, and cylindrical or lenticular lenses used as needed to improve field coverage along the aperture diagonal.

And, other than using the illustrative three reflective LCD configuration of FIG. 43, it is equally practical to use the three transmissive LCD configuration of FIG. 45, shown illustratively without the use of polarizing beam splitters (as sections 1382 red, 1384 green and 1386 blue). In addition, the same low-wattage approaches can be applied to a single field sequential LCD 1400 configured as in FIG. 46 with light from each illuminator section (1402 red, 1404 green and 1406 blue) combined using dichroic color mixing cube 1364. Allowance must be made in field sequential systems for the one-third duty-cycle available to each primary color image. When this is done with an LCD requiring polarized light, about 3 times as many lumens are needed in each color channel as with the non-switched systems of FIG. 43 and FIG. 45. When allowance is made for field-sequential operation with the highly reflective and polarization-insensitive DMD, a smaller allowance is needed.

Despite the potential cost and weight savings of a field sequential projection system layout, there may be applications where trebling wattage is impractical. In such cases, handheld projection screens having 2×–3× gain, can be used to compensate for the smaller number of lumens supplied to the screen in a field-sequential system.

These particular examples are given for illustrative purposes only, and are not meant to be comprehensive. The same approaches are applicable other arrangements and applications of LCDs and DMDs.

While preferred embodiments of the inventions herein have been shown and described, it will be clear to those of skill in the art that various changes and modifications can be made without departing from the invention in the broader aspects set forth in the claims hereinafter. In particular, the various subcomponent elements and systems described herein, as well as their optical equivalent, can be used in combination with, or when operatively proper substituted for, the other elements and systems set forth herein.

What is claimed is:

1. An illuminating system, comprising:
an electrical interconnection plate with an array of electrically conductive circuitry arranged for interconnecting one or more LED chips to positive and negative voltage sources;
an array of LED chips, said LED chips equally sized and spaced from each other a distance S that is less than or equal to width W of said LED chip;
an array of metallically reflecting bins whose center to center spacing is equal to W+S, each said bin comprising a clear output aperture and a clear input aperture formed by one or more tapered metallically reflecting sidewalls extending between them;
a first light redirecting means disposed beyond said array of metallically reflecting bins that transmits light in a first angular range and reflects light in a second angular range back towards said array of bins;
a second light redirecting means disposed beyond said first light redirecting means that transmits light in a first angular range and reflects light in a second angular range back towards said first light redirecting means; and
said array of LED chips bonded electrically to said array of electrically conductive circuitry on said electrical interconnection plate, said array of metallically reflecting bins disposed just above said electrical interconnection plate such that every said LED chip in said array of LED chips extends in and through the center of every said input aperture.

2. The illuminating system as defined in claim 1 wherein all said LED chips in said array of LED chips either have both their positive and negative contacts on the same surface or their positive and negative contacts on opposing surfaces.

3. The illuminating system as defined in claim 2 wherein all said LED chips in said array of LED chips emit light in either the same wavelength range, mixtures of red, green and blue wavelength ranges, or are all white-emitting LEDs.

4. The illuminating system as defined in claim 2 wherein all said LED chips in said array of LED chips are made with an optically transparent substrate in the wavelength range or ranges emitted by said LED chip.

5. The illuminating system as defined in claim 1 wherein said array of metallically reflecting bins have plane tapered sidewalls slanting at angle $\gamma$ from a line perpendicular to both said clear input and output apertures, each said clear aperture being square or rectangular in shape and related geometrically by the expression $\tan \gamma = (1/D)(X_o - X_i)/2$, where D is the depth of said array of metallically reflecting bins, $X_o$ is the edge length of an edge of said clear output aperture, and $X_i$ is the edge length of said clear input aperture.

6. The illuminating system as defined in claim 5 wherein said clear input and output apertures are each sized between 1.05 and 1.2 mm and 1.5 and 1.7 mm respectively on their edges, and said depth of said array of metallically reflecting bins D is between 170 and 180 microns.

7. The illuminating system as defined in claim 5 wherein the edge length $X_i$ of each said clear input aperture is sized by $X_i = (f)(W)$, the fit factor f ranging from about 1.01 to about 1.3, f being the minimum factor needed to permit any said LED chip to fit through any said clear input aperture without mechanical interference.

8. The illuminating system as defined in claim 5 wherein said array of metallically reflecting bins are formed in plastic, glass, ceramic, metal or composite parts by molding, embossing, casting, or electroforming from a form-tool fashioned by diamond machining, said tapered metallically-reflecting sidewalls over-coated with a high-reflectivity metal film.

9. The illuminating system as defined in claim 8 wherein said high-reflectivity metal film is protected silver.

10. The illuminating system as defined in claim 5 wherein said array of metallically reflecting bins are formed by photolithographic methods in a material whose thickness approximately equals said depth of said array of metallically reflecting bins directly.

11. The illuminating system as defined in claim 1 wherein said array of metallically reflecting bins are filled with a transparent dielectric medium making optical contact with said metallically reflecting sidewalls and with the exposed sidewalls and surfaces of said LED chips.

12. The illuminating system as defined in claim 11 wherein said transparent dielectric medium has a refractive index for the wavelength emitted by said LED chip in the range 1.4 to 1.65.

13. The illuminating system as defined in claim 1 wherein metallic coatings on said array of metallically reflecting bins provides a common electrical conduction path for interconnection with either the positive or negative side of said LED chips when said LED chips have electrical contacts on both their upper and lower surfaces.

14. The illuminating system as defined in claim 1 wherein metallic coatings on the back surface of said array of metallically reflecting bins provides isolated electrical conduction paths for interconnecting the positive and negative sides of said LED chips when said LED chips have electrical contacts on the same surface.

15. The illuminating system as defined in claim 1 wherein said first and second light redirecting means are optically transparent films or sheets whose upper surfaces are structured with parallel and contiguous prismatic grooves, the full angle of each prism apex being a constant angle selected from within the range of 88 and 108 degrees.

16. The illuminating system as defined in claim 15 wherein said first and second light redirecting means are optically transparent films or sheets whose lower surfaces are lenticularly structured with parallel and contiguous cylinder lenses.

17. An optical system, comprising:
a liquid crystal display device whose rectangular aperture has length L and width W;
a condensing system of effective focal length F;
a planar light source array of equal length and width L' comprising a regular array of contiguous reflecting bins, said reflecting bins each comprising a clear output aperture and a clear input aperture formed by one or more tapered metallically-reflecting sidewalls extending between them, each said reflecting bin containing one or more LED chips whose emitting surfaces protrude through said clear input aperture;
a first light redirecting means disposed beyond said array of reflecting bins that transmits light in a first angular range and reflects light in a second angular range back towards said array of bins;
a second light redirecting means disposed beyond said first light redirecting means that transmits light in a first angular range and reflects light in a second angular range back towards said first light redirecting means;
a first polarization converting means comprising a quarter-wave phase retardation film
a second polarization converting means comprising a polarization-selective reflecting film;
said condensing system, and said planar light source array oriented parallel to each other on planes orthogonal to a commonly centered optical axis, said LCD oriented either parallel or perpendicular to said commonly centered optical axis, the separation distances between said condenser system and each said LCD and said planar light source array being approximately equal to said effective focal length F of said condensing system, adjusted for the actual length within the dielectric material (if not air) occupying the spaces in between the elements; and
said first light directing means disposed above said reflecting bins by a gap thickness that includes air and the thickness of said array of reflecting bins, said second light redirecting means disposed beyond said first light directing means by an air gap thickness, said first polarization converting means disposed beyond said planar reflecting bins and said second polarization converting means disposed beyond said first polarization converting means.

18. The optical system as defined in claim 17 wherein said LED chips are attached to and interconnected by electrically conductive circuitry on a common heat conducting substrate.

19. The optical system as defined in claim 18 wherein said LED chips have both positive and negative electrodes on the same surface plane.

20. The optical system as defined in claim 19 wherein said positive and negative electrodes behave as metallically reflecting mirrors.

21. The optical system as defined in claim 18 wherein said LED chips in said planar light source array all have a common emitting wavelength range, have a mixture of chips, one fraction emitting in the red wavelength range, one fraction emitting in the green wavelength range and one fraction emitting in the blue wavelength range, or each emitting over a wide spectrum of wavelengths visually equivalent to white.

22. The optical system defined in claim 17 wherein said plane tapered sidewalls are slanting at angle $\gamma$ from a line perpendicular to both said clear input and output apertures, each said clear aperture being square or rectangular in shape and related geometrically by the expression $\tan \gamma = (1/D)(X_o - X_i)/2$, where D is the depth of said array of metallically reflecting bins, $X_o$ is the edge length of an edge of said clear output aperture, and $X_i$ is the edge length of said clear input aperture.

23. The optical system as defined in claim 22 wherein said clear input and output apertures are each sized between 1.05 and 1.2 mm and 1.5 and 1.7 mm respectively on their edges, and said depth of said array of metallically reflecting bins D is between 170 and 180 microns.

24. The optical system as defined in claim 22 wherein the edge length $X_i$ of each said clear input aperture is sized by $X_i = (f)(W)$, the fit factor f ranging from about 1.01 to about 1.3, f being the minimum factor needed to permit any said LED chip to fit through any said clear input aperture without mechanical interference.

25. The optical system as defined in claim 22 wherein said array of metallically reflecting bins are formed in plastic, glass, ceramic, metal or composite parts by molding, embossing, casting, or electroforming from a form-tool fashioned by diamond machining, said tapered metallically-reflecting sidewalls over-coated with a high-reflectivity metal film.

26. The optical system as defined in claim 25 wherein said high-reflectivity metal film is protected silver.

27. The optical system as defined in claim 22 wherein said array of metallically reflecting bins are formed by photolithographic methods in a material whose thickness approximately equals said depth of said array of metallically reflecting bins directly.

28. The optical system as defined in claim 17 wherein said array of metallically reflecting bins are filled with a transparent dielectric medium making optical contact with said metallically reflecting sidewalls and with the exposed sidewalls and surfaces of said LED chips.

29. The optical system as defined in claim 28 wherein said transparent dielectric medium has a refractive index for the wavelength emitted by said LED chip in the range 1.4 to 1.65.

30. The optical system as defined in claim 22 wherein every said plane tapered sidewall slants at angle $\gamma$ between 30 degrees to 60 degrees of line perpendicular to both said clear input and output apertures.

31. The optical system as defined in claim 17 wherein said first and second light redirecting means are optically transparent films or sheets whose upper surfaces are structured with parallel and contiguous prismatic grooves, the full angle of each prism apex being a constant angle selected from within the range of 88 and 108 degrees.

32. The optical system as defined in claim 31 wherein said first and second light redirecting means are optically transparent films or sheets whose lower surfaces are lenticularly structured with parallel and contiguous cylinder lenses.

33. The optical system as defined in claim 31 wherein said first and second light redirecting means are made free of birefringence.

34. The optical system as defined in claim 31 wherein some output light is spread over all angular directions with substantially greater fraction of said output light linearly polarized and contained within said first angular range by means of cooperative action between said LED chips, said tapered metallically-reflecting sidewalls, said first and second light redirecting means, and said first and second polarization converting means.

35. The optical system as defined in claim 34 wherein linearly polarized output light results from the conversion of substantially un-polarized input light emitted by said LED chips brought on by division into light of a first and second linear polarization state by said second polarization converting means, said first linear polarization state transmitted towards said condensing element as output and said second linear polarization state reflected through said first polarization converting means and converted to light of a first circular polarization state that is then changed to light of a second circular polarization state by its making an odd number of reflections with said LCD chip and said tapered metallically-reflecting sidewalls before returning back through said first polarization converting means and converting to light of said first linear polarization state as an additional part of said output.

36. The optical system as defined in claim 17 wherein said condensing system is at least one of spherical or aspherical bulk, Fresnel or diffractive lens element.

37. The optical system as defined in claim 36 wherein the clear aperture, CA, of said condensing element approximately equals the sum of the corner-to-corner length of said LCD and the corner-to-corner length of said planar light source array.

38. The optical system of claim 17 wherein the space between said LCD and said condensing element contains one of (a) air, (b) a block of optically transparent glass or plastic material composed of two 90-degree prisms optically-coupled to each other on their hypotenuse faces by a polarization-selective coating and one or more coatings of non-birefringent optical adhesive, non-birefringent acrylate, or UV curable epoxy, so as to form a polarizing beam splitter, (c) a block of optically transparent glass or plastic material composed of four 90-degree prisms optically-coupled to each other on their four hypotenuse faces two different dichroic coatings so as to form a dichroic color mixing element, (d) a group of optically coupled and dichroically coated prisms, and (e) a multi-layered plate tilted at approximately 45-degrees to said commonly centered optical axis.

39. The optical system of claim 38 wherein said multi-layered plate contains one or more of each of the following parallel and optically coupled elements: (a) a thin flat glass plate, (b) a polarization-selective reflecting material, and (c) an absorption polarizer material.

40. The optical system of claim 17 wherein said LCD is either (a) transmissive, or (b) reflective in its mode of operation.

* * * * *